(12) United States Patent
Nagatsuka et al.

(10) Patent No.: US 8,488,394 B2
(45) Date of Patent: Jul. 16, 2013

(54) SEMICONDUCTOR DEVICE

(75) Inventors: Shuhei Nagatsuka, Kanagawa (JP);
Takanori Matsuzaki, Kanagawa (JP);
Hiroki Inoue, Kanagawa (JP); Kiyoshi Kato, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 165 days.

(21) Appl. No.: 13/197,839

(22) Filed: Aug. 4, 2011

(65) Prior Publication Data
US 2012/0033510 A1    Feb. 9, 2012

(30) Foreign Application Priority Data

Aug. 6, 2010 (JP) ................. 2010-178168
May 13, 2011 (JP) ................. 2011-108190

(51) Int. Cl.
*G11C 7/00* (2006.01)
(52) U.S. Cl.
USPC ............ 365/189.05; 365/189.09; 365/189.15; 365/189.16
(58) Field of Classification Search
USPC ........... 365/149, 154, 189.09, 189.15, 189.16
See application file for complete search history.

(56) References Cited

U.S. PATENT DOCUMENTS

| | | | |
|---|---|---|---|
| 4,466,081 A | 8/1984 | Masuoka | |
| 4,701,884 A | 10/1987 | Aoki et al. | |
| 5,366,922 A | 11/1994 | Aoki et al. | |
| 5,731,856 A | 3/1998 | Kim et al. | |
| 5,744,864 A | 4/1998 | Cillessen et al. | |
| 5,796,650 A | 8/1998 | Wik et al. | |
| 5,851,866 A | 12/1998 | Son | |
| 5,936,881 A | 8/1999 | Kawashima et al. | |
| 5,943,259 A | 8/1999 | Choi | |
| 5,969,985 A | 10/1999 | Tanaka et al. | |
| 6,266,269 B1 | 7/2001 | Karp et al. | |
| 6,294,274 B1 | 9/2001 | Kawazoe et al. | |
| 6,563,174 B2 | 5/2003 | Kawasaki et al. | |

(Continued)

FOREIGN PATENT DOCUMENTS

| | | |
|---|---|---|
| EP | 0 053 878 A2 | 6/1982 |
| EP | 0 516 548 A2 | 12/1992 |

(Continued)

OTHER PUBLICATIONS

International Search Report, PCT Application No. PCT/JP2011/066791, dated Oct. 25, 2011, 3 pages.

(Continued)

*Primary Examiner* — Richard Elms
*Assistant Examiner* — Hien Nguyen
(74) *Attorney, Agent, or Firm* — Fish & Richardson P.C.

(57) ABSTRACT

An object is to provide a semiconductor device with a novel structure, which can hold stored data even when power is not supplied and which has an unlimited number of write cycles. The semiconductor device is formed using a memory cell including a wide band gap semiconductor such as an oxide semiconductor. The semiconductor device includes a potential change circuit having a function of outputting a potential lower than a reference potential for reading data from the memory cell. When the wide band gap semiconductor which allows a sufficient reduction in off-state current of a transistor included in the memory cell is used, a semiconductor device which can hold data for a long period can be provided.

28 Claims, 45 Drawing Sheets

U.S. PATENT DOCUMENTS

| | | |
|---|---|---|
| 6,577,530 B2 | 6/2003 | Muranaka et al. |
| 6,628,551 B2 | 9/2003 | Jain |
| 6,727,522 B1 | 4/2004 | Kawasaki et al. |
| 6,808,971 B2 | 10/2004 | Bhattacharyya |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,687,331 B2 | 3/2010 | Kim et al. |
| 7,732,819 B2 | 6/2010 | Akimoto et al. |
| 7,741,644 B2 | 6/2010 | Lyu et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara |
| 2006/0284171 A1 | 12/2006 | Levy et al. |
| 2006/0284172 A1 | 12/2006 | Ishii |
| 2006/0292777 A1 | 12/2006 | Dunbar |
| 2007/0008793 A1* | 1/2007 | Hirobe ......................... 365/194 |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Covan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0189153 A1 | 7/2009 | Iwasaki et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0187410 A1* | 8/2011 | Kato et al. ...................... 326/46 |
| 2011/0199816 A1* | 8/2011 | Inoue et al. ................... 365/149 |

FOREIGN PATENT DOCUMENTS

| | | |
|---|---|---|
| EP | 0 851 429 A2 | 7/1998 |
| EP | 1 134 811 A1 | 9/2001 |
| EP | 1 737 044 A1 | 12/2006 |
| EP | 1 746 659 A2 | 1/2007 |
| EP | 2 226 847 A2 | 9/2010 |
| JP | 57-105889 A | 7/1982 |
| JP | 60-198861 A | 10/1985 |
| JP | 62-095796 A | 5/1987 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-198169 A | 8/1993 |
| JP | 05-251705 A | 9/1993 |
| JP | 08-264794 A | 10/1996 |
| JP | 09-251784 A | 9/1997 |
| JP | 10-199269 A | 7/1998 |
| JP | 11-505377 A | 5/1999 |
| JP | 2000-044236 A | 2/2000 |
| JP | 2000-150900 A | 5/2000 |
| JP | 2001-53164 A | 2/2001 |
| JP | 2001-351386 A | 12/2001 |
| JP | 2002-076356 A | 3/2002 |
| JP | 2002-133876 A | 5/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| KR | 1990-0002664 B1 | 4/1990 |
| KR | 10-0226746 A | 10/1999 |
| WO | 00/30183 A1 | 5/2000 |
| WO | 2004/114391 A1 | 12/2004 |

OTHER PUBLICATIONS

Written Opinion, PCT Application No. PCT/JP2011/066791, dated Oct. 25, 2011, 5 pages.

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: AL and SN-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic NANO-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases,", Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N. et al., "Spinel,YBFE2O4, and YB2FE3O7 Types of Structures for Compounds in the In2O3 and Sc2O3-A2O3-BO Systems [A; Fe, Ga, or Al; B: Mg, Mn, Fe, Ni, Cu,or Zn] at Temperatures Over 1000° C." Journal of Solid State Chemistry, 1985, vol. 60, pp. 382-384.

Kimizuka, N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Obervation of Blue Phase in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al. "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C." Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari. H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTS With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTS and Their Application for Large Size AMOLED." AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 with Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

* cited by examiner

FIG. 1A1
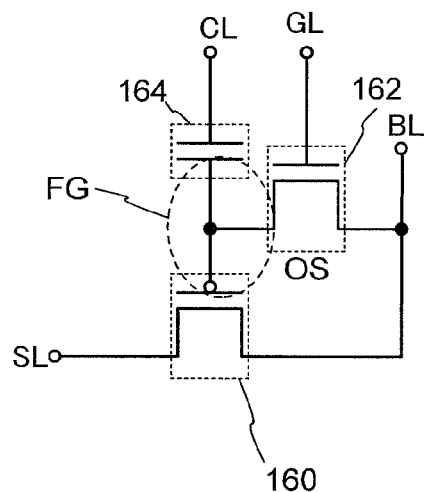
FIG. 1B
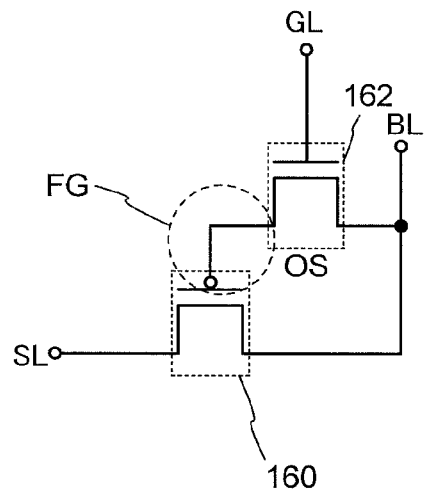
FIG. 1A2
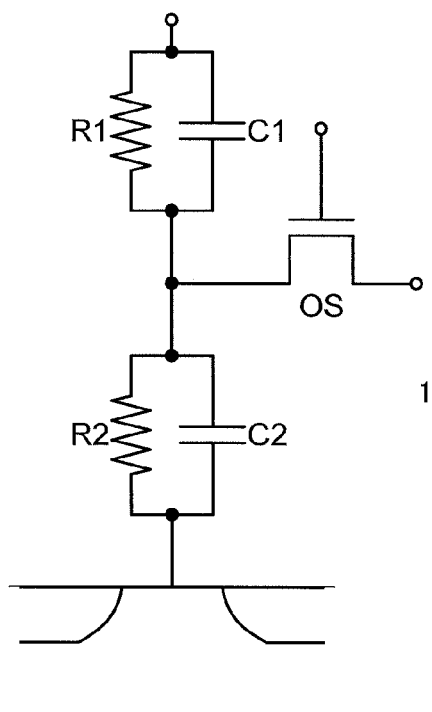
FIG. 1C
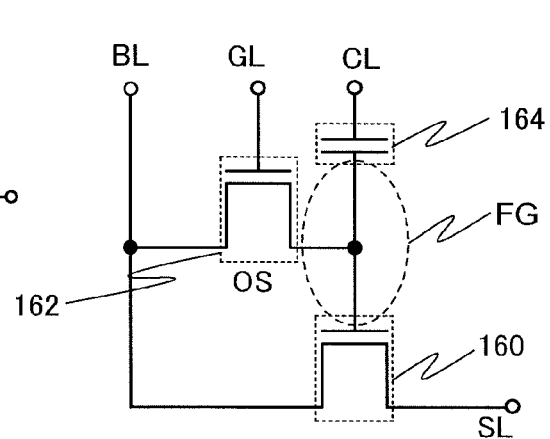

FIG. 3A
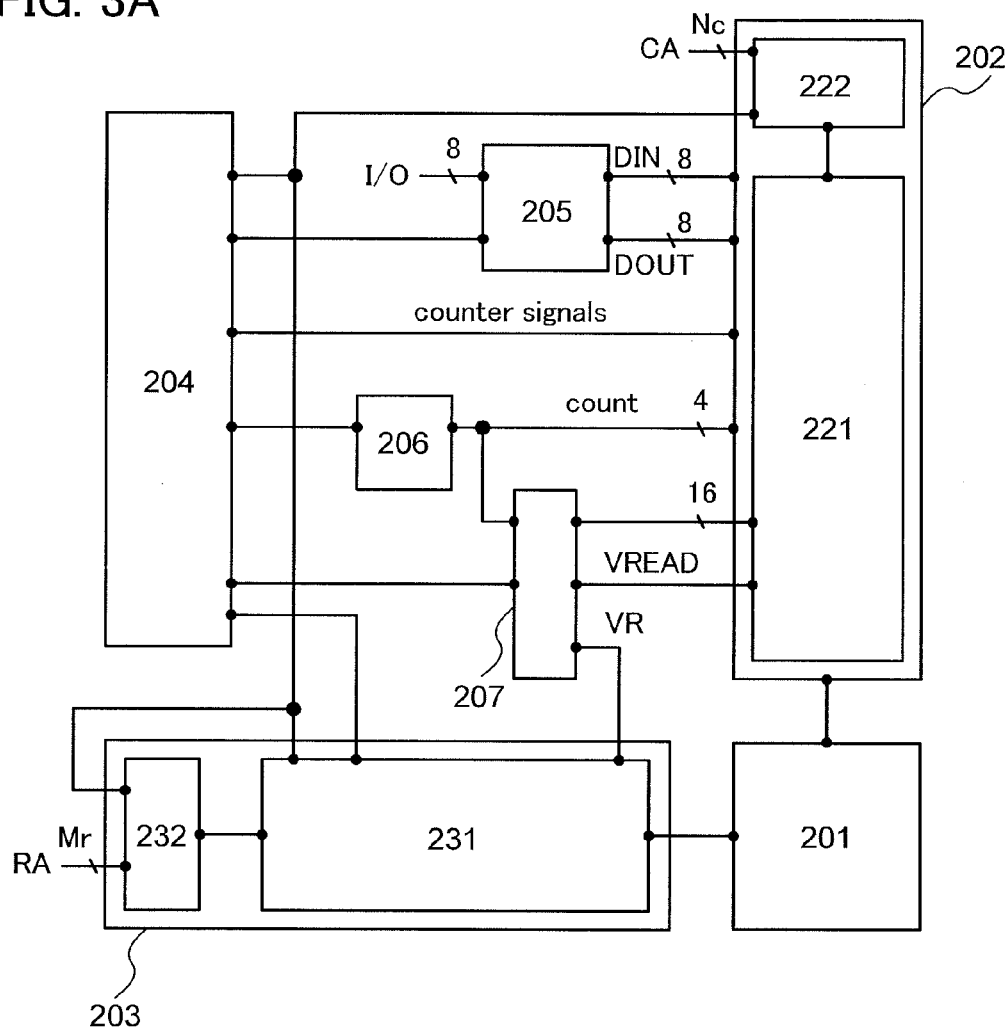
FIG. 3B
FIG. 3C
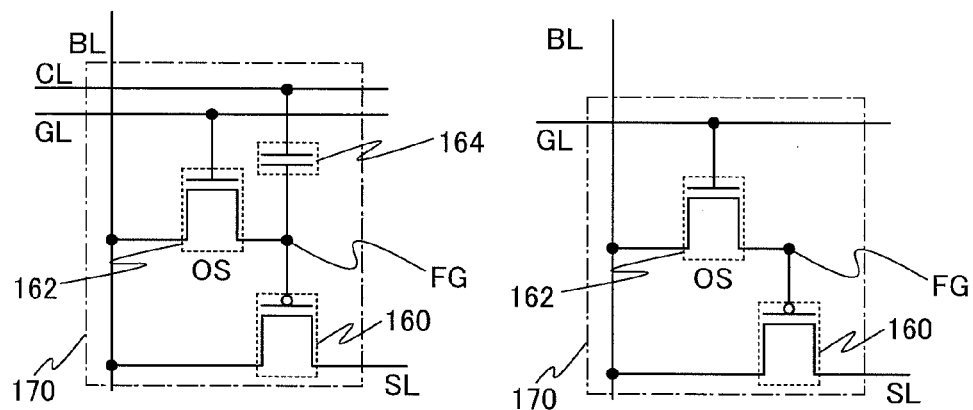

FIG. 9A
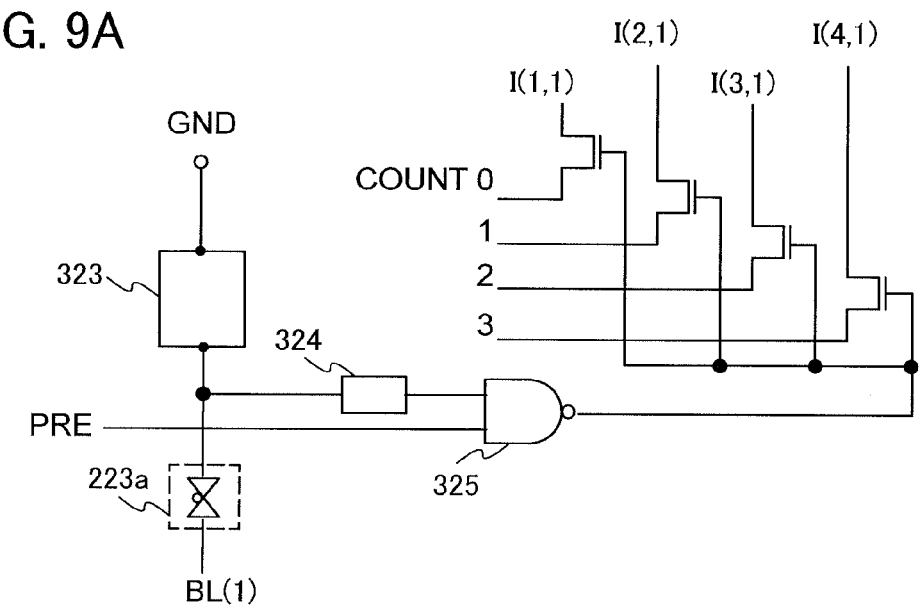
FIG. 9B1  FIG. 9B2  FIG. 9B3  FIG. 9B4  FIG. 9B5
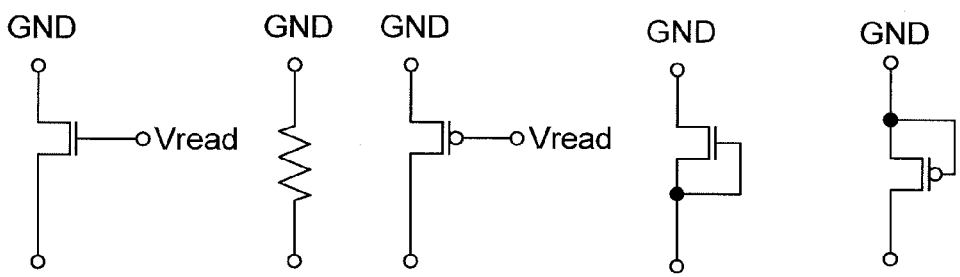

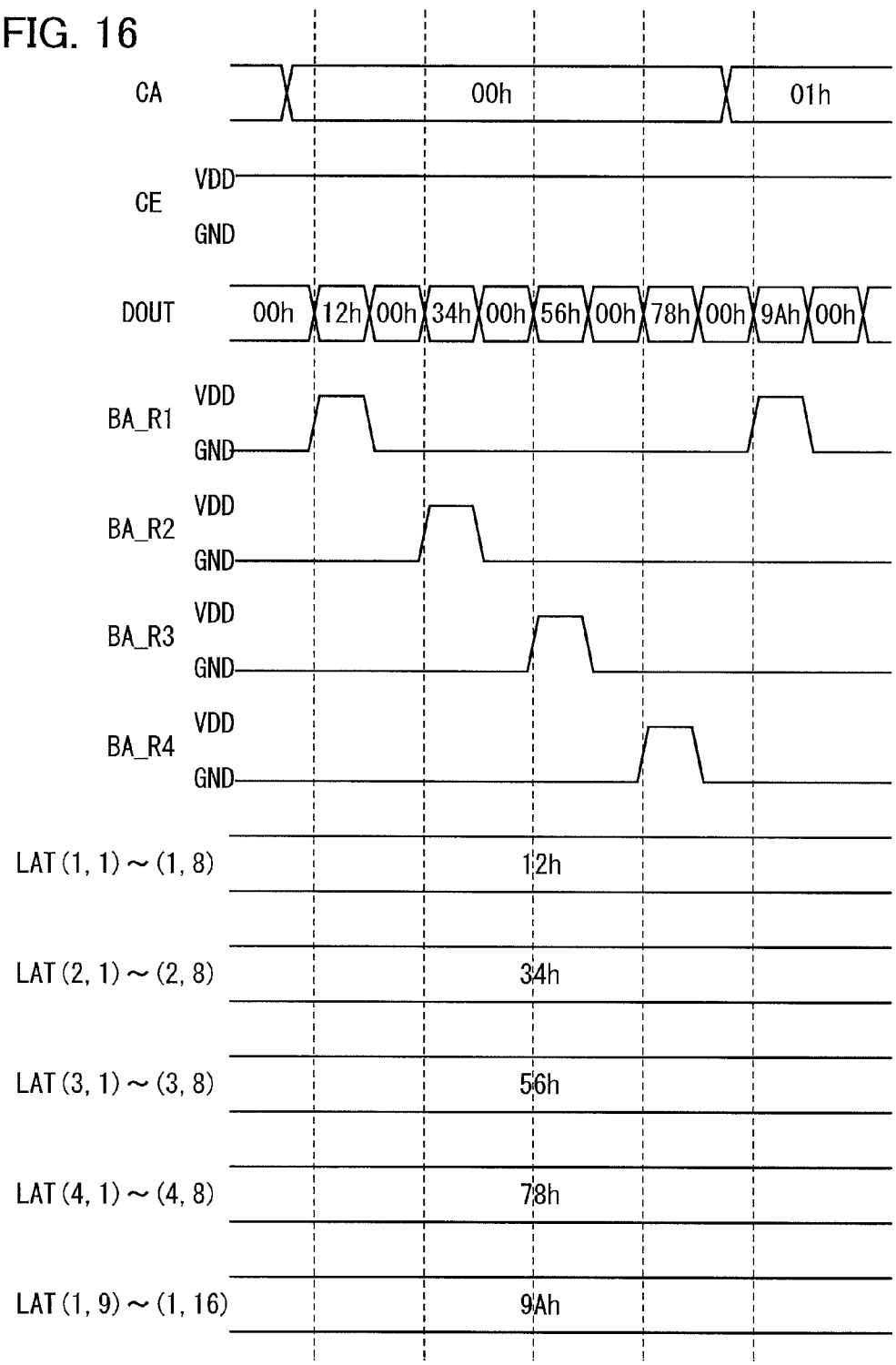

400  450a  437

450b

453

FIG. 30A   FIG. 30B
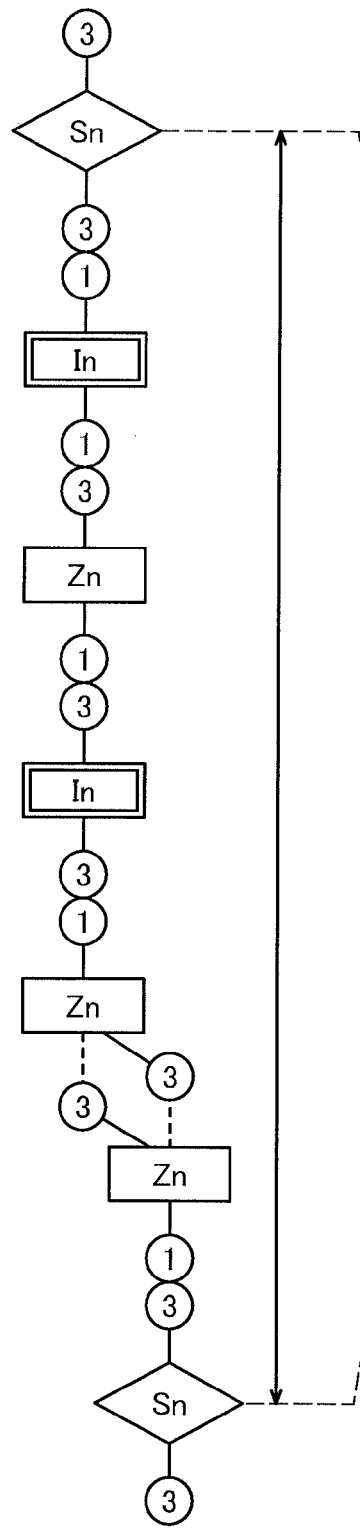
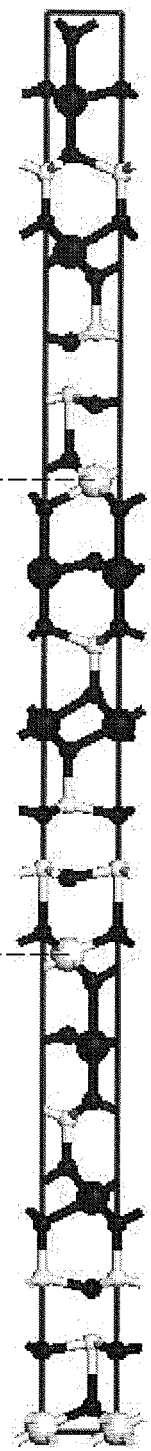
FIG. 30C
- In
○ Sn
∘ Zn
• O ● In
○ Ga
○ Zn
● O

SEMICONDUCTOR DEVICE

TECHNICAL FIELD

The present invention relates to a semiconductor device using a semiconductor element and a method for driving the semiconductor device.

BACKGROUND ART

Storage devices using semiconductor elements are broadly classified into two categories: a volatile device that loses stored data when power supply stops, and a non-volatile device that holds stored data even when power is not supplied.

A typical example of a volatile storage device is a dynamic random access memory (DRAM). A DRAM stores data in such a manner that a transistor included in a storage element is selected and charge is accumulated in a capacitor.

When data is read from a DRAM, charge in a capacitor is lost on the above-described principle; thus, another writing operation is necessary whenever data is read. A data holding period is short because charge flows from/into a transistor forming a memory element by a leakage current between a source and a drain in an off state (off-state current) or the like even when the transistor is not selected. For that reason, another writing operation (refresh operation) is necessary at predetermined intervals, and it is difficult to sufficiently reduce power consumption. Further, since stored data is lost when power supply stops, an additional storage device using a magnetic material or an optical material is needed in order to hold the data for a long time.

Another example of a volatile storage device is a static random access memory (SRAM). An SRAM holds stored data by using a circuit such as a flip-flop and thus does not need refresh operation, which is an advantage over a DRAM. However, cost per storage capacity is increased because a circuit such as a flip-flop is used. Moreover, as in a DRAM, stored data in an SRAM is lost when power supply stops.

A typical example of a non-volatile storage device is a flash memory. A flash memory includes a floating gate between a gate electrode and a channel formation region in a transistor and stores data by holding charge in the floating gate. Therefore, a flash memory has advantages in that the data holding time is extremely long (almost permanent) and refresh operation which is necessary in a volatile storage device is not needed (e.g., see Patent Document 1).

However, a gate insulating layer included in a storage element deteriorates by tunneling current generated in writing, so that the storage element stops its function after a predetermined number of writing operations. In order to reduce adverse effects of this problem, a method in which the number of writing operations for storage elements is equalized is employed, for example; however, a complicated peripheral circuit is needed to realize this method. Even when such a method is employed, the fundamental problem of lifetime is not solved. In other words, a flash memory is not suitable for applications in which data is frequently rewritten.

In addition, high voltage is necessary for injecting charge in the floating gate or removing the charge, and a circuit for generating high voltage is also necessary. Further, it takes a relatively long time to inject or remove charge, and it is not easy to perform writing and erasing at higher speed.

[Reference]
[Patent Document 1]
[Patent Document 1] Japanese Published Patent Application No. S57-105889

DISCLOSURE OF INVENTION

In view of the above problems, an object of one embodiment of the present invention is to provide a semiconductor device with a novel structure, which can hold stored data even when power is not supplied and which has an unlimited number of write cycles.

In one embodiment of the present invention, a semiconductor device is formed using a material which can sufficiently reduce off-state current of a transistor, e.g., an oxide semiconductor material which is a wide band gap semiconductor. When a semiconductor material which allows a sufficient reduction in off-state current of a transistor is used, the semiconductor device can hold data for a long period.

For example, one embodiment of the present invention is a semiconductor device including a memory cell formed using a wide band gap semiconductor. The semiconductor device includes a potential change circuit having a function of outputting a potential lower than a reference potential for reading data from the memory cell.

Specifically, structures described below can be employed, for example.

One embodiment of the present invention is a semiconductor device including a memory cell array including m×n memory cells, a first driver circuit, a second driver circuit, a potential generating circuit, a bit line, a source line, and a gate line. One of the memory cells includes a first transistor including a first gate electrode, a first source electrode, a first drain electrode, and a first channel formation region and a second transistor including a second gate electrode, a second source electrode, a second drain electrode, and a second channel formation region. The first channel formation region includes a semiconductor material different from that of the second channel formation region. The first driver circuit includes a K-bit latch portion and a writing circuit including a K-bit multiplexer in every column of the memory cells. The writing circuit is connected to the potential generating circuit and the K-bit latch portion.

Further, one embodiment of the present invention is a semiconductor device including a memory cell array including m×n memory cells, a first driver circuit, a second driver circuit, a K-bit counter (K is a natural number), a potential generating circuit, a bit line, a source line, and a gate line. One of the memory cells includes a first transistor including a first gate electrode, a first source electrode, a first drain electrode, and a first channel formation region and a second transistor including a second gate electrode, a second source electrode, a second drain electrode, and a second channel formation region. The first channel formation region includes a semiconductor material different from that of the second channel formation region. The first driver circuit includes a K-bit latch portion and a reading circuit in every column of the memory cells. The K-bit counter is connected to the reading circuit and the reading circuit is connected to the K-bit latch portion.

Furthermore, one embodiment of the present invention is a semiconductor device including a memory cell array comprising m×n memory cells, a first driver circuit, a second driver circuit, a K-bit counter (K is a natural number), a potential generating circuit, a bit line, a source line, and a gate line. One of the memory cells includes a first transistor including a first gate electrode, a first source electrode, a first drain electrode, and a first channel formation region and a second transistor including a second gate electrode, a second source electrode, a second drain electrode, and a second channel formation region. The first channel formation region includes a semiconductor material different from that of the second channel formation region. The first driver circuit includes a K-bit latch portion, a writing circuit including a K-bit multiplexer, and a reading circuit in every column of the memory cells. The K-bit counter is connected to the reading circuit and the K-bit latch portion is connected to the writing circuit and the reading circuit.

In the above, the source line can be connected to the first source electrode, the bit line can be connected to the first drain electrode and the second drain electrode, the gate line can be connected to the second gate electrode, and the first gate electrode can be connected to the second source electrode.

Further, in the above, the first transistor can be a p-channel transistor and the second transistor can be an n-channel transistor. Alternatively, in the above, the first transistor can be an n-channel transistor and the second transistor can be an n-channel transistor.

In the above, the second channel formation region of the second transistor can be formed using an oxide semiconductor.

In the above, the plurality of memory cells including the one of the memory cells can be connected in parallel between the bit line and the source line. Alternatively, the plurality of memory cells including the one of the memory cells can be connected in series between the bit line and the source line.

In the above, the reading circuit can include a load, a sense amplifier, and a NAND circuit, the sense amplifier can be connected to one of an input of the NAND circuit, a memory reading line can be connected to the other of the input of the NAND circuit, and the K-bit latch portion can be connected to an output of the NAND circuit.

In the above, the potential generating circuit can be connected to each of the first driver circuit and the second driver circuit.

In the above, the K-bit counter can be electrically connected to an input of the K-bit latch portion.

Note that the above described transistor includes an oxide semiconductor in some cases; however, the disclosed invention is not limited to this. A material which can realize the off-state current characteristics equivalent to those of the oxide semiconductor, such as a wide gap material like silicon carbide (specifically, a semiconductor material whose energy gap Eg is larger than 3 eV) may be used.

Note that in this specification and the like, the term such as "over" or "below" does not necessarily mean that a component is placed "directly on" or "directly under" another component. For example, the expression "a gate electrode over a gate insulating layer" can mean the case where there is an additional component between the gate insulating layer and the gate electrode. The terms such as "over" and "below" are simply used for convenience of explanation.

In addition, in this specification and the like, the term such as "electrode" or "wiring" does not limit a function of a component. For example, an "electrode" is sometimes used as part of a "wiring", and vice versa. Furthermore, the term "electrode" or "wiring" can include the case where a plurality of "electrodes" or "wirings" is formed in an integrated manner.

Functions of a "source" and a "drain" are sometimes replaced with each other when a transistor of opposite polarity is used or when the direction of current flowing is changed in circuit operation. Therefore, the terms "source" and "drain" can be replaced with each other in this specification and the like.

Note that in this specification and the like, the term "electrically connected" includes the case where components are connected through an "object having any electric function". There is no particular limitation on an "object having any electric function" as long as electric signals can be transmitted and received between components that are connected through the object.

Examples of an "object having any electric function" are a switching element such as a transistor, a resistor, an inductor, a capacitor, and an element with a variety of functions as well as an electrode and a wiring.

Since the off-state current of a transistor including an oxide semiconductor is extremely low, stored data can be held for an extremely long time by using the transistor. In other words, power consumption can be adequately reduced because refresh operation becomes unnecessary or the frequency of refresh operation can be extremely low. Stored data can be held for a long period even when power is not supplied (note that a potential is preferably fixed).

Further, a semiconductor device according to the present invention does not need high voltage for writing of data and there is no problem of deterioration of elements. For example, unlike a conventional non-volatile memory, it is not necessary to inject and extract electrons into and from a floating gate, and thus a problem such as deterioration of a gate insulating layer does not occur at all. In other words, the semiconductor device according to the present invention has no limitation on the number of times of rewriting, which is a problem of a conventional non-volatile memory, and thus has significantly improved reliability. Furthermore, data is written depending on the on state and the off state of the transistor, whereby high-speed operation can be easily realized. In addition, there is no need of operation for erasing data.

Since a transistor including a material other than an oxide semiconductor can operate at sufficiently high speed, when this is combined with a transistor including an oxide semiconductor, a semiconductor device can perform operation (e.g., data reading) at sufficiently high speed. Further, a transistor including a material other than an oxide semiconductor can favorably realize a variety of circuits (such as a logic circuit or a driver circuit) which is required to operate at high speed.

Thus, a semiconductor device having a novel feature can be realized by being provided with both the transistor including a material other than an oxide semiconductor (in other words, a transistor capable of operating at sufficiently high speed) and the transistor including an oxide semiconductor (in other words, a transistor whose off-state current is sufficiently small).

BRIEF DESCRIPTION OF DRAWINGS

FIGS. 1A1, 1A2, 1B, and 1C are circuit diagrams of a semiconductor device.

FIG. 2 is a block diagram of a semiconductor device.

FIG. 3A is a block diagram of a semiconductor device and FIGS. 3B and 3C are circuit diagrams of a semiconductor device.

FIGS. 9A, 9B1, 9B2, 9B3, 9B4, and 9B5 are circuit diagrams of a semiconductor device.

FIG. 16 is a timing chart.
FIGS. 30A to 30C are diagrams illustrating a structure of an oxide material.

BEST MODE FOR CARRYING OUT THE INVENTION

Figure 2:
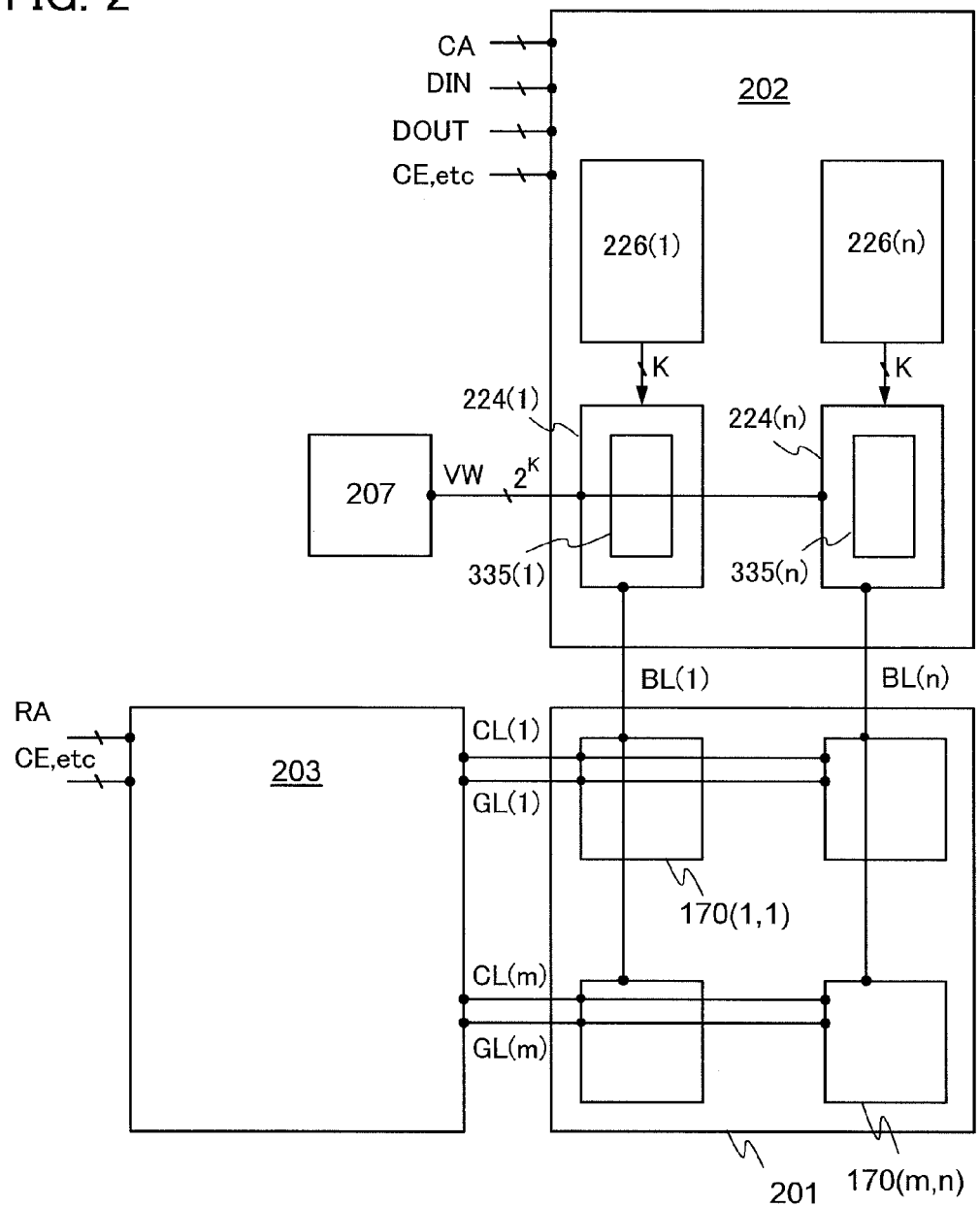

Hereinafter, embodiments of the present invention will be described with reference to the drawings. Note that the present invention is not limited to the following description and it will be readily appreciated by those skilled in the art that modes and details can be modified in various ways without departing from the spirit and the scope of the present invention. Therefore, the invention should not be construed as being limited to the description in the following embodiments.

Note that the position, the size, the range, or the like of each structure illustrated in drawings and the like is not accurately represented in some cases for easy understanding. For this reason, the present invention is not necessarily limited to the position, size, range, or the like as disclosed in the drawings and the like.

In this specification and the like, ordinal numbers such as "first", "second", and "third" are used in order to avoid confusion among components, and the terms do not mean limitation of the number of components.

(Embodiment 1)

In this embodiment, a basic circuit configuration and operation of a semiconductor device according to one embodiment of the present invention will be described with reference to FIGS. 1A1, 1A2, 1B, and 1C. Note that in each of circuit diagrams, in some cases, "OS" is written beside a transistor in order to indicate that the transistor includes an oxide semiconductor.

<Basic Circuit>

First, the most basic circuit configuration and its operation will be described with reference to FIGS. 1A1, 1A2, 1B, and 1C. In a semiconductor device illustrated in FIG. 1A1, a bit line BL, a source electrode (or a drain electrode) of a transistor 160, and a source electrode (or a drain electrode) of a transistor 162 are electrically connected to each other. A source line SL is electrically connected to the drain electrode (or the source electrode) of the transistor 160. A gate line GL is electrically connected to a gate electrode of the transistor 162. A gate electrode of the transistor 160 and the drain electrode (or the source electrode) of the transistor 162 are electrically connected to one electrode of a capacitor 164. A capacitor line CL is electrically connected to the other electrode of the capacitor 164. Note that a structure may be employed in which the source electrode (or the drain electrode) of the transistor 160 and the source electrode (or the drain electrode) of the transistor 162 are not electrically connected to each other and each be electrically connected to another wiring.

Here, a transistor including an oxide semiconductor is used as the transistor 162, for example. A transistor including an oxide semiconductor has a characteristic of an extremely low off-state current. For that reason, a potential of the gate electrode of the transistor 160 can be held for an extremely long time by turning off the transistor 162. Provision of the capacitor 164 facilitates holding of charge given to the gate electrode of the transistor 160 and reading of stored data.

Note that there is no particular limitation on a semiconductor material of the transistor 160. In terms of increasing the speed of reading data, it is preferable to use, for example, a transistor with high switching rate such as a transistor using single crystal silicon. The cases where a p-channel transistor is used as the transistor 160 are illustrated in FIGS. 1A1, 1A2, and 1B. The case where an n-channel transistor is used as the transistor 160 is illustrated in FIG. 1C.

Alternatively, the capacitor 164 can be omitted as in FIG. 1B.

The semiconductor device illustrated in FIG. 1A1 utilizes an advantage that a potential of the gate electrode of the transistor 160 can be held, thereby writing, holding, and reading data as follows.

Firstly, writing and holding of data will be described. First, the potential of the gate line GL is set to a potential which allows the transistor 162 to be turned on, so that the transistor 162 is turned on. Thus, the potential of the bit line BL is supplied to a node (also referred to as a floating gate portion FG) to which the drain electrode (or the source electrode) of the transistor 162, the gate electrode of the transistor 160, and the one electrode of the capacitor 164 are electrically connected. In other words, predetermined charge is supplied to the floating gate portion FG (writing). Here, any one of charges supplying two different potentials (hereinafter a charge supplying a low potential is referred to as a charge $Q_L$, and a charge supplying a high potential is referred to as a charge $Q_H$) is given. Note that charges for supplying three or more different potentials may be applied to improve a storage capacitor. Then, the potential of the gate line GL is set to a potential which allows the transistor 162 to be turned off, so that the transistor 162 is turned off. Thus, the charge supplied to the floating gate portion FG is held (holding).

Since the off-state current of the transistor 162 is extremely low, the charge of the gate electrode of the transistor 160 is held for a long time.

Secondly, reading of data will be described. An appropriate potential (a reading potential) is supplied to the capacitor line CL in the state where a predetermined potential (a fixed potential) is supplied to the source line SL, whereby the potential of the bit line BL varies in response to the amount of charge held in the floating gate portion FG. In other words, the conductance of the transistor 160 is controlled by the charge held in the gate electrode (which can also be referred to as the floating gate portion FG) of the transistor 160.

In general, when the transistor 160 is a p-channel transistor, an apparent threshold voltage $V_{th\_H}$ in the case where $Q_H$ is supplied to the gate electrode of the transistor 160 is lower than an apparent threshold voltage $V_{th\_L}$, in the case where $Q_L$ is supplied to the gate electrode of the transistor 160. For example, in the case where $Q_L$ is supplied in writing, when the potential of the capacitor line CL is $V_0$ (a potential intermediate between $V_{th\_H}$ and $V_{th\_L}$), the transistor 160 is turned on. In the case where $Q_H$ is supplied in writing, even when the potential of the capacitor line CL is $V_0$, the transistor 160 remains off. Thus, the data held can be read by measuring the potential of the bit line BL.

Thirdly, rewriting of data will be described. Rewriting of data is performed in a manner similar to that of the writing and holding of data. In other words, the potential of the gate line GL is set to a potential which allows the transistor 162 to be turned on, so that the transistor 162 is turned on. Thus, the potential of the bit line BL (a potential related to new data) is supplied to the floating gate portion FG. Then, the potential of the capacitor line CL is set to a potential at which the transistor 162 is turned off, whereby the transistor 162 is turned off. Consequently, a charge related to new data is supplied to and kept in the floating gate portion FG.

In the semiconductor device according to one embodiment of the present invention, data can be directly rewritten by another writing of data as described above. For that reason, extracting of charge from a floating gate with the use of a high voltage needed in a flash memory or the like is not necessary and thus reduction in operation speed, which is attributed to erasing operation, can be suppressed. In other words, high-speed operation of the semiconductor device can be realized.

As an example, a method for writing, holding, and reading in the case where a potential VDD or a ground potential GND is supplied to the floating gate portion FG is specifically described below. In the following description, data that is held when the potential VDD is supplied to the floating gate portion FG is referred to as data "1", and data that is held when the ground potential GND is supplied to the floating gate portion FG is referred to as data "0". Note that the relation between the potentials supplied to the floating gate portion FG is not limited to this.

When data is written, the potential of the source line SL is set to GND, the potential of the capacitor line CL is set to GND, and the potential of the gate line GL is set to VDD, so that the transistor 162 is turned on. When data "0" is written to the floating gate portion FG, GND is supplied to the bit line BL. When data "1" is written to the floating gate portion FG, the potential of the bit line BL may be set to VDD and the potential of the gate line GL may be set to VDD+Vth_OS so that the potential of the floating gate portion FG is not lowered by the same amount as the threshold voltage (Vth_OS) of the transistor 162.

When data is held, the potential of the gate line GL is set to GND, so that the transistor 162 is turned off. In order to reduce power consumption due to a current generated in the bit line BL and the source line SL through the transistor 160 which is a p-channel transistor, the potential of the bit line BL and the potential of the source line SL are set to the same potential. Note that the potential of the capacitor line CL may be either VDD or GND as long as the potential of the bit line BL and the potential of the source line SL are the same.

Note that the above expression "the same potential" includes "approximately the same potential". In other words, an object of the above is to reduce a current generated in the bit line BL and the source line SL by adequately reducing the potential difference between the bit line BL and the source line SL; therefore, "approximately the same potential", e.g., a potential which enables power consumption to be sufficiently reduced (to one hundredth or less) compared to the case where the potential of the source line SL is fixed to GND or the like, is included. In addition, potential deviation due to wire resistance or the like are reasonably acceptable.

When data is read, the potential of the gate line GL is set to GND, the potential of the capacitor line CL is set to GND, and the potential of the source line SL is set to VDD or a potential slightly lower than VDD (hereinafter referred to as VSL). Here, in the case where data "1" is written to the floating gate portion FG, the transistor 160 which is a p-channel transistor is turned off and the potential of the bit line BL at the beginning of the reading is maintained or is raised. Note that it depends on a reading circuit connected to the bit line BL whether the potential of the bit line BL is maintained or raised. In the case where data "0" is written to the floating gate portion FG, the transistor 160 is turned on and the potential of the bit line BL is set at VDD or VSL which is the same potential as that of the source line SL. Thus, the data "1" or the data "0" which is held in the floating gate portion FG can be read depending on the potential of the bit line BL.

Note that in the case where the potential VDD is held in (that is, data "1" is written to) the floating gate portion FG, the potential of the source line SL is set to VDD at the time of reading, so that a voltage between the gate and the source of the transistor 160 (hereinafter referred to as Vgsp) is set at Vgsp=VDD−VDD=0 V and Vgsp is set higher than the threshold voltage of the transistor 160 (hereinafter referred to as Vthp); thus, the transistor 160 which is a p-channel transistor is turned off. Here, even in the case where a potential held in the floating gate portion FG is lower than VDD because a potential written to the floating gate portion FG is lower than VDD, the transistor 160 is turned off because Vgsp=(VDD−|Vthp|)−VDD=−|Vthp|=Vthp are satisfied when the potential of the floating gate portion FG is higher than or equal to VDD−|Vthp|; thus, data "1" can be read accurately. However, in the case where the potential of the floating gate portion FG is lower than VDD−|Vthp|, the transistor 160 is turned on because Vgsp is set lower than Vthp; thus, not data "1" but data "0" is read, resulting in misreading. In other words, in the case where data "1" is written, the lower limit of a potential at which data can be read is lower than the potential VDD of the source line SL by |Vthp|, that is, VDD−|Vthp|. On the other hand, when the potential of the source line SL is set to VSL at the time of reading, the lower limit of a potential at which data "1" can be read is lower than the potential VSL of the source line SL by |Vthp|, that is VSL−|Vthp| as described above. Here, since the potential VSL is lower than the potential VDD, VSL−|Vthp| is lower than VDD−|Vthp|. In other words, the lower limit of the potential at which data "1" can be read is lowered when the potential of the source line SL is set to VSL. Consequently, VSL is preferable to VDD as the potential of the source line SL because a potential range in which data "1" can be read can be wide. Note that in the case where the potential of the source line SL is set to VSL, Vgsp becomes VDD−VSL>Vthp (because of VDD>VSL) when VDD is written to the floating gate portion FG so that the transistor 160 can be turned off without problems.

Here, the node (the floating gate portion FG) to which the drain electrode (or the source electrode) of the transistor 162, the gate electrode of the transistor 160, and the one electrode of the capacitor 164 are electrically connected has an effect similar to that of a floating gate of a floating-gate transistor which is used as a non-volatile memory element. When the transistor 162 is off, the floating gate portion FG can be regarded as being embedded in an insulator and thus charge is held in the floating gate portion FG. The off-state current of the transistor 162 including an oxide semiconductor is less than or equal to 1/100,000 of the off-state current of a transistor including a silicon semiconductor or the like; thus, loss of the charge accumulated in the floating gate portion FG due to a leakage current of the transistor 162 is negligible. That is, with the transistor 162 including an oxide semiconductor, a non-volatile memory device which can hold data without being supplied with power can be realized.

For example, when the off current of the transistor 162 is less than or equal to 10 zA (1 zA (zeptoampere) is $1 \times 10^{-21}$ A) at room temperature (25° C.) and the capacitance value of the capacitor 164 is approximately 10 fF, data can be held for $10^4$ seconds or longer. It is needless to say that the holding time depends on transistor characteristics and the capacitance value.

Further, in the semiconductor device according to one embodiment of the present invention, the problem of deterioration of a gate insulating layer (tunnel insulating film), which is pointed out in a conventional floating gate transistor, does not exist. That is, the problem of deterioration of a gate insulating layer due to injection of electrons into a floating gate, which has been regarded as a problem, can be solved. This means that there is no limit on the number of times of writing in principle. Furthermore, a high voltage needed for writing or erasing in a conventional floating gate transistor is not necessary.

The components such as transistors in the semiconductor device in FIG. 1A1 can be regarded as including a resistor and a capacitor as shown in FIG. 1A2. That is, in FIG. 1A2, the transistor 160 and the capacitor 164 are each regarded as including a resistor and a capacitor. R1 and C1 denote the resistance value and the capacitance value of the capacitor 164, respectively. The resistance R1 corresponds to the resistance of an insulating layer included in the capacitor 164. R2 and C2 denote the resistance value and the capacitance value of the transistor 160, respectively. The resistance value R2 corresponds to the resistance value which depends on a gate insulating layer at the time when the transistor 160 is on. The capacitance C2 corresponds to so-called gate capacitance (capacitance formed between the gate electrode and the source electrode or the drain electrode and capacitance formed between the gate electrode and the channel formation region).

A charge holding period (also referred to as a data holding period) is determined mainly by the off-state current of the transistor 162 under the conditions where the gate leakage current of the transistor 162 is sufficiently small and R1 and R2 satisfy R1≧ROS and R2≧ROS, where ROS is the resistance (also referred to as effective resistance) between the source electrode and the drain electrode in a state where the transistor 162 is turned off.

On the other hand, when the conditions are not satisfied, it is difficult to sufficiently secure the holding period even if the off-state current of the transistor 162 is low enough. This is because a leakage current other than the off-state current of the transistor 162 (e.g., a leakage current generated between the source electrode and the gate electrode) is high. Thus, it can be said that the semiconductor device according to this embodiment desirably satisfies the relation where R1≧ROS and R2≧ROS.

On the other hand, it is desirable that C1≧C2 be satisfied. This is because if the capacitance C1 is large, the potential of the capacitor line CL can be supplied to the floating gate portion FG efficiently at the time of controlling the potential of the floating gate portion FG by the capacitor line CL, and a difference between potentials (e.g., a reading potential and a non-reading potential) supplied to the capacitor line CL can be made small.

As described above, when the above relation is satisfied, a more favorable semiconductor device can be realized. Note that R1 and R2 are controlled by the gate insulating layer of the transistor 160 and the insulating layer of the capacitor 164. The same relation is applied to C1 and C2. Therefore, the material, the thickness, and the like of the gate insulating layer are desirably set as appropriate to satisfy the above relation.

In the semiconductor device described in this embodiment, the floating gate portion FG has an effect similar to a floating gate of a floating-gate transistor in a flash memory or the like, but the floating gate portion FG of this embodiment has a feature which is essentially different from that of the floating gate in the flash memory or the like.

In a flash memory, since a potential applied to a control gate is high, it is necessary to keep a proper distance between cells in order to prevent the potential from affecting a floating gate of the adjacent cell. This is one of inhibiting factors for high integration of the semiconductor device. The factor is attributed to a basic principle of a flash memory, in which a tunneling current flows in applying a high electrical field.

In contrast, the semiconductor device according to this embodiment is operated by switching of a transistor including an oxide semiconductor and does not use the above-described principle of charge injection by tunneling current. That is, a high electrical field for charge injection is not necessary unlike a flash memory. Consequently, it is not necessary to consider an influence of a high electrical field from a control gate on an adjacent cell, which facilitates high integration.

In addition, it is also advantage over a flash memory that a high electric field is unnecessary and a large peripheral circuit (such as a booster circuit) is unnecessary. For example, the highest voltage applied to the memory cell according to this embodiment (the difference between the highest potential and the lowest potential applied to terminals of the memory cell at the same time) can be lower than or equal to 5 V, preferably lower than or equal to 3 V in each memory cell in the case where two levels (one bit) of data are written.

In the case where the dielectric constant $\in$r1 of the insulating layer included in the capacitor 164 is different from the dielectric constant $\in$r2 of the insulating layer included in the transistor 160, C1 can easily be made greater than or equal to C2 while S1 which is the area of the insulating layer included in the capacitor 164 and S2 which is the area of an insulating layer forming gate capacitance of the transistor 160 satisfy the relation where 2×S2 is greater than or equal to S1 (2×S2≧S1), desirably S2 is greater than or equal to S1 (S2≧S1). In other words, C1 can easily be made greater than or equal to C2 while the area of the insulating layer included in the capacitor 164 is small. Specifically, for example, when a film formed of a high-k material such as hafnium oxide or a stack of a film formed of a high-k material such as hafnium oxide and a film formed of an oxide semiconductor is used for the insulating layer included in the capacitor 164, $\in$r1 can be set to more than or equal to 10, preferably more than or equal to 15, and when a film formed of silicon oxide is used for the insulating layer forming the gate capacitance, $\in$r2 can be set to 3 to 4.

A combination of such structures enables still higher integration of the semiconductor device according to one embodiment of the present invention.

APPLICATION EXAMPLE

Next, a more specific circuit configuration to which the circuit illustrated in FIGS. 1A1, 1A2, 1B, and 1C is applied and an operation thereof will be described with reference to drawings. In this embodiment, a so-called multi-valued memory which holds a plurality of states in one memory cell is described.

FIG. 2 is an example of a block diagram of a semiconductor device. A feature of a block diagram of the semiconductor device illustrated in FIG. 2 relates to writing operation of a driver circuit. The semiconductor device illustrated in FIG. 2 is a multi-valued memory which holds $2^K$-valued (K is an integer greater than or equal to 1) state in one memory cell and includes a memory cell array 201 including a plurality of memory cells, a column driver circuit 202, a row driver circuit 203, and a potential generating circuit 207.

The memory cell array 201 includes a plurality of (for example, m) gate lines GL and a plurality of (for example, m) capacitor lines CL, a plurality of (for example, n) bit lines BL, source lines SL (not shown), and a plurality of memory cells 170 arranged in matrix.

As the memory cells 170, the memory cell illustrated in FIG. 1A1 can be applied. Alternatively, as the memory cells 170, the memory cell illustrated in FIG. 1B can be applied. In that case, the capacitor lines CL can be omitted. Further alternatively, as the memory cells 170, the memory cell illustrated in FIG. 1C can be applied.

The potential generating circuit 207 is connected to the column driver circuit 202 through $2^K$ power supply lines VW to which the plurality of analog potentials VW (1) to VW ($2^K$) are supplied. The potential generating circuit 207 generates the plurality of analog potentials VW (1) to VW ($2^K$) and outputs to the column driver circuit 202.

Column address signal lines CA, input data signal lines DIN, output data signal lines DOUT, control signal lines CE, and the like are connected to the column driver circuit 202. In the column driver circuit 202, a K-bit latch portion and a writing circuit are provided per every column of the memory cells 170. Latch groups 226 (1) to 226 (n) are connected to writing circuits 224 (1) to 224 (n), respectively through K latch output signal lines. The column driver circuit 202 controls the bit lines BL and the source lines SL and is connected to the memory cell array 201 through the bit lines BL and the source lines SL.

The writing circuits 224 (1) to 224 (n) are connected to the K latch output signal lines and the $2^K$ power supply lines VW to which the analog potentials VW (1) to VW ($2^K$) output from the potential generating circuit 207 are supplied. The writing circuits 224 (1) to 224 (n) include multiplexers 335 (1) to 335 (n), respectively. The multiplexers 335 (1) to 335 (n) each select one potential from the plurality of analog potentials VW (1) to VW ($2^K$), which are output from the potential generating circuit 207, based on output signals from the K-bit latch groups 226 (1) to 226 (n). Then, the writing circuits 224 (1) to 224 (n) output the potentials selected by the multiplexers 335 (1) to 335 (n) in a state where writing operation can be performed.

Row address signal lines RA, control signal lines CE, and the like are connected to the row driver circuit 203. The row driver circuit 203 controls the gate lines GL and the capacitor lines CL and is connected to the memory cell array 201 through the gate lines GL and the capacitor lines CL.

Next, a method for writing data stored in the K-bit latch groups 226 (1) to 226 (n) in the columns to the memory cells in one row at one time will be described.

In the row driver circuit 203, a High potential (hereinafter referred to as an H potential) is supplied to the control lines CE to make the row driver circuit 203 capable of operating, a row address signal is input to the row address signal lines RA, and a row specified by the row address signal is selected. A signal indicating a state of writing is input to a predetermined control line CE and a potential for writing is supplied to each of the capacitor line CL and the gate line GL in the selected row and the capacitor line CL and the gate line GL in the non-selected row. In the memory cells 170 (1, 1) to 170 (m, n) having a configuration illustrated in FIG. 2, the potential of the capacitor line CL and the potentials of the gate line GL in the selected row are set at a Low potential (hereinafter referred to as an L potential) and a potential VH, respectively and the potentials of the capacitor line CL and the potential of the gate line GL in the non-selected row are set at a potential VH and an L potential, respectively.

In the column driver circuit 202, an H potential is supplied to the control lines CE to make the column driver circuit 202 capable of operating. A signal indicating a state of writing is input to a predetermined control line CE, whereby the writing circuits 224 (1) to 224 (n) in the columns each output one potential selected from the plurality of analog potentials VW (1) to VW ($2^K$) to the bit lines BL (1) to BL (n). The potential is selected by the multiplexers 335 (1) to 335 (n) included in the writing circuits 224 (1) to 224 (n) based on output signals from the K-bit latch groups 226 (1) to 226 (n).

As a result, the analog potentials output from the writing circuits 224 (1) to 224 (n) in the columns are supplied to floating gate portions FG of the memory cells in the row selected by the row driver circuit 203 through the bit lines BL.

Next, in the row driver circuit 203, a signal indicating that a state of writing is finished is input to the predetermined control line CE and a potential for finishing writing is supplied to each of the capacitor line CL and the gate line GL in the selected row and the capacitor line CL and the gate line GL in the non-selected row. In the memory cells 170 having the configuration illustrated in FIG. 2, the potential of the gate line GL in the selected row is set at an L potential. Consequently, the transistor 162 included in the memory cell in the selected row is turned off and a charge accumulated in the floating gate portion FG is held. The potential of the capacitor line CL in the non-selected row is set at an L potential. Thus, the writing operation to the memory cells 170 (1, 1) to 170 (m, n) is finished.

As described above, multi-valued data can be written to the memory cells in one row at one time in the semiconductor device illustrated in FIG. 2.

Note that as an example, an H potential can be set to VDD and an L potential can be set to GND.

The semiconductor device illustrated in FIG. 2 has a configuration in which the bit line BL and the floating gate portion FG included in the memory cell are connected to each other through the transistor 162; therefore, in writing operation, a potential can be directly supplied to the floating gate portion FG where charge is accumulated. Consequently, writing operation can be performed to each memory cell at high speed. In particular, the potential of the floating gate portion FG is controlled in a short time with high accuracy and writing operation can be performed compared to a writing method which performs charge injection with extremely low tunneling current as in a floating gate transistor used as a non-volatile memory element.

Further, in the semiconductor device illustrated in FIG. 2, a plurality of analog potentials generated in the potential generating circuit 207 is supplied to all of the writing circuits 224 (1) to 224 (n) in the columns, whereby the writing circuits 224 (1) to 224 (n) in the columns each can independently select a potential corresponding to writing data from the plurality of analog potentials. As a result, multi-valued data can be written to memory cells in one row at one time and at high speed.

Note that in the case where data is written by performing charge injection with extremely low tunneling current as in a floating gate transistor used as a non-volatile memory element, it is necessary to change writing time corresponding to writing data. In other words, writing needs to be performed in a short time when data is written with small amount of charge injection and writing needs to be performed in a long time when data is written with large amount of charge injection. As a result, plural times of writing are needed, which leads to complex and low-speed operation. On the other hand, the semiconductor device illustrated in FIG. 2 can write multi-valued data to memory cells in one row at one time and at high speed regardless of writing data.

Further, in a method for writing data to a $2^K$-valued memory, $2^K$-valued data stored in the memory cells can be brought into correspondence with the K-bit latch portions and the circuit size of the semiconductor device in FIG. 2 can be reduced. For example, in the case where 4-valued data is stored, a configuration including a 2-bit latch portion is employed. In particular, in the method for writing data to a $2^K$-valued memory, $2^K$-bit latch portions are needed in the case where each of $2^K$-valued data stored in the memory cells are brought into correspondence with their respective latches. Comparing with such a configuration, the circuit size can be reduced.

Figure 5:
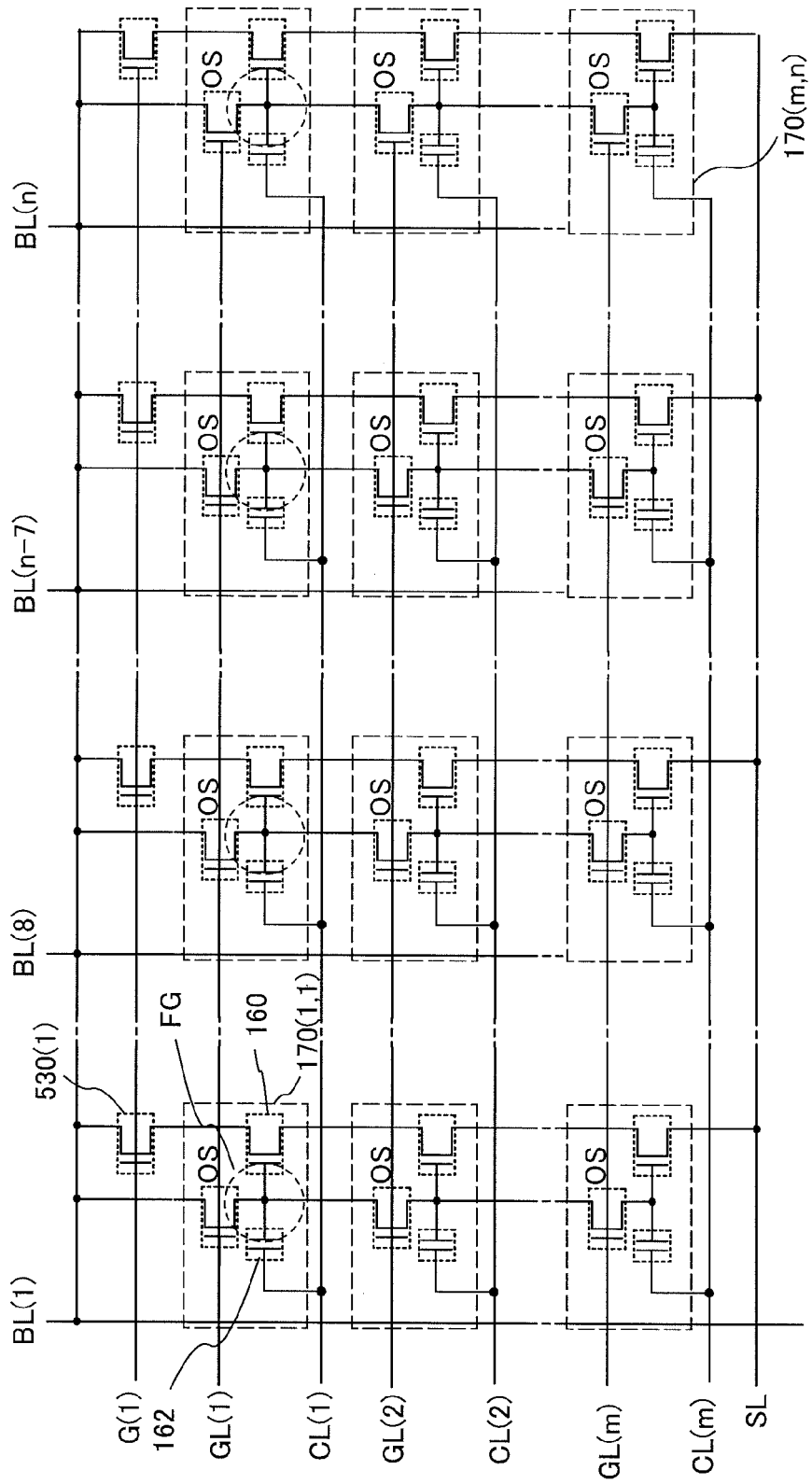
FIG. 5 is a circuit diagram of a semiconductor device.

Note that in this embodiment, a configuration of a NOR-type memory cell array including the memory cells illustrated in FIG. 1A1, in which the source electrode or the drain electrode of the transistor 160 and the source electrode or the drain electrode of the transistor 162 are connected in parallel by the bit lines BL, is described as an example; however, one embodiment of the present invention is not limited to this configuration. The source electrode or the drain electrode of the transistor 160 and the source electrode or the drain electrode of the transistor 162 may be connected to different wirings. As illustrated in FIG. 1C, the transistor 160 included in a memory cell may be an n-channel transistor. Further, as illustrated in FIG. 5, a NAND-type memory cell array in which memory cells are connected in series may be employed.

This is because in the semiconductor device illustrated in FIG. 2, the writing circuits 224 (1) to 224 (n) in the columns can independently select a potential corresponding to writing data from a plurality of analog potentials regardless of the configuration of the memory cell. This is also because a potential can be directly supplied to the floating gate portion FG and writing can be performed at high speed as long as the gate line GL is connected to the floating gate portion FG through the transistor 162 in the memory cell.

Note that in this embodiment, the input data signal lines DIN and the output data signal lines DOUT are connected to the column driver circuit 202; however, the present invention is not limited to this. An input/output data signal line DINOUT may alternatively be connected.

Figure 24:
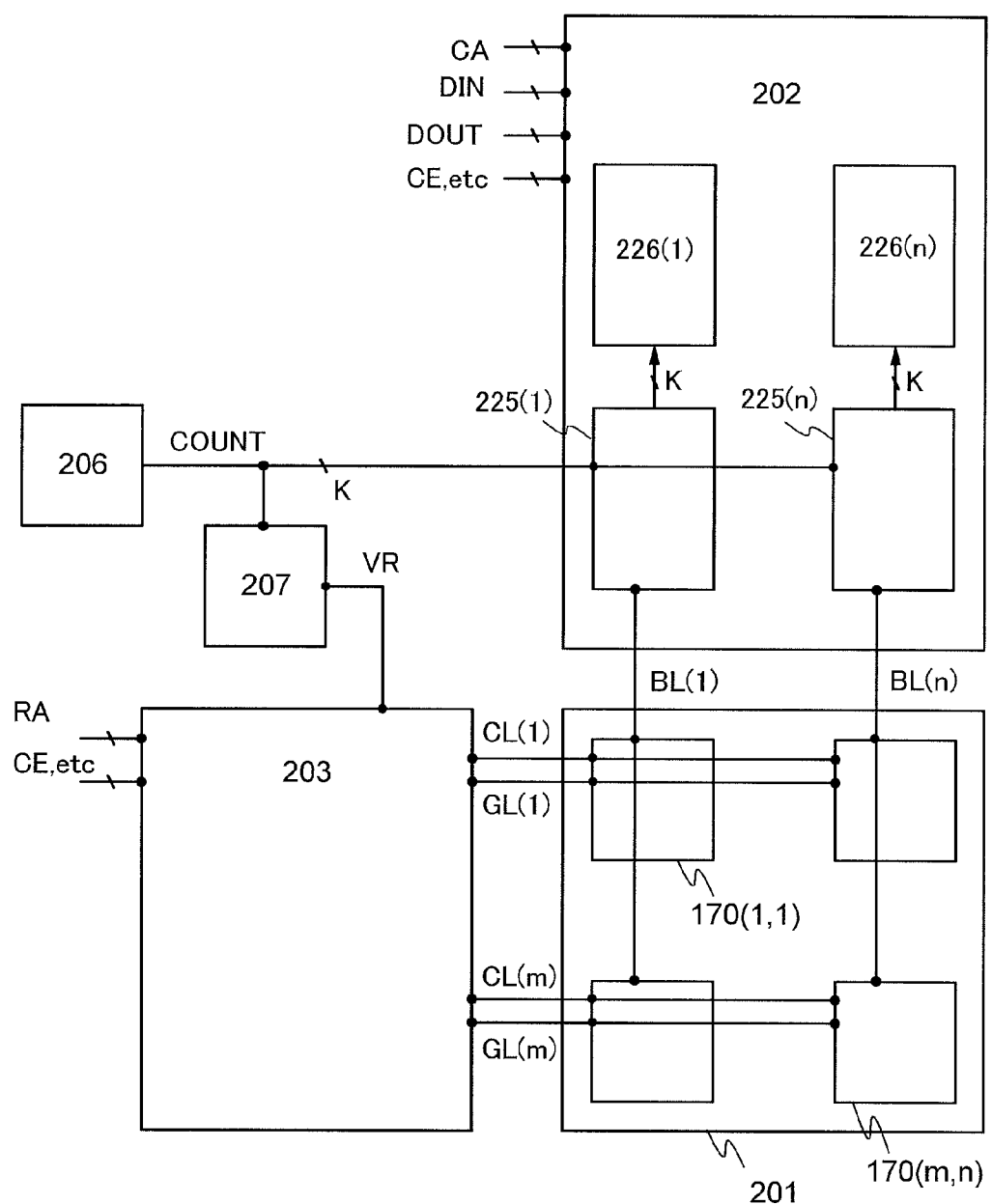
FIG. 24 is a block diagram of a semiconductor device.

FIG. 24 is another example of a block diagram of the semiconductor device. A feature of a block diagram of the semiconductor device illustrated in FIG. 24 relates to reading operation of a driver circuit. The semiconductor device illustrated in FIG. 24 is a multi-valued memory which holds $2^K$-valued (K is an integer greater than or equal to 1) state in one memory cell and includes the memory cell array 201 including a plurality of memory cells, the column driver circuit 202, the row driver circuit 203, the potential generating circuit 207, and a K-bit counter 206.

The memory cell array 201 includes a plurality of gate lines GL and a plurality of capacitor lines CL, a plurality of bit lines BL, source lines SL, and a plurality of memory cells 170 arranged in matrix.

As the memory cells 170, the memory cell illustrated in FIG. 1A1 can be applied. Alternatively, as the memory cells 170, the memory cell illustrated in FIG. 1B can be applied. In that case, the capacitor lines CL can be omitted. Further alternatively, as the memory cells 170, the memory cell illustrated in FIG. 1C can be applied.

The K-bit counter 206 outputs K count signals COUNT (1) to COUNT (K) to the column driver circuit 202 and the potential generating circuit 207. The K-bit counter 206 is connected to the column driver circuit 202 and the potential generating circuit 207 through K counter signal lines.

The K count signals COUNT (1) to COUNT (K) are input to the potential generating circuit 207 and the potential generating circuit 207 outputs an analog potential to the row driver circuit 203. The potential generating circuit 207 generates the analog potential which varies in response to a value of a count signal. The potential generating circuit 207 is connected to the row driver circuit 203 through a variable power supply line VR to which the analog potential is supplied.

The column address signal lines CA, the input data signal lines DIN, the output data signal lines DOUT, the control signal lines CE, and the like are connected to the column driver circuit 202. In the column driver circuit 202, a K-bit latch portion and a reading circuit are provided per every column of the memory cells 170. The latch groups 226 (1) to 226 (n) are connected to reading circuits 225 (1) to 225 (n), respectively through K latch input signal lines. The column driver circuit 202 controls the bit lines BL and the source lines SL and is connected to the memory cell array 201 through the bit lines BL and the source lines SL.

The memory cells 170 are connected to the reading circuits 225 (1) to 225 (n) as loads through the bit lines BL. The reading circuits 225 (1) to 225 (n) includes K output signal lines. The reading circuits 225 (1) to 225 (n) each output an internal signal which is set at an H potential when load resistance is high and is set at an L potential when load resistance is low in the state where reading operation can be performed. Further, the reading circuits 225 (1) to 225 (n) supply the K count signals COUNT (1) to COUNT (K), which are input from the K-bit counter 206, to the output signal lines when the internal signal is set at an H potential, and the output signal lines are placed in a high impedance state when the internal signal is set at an L potential. The latch groups 226 (1) to 226 (n) store data given to the K latch input signal lines.

The row address signal lines RA, the control signal lines CE, and the like are connected to the row driver circuit 203. The row driver circuit 203 controls the gate lines GL and the capacitor lines CL and is connected to the memory cell array 201 through the gate lines GL and the capacitor lines CL.

Next, a method for reading multi-valued data from a memory cell in a desired row and storing the data in the K-bit latch groups 226 (1) to 226 (n) in the columns will be described.

In the row driver circuit 203, an H potential is supplied to the control lines CE to make the row driver circuit 203 capable of operating, a row address signal is input to the row address signal lines RA, and a row specified by the row address signal is selected. A signal indicating a state of reading is input to a predetermined control line CE and a potential for reading is supplied to each of the capacitor line CL and the gate line GL in the selected row and the capacitor line CL and the gate line GL in the non-selected row. In the memory cells 170 (1, 1) to 170 (n, m) having a configuration illustrated in FIG. 24, an analog potential output from the potential generating circuit 207 is supplied to the capacitor line CL in the selected row and a potential VH is supplied to the capacitor line CL in the non-selected row. An L potential is supplied to the gate line GL.

In the column driver circuit 202, an H potential is supplied to the control lines CE to make the column driver circuit 202 capable of operating. A signal indicating a state of reading is input to a predetermined control line CE, whereby the reading circuits 225 (1) to 225 (n) in the columns are placed in the state where reading operation can be performed. A potential VSR is supplied to the source lines SL.

In addition, the K-bit counter counts from "0" to "$2^K-1$" during a reading period. The potential generating circuit 207 generates and outputs an analog potential VR (i) when a value of the counter is "i" (i is 0 to $2^K-1$). In this embodiment, the larger the value of the counter is, the lower the generated analog potential is. That is, VR(i)>VR(i+1) (i is 0 to $2^K-2$). As a result, a high analog potential VR (0) to a low analog potential VR ($2^K-1$) are sequentially supplied to the capacitor line CL in the selected row in response to the value of the counter.

The potential of the floating gate portion FG varies by capacitive coupling when the potential of the capacitor line CL varies. A potential of the capacitor line CL which is needed to turn on the transistor 160 is referred to as the threshold voltage of the memory cell. In this embodiment, since the transistor 160 is a p-channel transistor, the transistor 160 is turned off when the potential of the capacitor line CL is higher than the threshold voltage of the memory cell and the transistor 160 is turned on when the potential of the capacitor line CL is lower than the threshold voltage of the memory cell. The threshold voltage of the memory cell varies depending on data stored in the memory cell. The threshold voltage of the memory cell is Vth (i) when data stored in the memory cell is j (j is 0 to $2^K-1$).

The potential generating circuit 207 generates a potential VR (i) which satisfies VR (i)>Vth (i) (i is 0 to $2^K-1$) and Vth (i)>(i+1) (i is 0 to $2^K-2$). That is, a potential higher than the threshold voltage of a memory cell storing data "j" (j is i to $2^K-1$) and lower than the threshold voltage of the memory cell storing data "j" (j is 0 to i−1) is generated as VR (i).

When the potential of the capacitor line CL is decreased together with the value of the counter and is set lower than the threshold voltage of the selected memory cell, the transistor 160 is turned on from an off state. The load resistance of the reading circuits 225 (1) to 225 (n) in the columns varies from high load resistance to low load resistance when the transistors 160 in the memory cells in the corresponding columns is turned on from an off state.

When the load resistance is high, the reading circuits 225 (1) to 225 (n) output the K count signals COUNT (1) to COUNT (K) input from the K-bit counter 206. Then, values of the count signals which are output signals from the reading circuits 225 (1) to 225 (n) are stored in the K-bit latch portions. On the other hand, when load resistance is low, the output signal lines of the reading circuits 225 (1) to 225 (n) are placed in a high impedance state. At this time, data stored in the K-bit latch groups 226 (1) to 226 (n) are held. Consequently, a value of the counter at the time when the potential of the capacitor line CL is set lower than the threshold voltage of the memory cell is stored in the K-bit latch groups 226 (1) to 226 (n). That is, when a memory cell storing data "i" is read, the data "i" is stored in the latch portion.

As described above, multi-valued data can be read from a memory cell in the desired row in the semiconductor device illustrated in FIG. 24.

Note that as an example, an H potential, an L potential, and a potential VSR can be VDD, GND, and VDD, respectively.

In a method for reading data from a $2^K$-valued memory, $2^K$-valued data stored in the memory cells can be brought into correspondence with the K-bit latch portions and the circuit size of the semiconductor device in FIG. 24 can be reduced. For example, in the case where 4-valued data is stored, a configuration including a 2-bit latch portion is employed. In particular, in the method for reading data from a $2^K$-valued memory, $2^K$-bit latch portions are needed in the case where each of $2^K$-valued data stored in the memory cells are brought into correspondence with their respective latches. Comparing with such a configuration, circuit size can be reduced.

Figure 4:
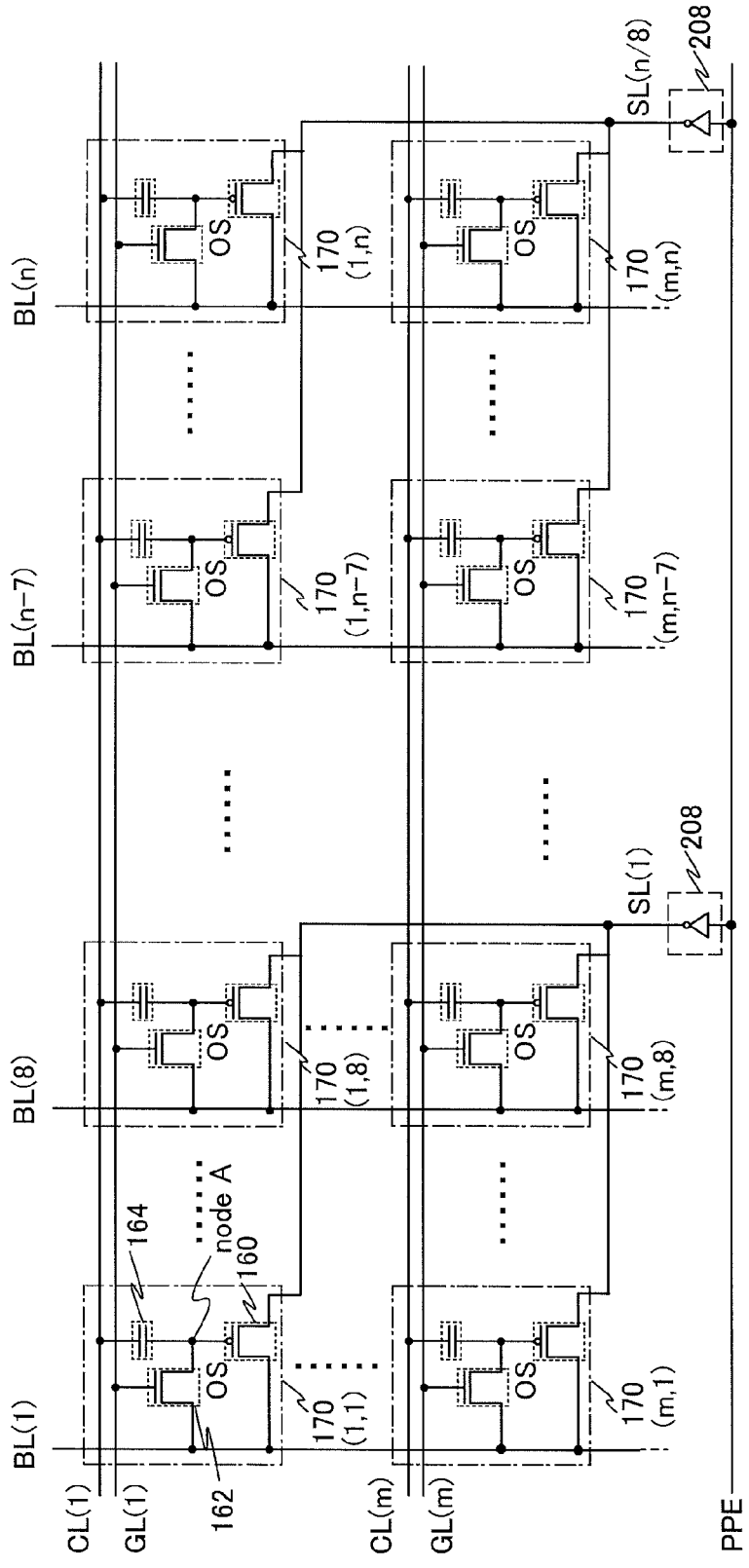
FIG. 4 is a circuit diagram of a semiconductor device.

Note that in this embodiment, a configuration of a NOR-type memory cell array including the memory cells illustrated in FIG. 1A1, in which the source electrode or the drain electrode of the transistor 160 and the source electrode or the drain electrode of the transistor 162 are connected in parallel by the bit lines BL, is described as an example; however, one embodiment of the present invention is not limited to this configuration. The source electrode or the drain electrode of the transistor 160 and the source electrode or the drain electrode of the transistor 162 may be connected to different wirings. As illustrated in FIG. 1C, the transistor 160 included in a memory cell may be an n-channel transistor. Further, as illustrated in FIG. 4, a NAND-type memory cell array in which memory cells are connected in series may be employed.

This is because in the semiconductor device illustrated in FIG. 24, the reading circuits 225 (1) to 225 (n) in the columns each store a value of the counter at the time when load resistance varies in the latch portion regardless of a configuration of the memory cells. This is also because the state of the memory cell (whether the transistor 160 is in an on state or an off state) can be controlled by a value of the K-bit counter 206.

Note that in this embodiment, the K-bit counter 206 counts from "0" to "$2^K-1$" during a reading period; however, one embodiment of the present invention is not limited to this. The K-bit counter 206 may count from "$2^K-1$" to "0". Further, in this embodiment, a high analog potential to a low analog potential are sequentially supplied to the capacitor line CL in the selected row; however, one embodiment of the present invention is not limited to this. A low analog potential to a high analog potential may be sequentially supplied to the capacitor line CL in the selected row. Furthermore, in this embodiment, the threshold voltage Vth (j) of the memory cell storing data "j" is higher than the threshold voltage Vth (j+1) of a memory cell storing data "j+1": however, one embodiment of the present invention is not limited to this. The threshold voltage Vth (j) of the memory cell storing data "j" may be lower than the threshold voltage Vth (j+1) of the memory cell storing data "j+1".

Note that in this embodiment, the input data signal lines DIN and the output data signal lines DOUT are connected to the column driver circuit 202; however, the present invention is not limited to this. An input/output data signal line DINOUT may alternatively be connected.

Figure 25:
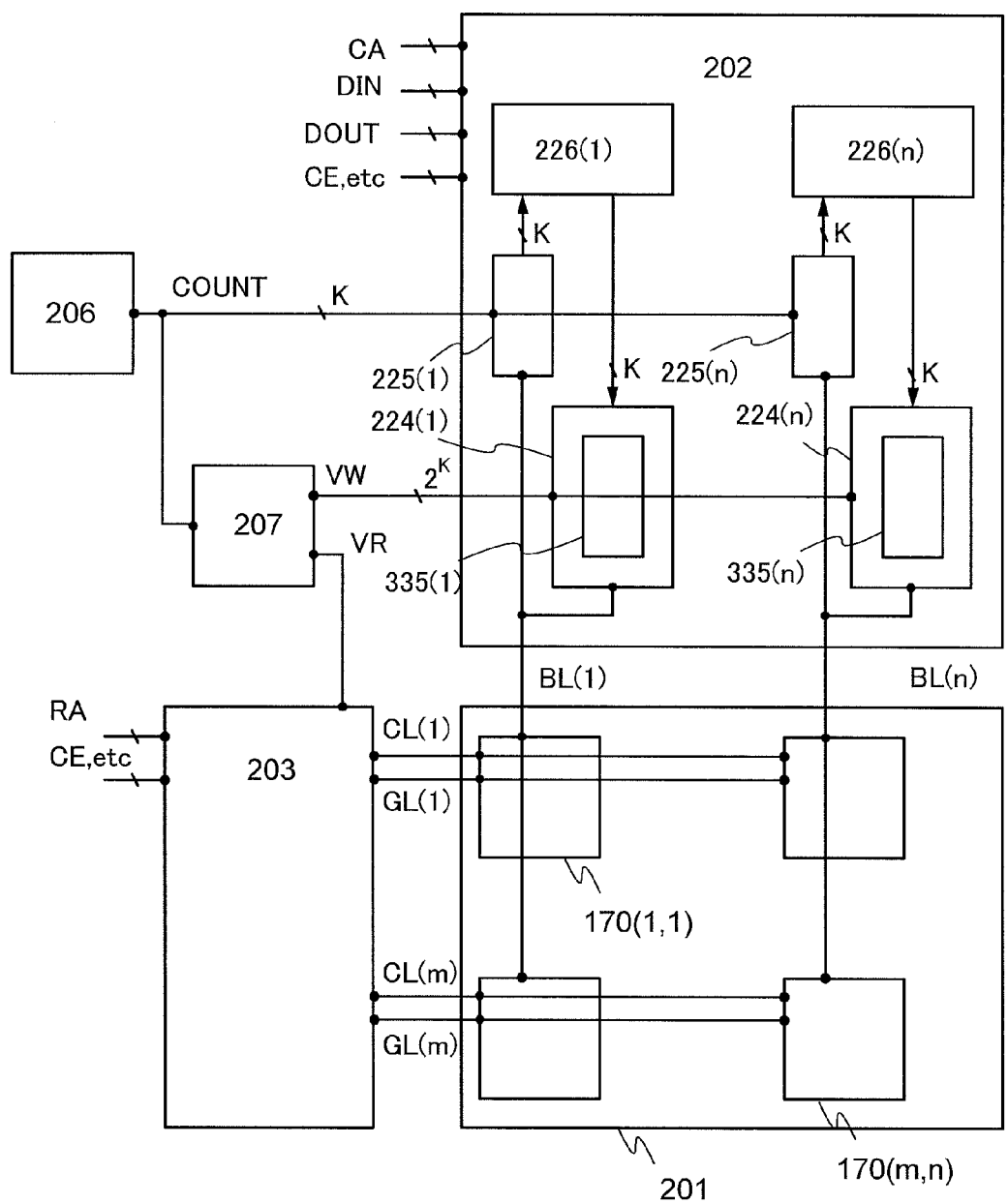
FIG. 25 is a block diagram of a semiconductor device.

FIG. 25 is an example of a block diagram of a semiconductor device. A feature of a block diagram of the semiconductor device illustrated in FIG. 25 relates to writing operation and reading operation of a driver circuit. The semiconductor device illustrated in FIG. 25 is a multi-valued memory which holds $2^K$-valued (K is an integer greater than or equal to 1) state in one memory cell and includes the memory cell array 201 including a plurality of memory cells, the column driver circuit 202, the row driver circuit 203, the potential generating circuit 207, and the K-bit counter 206.

The memory cell array 201 includes a plurality of (for example, m) gate lines GL and a plurality of (for example, m) capacitor lines CL, a plurality of (for example, n) bit lines BL, source lines SL (not shown), and a plurality of memory cells 170 arranged in matrix.

As the memory cells 170, the memory cell illustrated in FIG. 1A1 can be applied. Alternatively, as the memory cells 170, the memory cell illustrated in FIG. 1B can be applied. In that case, the capacitor lines CL can be omitted. Further alternatively, as the memory cells 170, the memory cell illustrated in FIG. 1C can be applied.

The potential generating circuit 207 generates a plurality of analog potentials VW (1) to VW ($2^K$) and outputs to the column driver circuit 202. The potential generating circuit 207 is connected to the column driver circuit 202 through $2^K$ power supply lines to which the analog potentials VW (1) to VW ($2^K$) are supplied. K count signals COUNT (1) to COUNT (K) are input to the potential generating circuit 207 and the potential generating circuit 207 outputs the analog potentials to the row driver circuit 203. The potential generating circuit 207 generates the analog potentials which vary in response to a value of a count signal. The potential generating circuit 207 is connected to the row driver circuit 203 through the power supply line to which the analog potentials are supplied.

The column address signal lines CA, the input data signal lines DIN, the output data signal lines DOUT, the control signal lines CE, and the like are connected to the column driver circuit 202. In the column driver circuit 202, a K-bit latch portion, a writing circuit, and a reading circuit are provided per every column of the memory cells 170. The latch groups 226 (1) to 226 (n) are connected to the writing circuits 224 (1) to 224 (n) and the reading circuits 225 (1) to 225 (n) through K latch input signal lines, respectively. The column driver circuit 202 controls the bit lines BL and the source lines SL and is connected to the memory cell array 201 through the bit lines BL and the source lines SL.

The writing circuits 224 (1) to 224 (n) are connected to the K latch output signal lines and the $2^K$ power supply lines VW to which the analog potentials VW (1) to VW ($2^K$) output from the potential generating circuit 207 are supplied. The writing circuits 224 (1) to 224 (n) include the multiplexers 335 (1) to 335 (n), respectively. The multiplexers 335 (1) to 335 (n) each select one potential from the plurality of analog potentials VW (1) to VW ($2^K$), which are output from the potential generating circuit 207, based on output signals of the K-bit latch groups 226 (1) to 226 (n). The writing circuits 224 (1) to 224 (n) output the potentials selected by the multiplexers 335 (1) to 335 (n) in a state where writing operation can be performed.

The memory cells 170 are connected to the reading circuits 225 (1) to 225 (n) as loads through the bit lines BL. The reading circuits 225 (1) to 225 (n) includes K output signal lines. The reading circuits 225 (1) to 225 (n) each output an internal signal which is set at an H potential when load resistance is high and is set at an L potential when load resistance is low in the state where reading operation can be performed. Further, the reading circuits 225 (1) to 225 (n) supply the K count signals COUNT (1) to COUNT (K), which are input from the K-bit counter 206, to the output signal lines when the internal signal is set at an H potential, and the output signal lines are placed in a high impedance state when the internal signal is set at an L potential. The latch groups 226 (1) to 226 (n) store data given to the K latch input signal lines.

The row address signal lines RA, the control signal lines CE, and the like are connected to the row driver circuit 203. The row driver circuit 203 controls the gate lines GL and the capacitor lines CL and is connected to the memory cell array 201 through the gate lines GL and the capacitor lines CL.

Next, a method for writing data stored in the K-bit latch groups 226 (1) to 226 (n) in the columns to the memory cells in one row at one time is the same as that of the semiconductor device illustrated in FIG. 2 and thus its description is omitted.

A reading method for reading multi-valued data from memory cells in a desired row and storing the data in the K-bit latch groups 226 (1) to 226 (n) in the columns is the same as that of the semiconductor device illustrated in FIG. 24 and thus its description is omitted.

The semiconductor device illustrated in FIG. 25 has a configuration in which the bit line BL and the floating gate portion FG included in the memory cell are connected to each other through the transistor 162; therefore, in writing operation, a potential can be directly supplied to the floating gate portion FG where charge is accumulated. Consequently, writing operation can be performed to each memory cell at high speed. In particular, the potential of the floating gate portion FG is controlled in a short time with high accuracy and writing operation can be performed compared to a writing method which performs charge injection with extremely low tunneling current as in a floating gate transistor used as a non-volatile memory element.

Further, in the semiconductor device illustrated in FIG. 25, a plurality of analog potentials generated in the potential generating circuit 207 is supplied to all of the writing circuits 224 (1) to 224 (n) in the columns, whereby the writing circuits 224 (1) to 224 (n) in the columns each can independently select a potential corresponding to writing data from the plurality of analog potentials. As a result, multi-valued data can be written to memory cells in the row at one time and at high speed.

Note that in the case where data is written by performing charge injection with extremely low tunneling current as in a floating gate transistor used as a non-volatile memory element, it is necessary to change writing time corresponding to writing data. In other words, writing needs to be performed in a short time when data is written with small amount of charge injection and writing needs to be performed in a long time when data is written with large amount of charge injection. As a result, plural times of writing are needed, which leads to complex and low-speed operation. On the other hand, the semiconductor device illustrated in FIG. 25 can write multivalued data to memory cells in one row at one time and at high speed regardless of writing data.

Further, in a method for writing and reading data to/from a $2^K$-valued memory, $2^K$-valued data stored in the memory cells can be brought into correspondence with the K-bit latch portions and the circuit size of the semiconductor device in FIG. 25 can be reduced. In particular, data written to the memory cell and data read from the memory cell can be stored in the same K-bit latch circuit, whereby the circuit size can be reduced. For example, in the case where 4-valued data is stored, a configuration including 2-bit latch portions is employed.

In the method for writing data to a $2^K$-valued memory, $2^K$-bit latch portions are needed in the case where each of $2^K$-valued data stored in the memory cells are brought into correspondence with their respective latches. Alternatively, in the method for reading data from a $2^K$-valued memory, $2^K$-bit latch portions are needed in the case where each of $2^K$-valued data stored in the memory cells are brought into correspondence with their respective latches. Even if data written to the memory cell and data read from the memory cell are K-bit data, a K-bit latch portion for reading operation and a K-bit latch portion for writing operation need to be separately formed when a format of the data is different between them; thus, the circuit size is increased. The circuit size of the semiconductor device having the configuration illustrated in FIG. 25 can be small compared to any of the above cases.

Note that in this embodiment, as illustrated in FIG. 4, a configuration of a NOR-type memory cell array including the memory cells illustrated in FIG. 1A1, in which the source electrode or the drain electrode of the transistor 160 and the source electrode or the drain electrode of the transistor 162 are connected in parallel by the bit lines BL, is described as an example; however, one embodiment of the present invention is not limited to this configuration. The source electrode or the drain electrode of the transistor 160 and the source electrode or the drain electrode of the transistor 162 may be connected to different wirings. As illustrated in FIG. 1C, the transistor 160 including the memory cells may be an n-channel transistor. Further, as illustrated in FIG. 5, a NAND-type memory cell array in which memory cells are connected in series may be employed.

This is because in the semiconductor device illustrated in FIG. 25, the writing circuits 224 (1) to 224 (n) in the columns can independently select a potential corresponding to writing data from a plurality of analog potentials regardless of the configuration of the memory cell. This is also because a potential can be directly supplied to the floating gate portion FG and writing can be performed at high speed as long as the gate line GL is connected to the floating gate portion FG through the transistor 162 in the memory cell.

Further, this is because in the semiconductor device illustrated in FIG. 25, the reading circuits 225 (1) to 225 (n) in the columns each store a value of the counter at the time when load resistance varies in the latch portion regardless of a configuration of the memory cells. This is also because the state of the memory cell (whether the transistor 160 is an on state or an off state) can be controlled by a value of the K-bit counter 206.

Note that in this embodiment, the K-bit counter 206 counts from "0" to "$2^K-1$" during a reading period; however, one embodiment of the present invention is not limited to this. The K-bit counter 206 may count from "$2^K-1$" to "0". Further, in this embodiment, a high analog potential to a low analog potential are sequentially supplied to the capacitor line CL in the selected row; however, one embodiment of the present invention is not limited to this. A low analog potential to a high analog potential may be sequentially supplied to the capacitor line CL in the selected row. Furthermore, in this embodiment, the threshold voltage Vth (j) of the memory cell storing data "j" is higher than the threshold voltage Vth (j+1) of the memory cell storing data "j+1"; however, one embodiment of the present invention is not limited to this. The threshold voltage Vth (j) of the memory cell storing data "j" may be lower than the threshold voltage Vth (j+1) of the memory cell storing data "j+1".

Note that in this embodiment, the input data signal lines DIN and the output data signal lines DOUT are connected to the column driver circuit 202; however, the present invention is not limited to this. An input/output data signal line DINOUT may alternatively be connected.

Next, a configuration of a semiconductor device to which the above circuit is applied will be described.

Specifically, a circuit configuration which includes eight input/output data signal lines I/O and performs writing or reading 4-bit (16-valued ($2^4$-valued)) data to/from one memory cell is described as an example. Further, an H potential refers to VDD and an L potential refers to GND unless otherwise noted.

FIG. 3A is an example of a block diagram of a semiconductor device. A semiconductor device illustrated in FIG. 3A includes the memory cell array 201 including the plurality of memory cells 170, the column driver circuit 202, the row driver circuit 203, a controller 204, the counter 206, an I/O control circuit 205, and the potential generating circuit 207.

The memory cell array 201 is connected to the column driver circuit 202 controlling the bit lines BL and the source lines SL and the row driver circuit 203 controlling the gate lines GL and the capacitor lines CL. The column driver circuit 202 is connected to the potential generating circuit 207, the counter 206, and the I/O control circuit 205. The row driver circuit 203 is connected to the potential generating circuit 207. The potential generating circuit 207 is connected to the counter 206. These circuits except the memory cell array 201 are connected to the controller 204.

The I/O control circuit 205 is connected to eight input/output data signal lines I/O1 to I/O8, and connected to the column driver circuit 202 through the input data signal lines DIN1 to DIN8 and the output data signal lines DOUT1 to DOUT8. The I/O control circuit 205 is controlled by the controller 204. For example, when an H potential is input to the I/O control circuit 205 through a control line connected to the controller 204, signals of the eight input/output data signal lines I/O1 to I/O8 are input to the I/O control circuit 205. The eight input/output data signal lines I/O1 to I/O8 are electrically connected to the eight input data signal line DIN1 to DIN6, respectively, and output the signals of the eight output data signal lines DOUT1 to DOUT 8 to the column driver circuit 202. In addition, when an L potential is input to the I/O control circuit 205 through the control line connected to the controller 204, signals of the eight output data signal lines DOUT1 to DOUT 8 are input from the column driver circuit 202 to the I/O control circuit 205. The eight output data signal lines DOUT1 to DOUT8 are electrically connected to the eight input/output data signal lines I/O1 to I/O8, respectively, and output the signals of the eight output data signal lines DOUT1 to DOUT 8 to the input/output data signal lines I/O1 to I/O8.

The counter 206 is connected to the column driver circuit 202 and the potential generating circuit 207 through counter signal lines COUNT0 to COUNT3. The counter 206 is controlled by the controller 204 and outputs 4-bit data of the counter signal lines COUNT0 to COUNT3 to each of the column driver circuit 202 and the potential generating circuit 207.

The potential generating circuit 207 is connected to the column driver circuit 202 through analog power supply voltage lines V1 to V16 and a constant power supply line VREAD and connected to the row driver circuit 203 through the variable power supply line VR. The potential generating circuit 207 is controlled by the controller 204. The potential generating circuit 207 outputs a high power supply voltage VH, voltages of the analog power supply voltage lines V1 to V16, and a voltage of the constant power supply line VREAD to the column driver circuit 202. The potential generating circuit 207 outputs a high power supply voltage VH and a voltage of the variable power supply line VR, which varies due to data of the counter signal lines COUNT0 to COUNT3, to the row driver circuit 203. In this embodiment, the relation among the voltages of the analog power supply voltage lines V1 to V16 are V1<V2<V3<V4<V5<V6<V7<V8<V9<V10<V11<V12<V13<V14<V15<V16<VH. The voltage of the analog power supply voltage V1 is GND. The voltage of the variable power supply lines VR becomes higher as data of the counter signal lines COUNT0 to COUNT3 gets smaller. Note that the variable power supply line VR is controlled by the controller 204. The variable power supply line VR outputs voltages corresponding to the data of the counter signal lines COUNT0 to COUNT3 at the time of reading operation. In the other cases, the variable power supply line VR outputs an L potential.

As the memory cell 170 illustrated in FIG. 3B, the memory cell illustrated in FIG. 1A1 can be applied. Alternatively, as the memory cell 170, the memory cell illustrated in FIG. 1B can be applied. As illustrated in FIG. 3C, the capacitor lines CL can be omitted. Further alternatively, as the memory cell 170, the memory cell illustrated in FIG. 1C can be applied.

Next, a configuration of the memory cell array 201 will be described with reference to FIG. 4 and FIG. 5.

An example of the memory cell array 201 is illustrated in FIG. 4. The memory cell array 201 illustrated in FIG. 4 includes the m gate lines GL, the m capacitor lines CL, the n bit lines BL, the (n/8) source lines SL, and the plurality of memory cells 170. Here, the memory cells 170 are arranged in a matrix of m rows (in a vertical direction)×n columns (in a horizontal direction). Here, one source line SL is provided for every eight columns provided with the memory cells 170. Thus, the number of wirings can be small compared to the case where one source line SL is provided in every column. In addition, the space of the memory cell array 201 can be saved. Needless to say, the n source lines SL can be provided in the memory cell array 201 illustrated in FIG. 4.

The n bit lines BL and the (n/8) source lines SL are connected to a bit line and source line driver circuit 221 included in the column driver circuit 202 illustrated in FIG. 3A. The m gate lines GL and the m capacitor lines CL are connected to a gate line and capacitor line driver circuit 231 included in the row driver circuit 203 illustrated in FIG. 3A.

Another example of the memory cell array 201 is illustrated in FIG. 5. The memory cell array 201 illustrated in FIG. 5 includes a select line G (1), the m gate lines GL, the m capacitor lines CL, the n bit lines BL, the source lines SL, and the plurality of memory cells 170. Here, the memory cells 170 are arranged in matrix of m rows (in a vertical direction)×n columns (in a horizontal direction).

The n bit lines BL and the source line SL are connected to the bit line and source line driver circuit 221 included in the column driver circuit 202 illustrated in FIG. 3A. The select line G (1), the m gate lines GL, and the m capacitor lines CL are connected to the gate line and capacitor line driver circuit 231 included in the row driver circuit 203 illustrated in FIG. 3A.

Next, a configuration of the column driver circuit 202 connected to the memory cell array 201 will be described with reference to FIG. 6.

Figure 6:
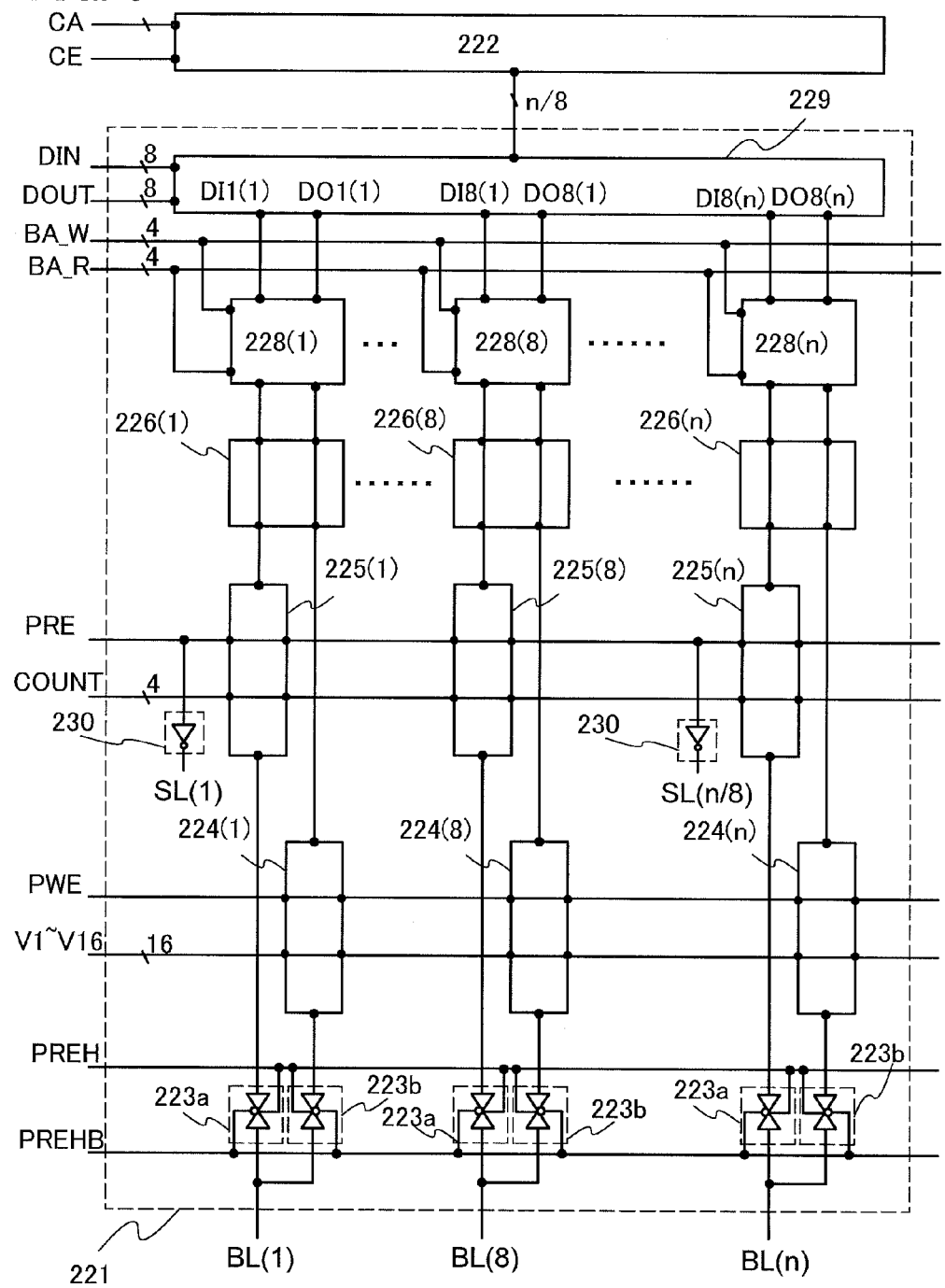
FIG. 6 is a block diagram of a semiconductor device.

In FIG. 6, the column driver circuit 202 includes the bit line and source line driver circuit 221 and a column decoder 222. The bit line and source line driver circuit 221 includes a selector 229. In the bit line and source line driver circuit 221, a selector 228, the latch group 226 (also referred to as a latch portion), the writing circuit 224, the reading circuit 225, and analog switches 223a and 223b are included in each column of the memory cell. A buffer 230 is provided for every eight columns provided with memory cells. A memory reading signal line PRE is connected to source lines SL through the buffers 230.

The column decoder 222 is connected to the selector 229. The selector 229 is connected to the selectors 228. The selectors 228 are connected to the latch groups 226. The latch groups 226 are connected to the respective reading circuits 225 and the respective writing circuits 224. For example, the reading circuit 225 (1) in the first column is connected to the bit line BL (1) through the analog switch 223a; the writing circuit 224 (1) in the first column is connected to the bit line BL (1) through the analog switch 223b. The reading circuit 225 (n) in the n-th column is connected to the bit line BL (n) through the analog switch 223a; the writing circuit 224 (n) in the n-th column is connected to the bit line BL (n) through the analog switch 223b.

To the column decoder 222, the Nc($2^{Nc} \times 2^3 = n$) column address signal lines CA and the control line CE are connected. The column decoder 222 is connected to the selector 229 through (n/8) column decode signal lines. Data of the Nc ($2^{Nc} \times 2^3 = n$) column address signal lines CA and the control signal CE are input to the column decoder 222 and the column decoder 222 outputs data to the (n/8) column decode signal lines. When the control line CE is set at an H potential, data of only one of the (n/8) column decode signal lines is set at an H potential in response to data of the Nc ($2^{Nc} \times 2^3 = n$) column address signal lines CA. When the control line CE is set at an L potential, data of all of the column decode signal lines are set at an L potential regardless of the data of the Nc ($2^{Nc} \times 2^3 = n$) column address signal lines CA The (n/8) column decode signal lines, the input data signal lines DIN1 to DIN8, the output data signal lines DOUT1 to DOUT8, input select signal lines DR (1) to DI8 (n), and output select signal lines DO1 (1) to DO8 (n) are connected to the selector 229. The input data signal lines DIN1 to DIN8 and eight lines of the input select signal lines DI1 (1) to DI8 (n) are brought into conduction by data of the (n/8) column decode signal lines. In the same manner, the output data signal lines DOUT1 to DOUT8 and eight lines of the output select signal lines DO1 (1) to DO8 (n) are brought into conduction. For example, when the potential of the fifth column decode signal line is set at an H potential, the input data signal lines DIN1 to DIN8 and the input select signal lines DI1 (5) to DI8 (5) are brought into conduction, and the output data signal lines DOUT1 to DOUT8 and the output select signal lines DO1 (5) to DO8 (5) are brought into conduction. In this case, the other input select signal lines and the other output select signal lines are placed in a floating state with respect to the input data signal lines DIN1 to DIN8 and the output data signal lines DOUT1 to DOUT8. When the potentials of all of the column decode signal lines are set at an L potential, all of the input select signal lines DI1 (1) to DI8 (n) and output select signal lines DO1 (1) to DO8 (n) are placed in a floating state with respect to the input data signal lines DIN1 to DIN8 and the output data signal lines DOUT1 to DOUT8.

Figure 7:
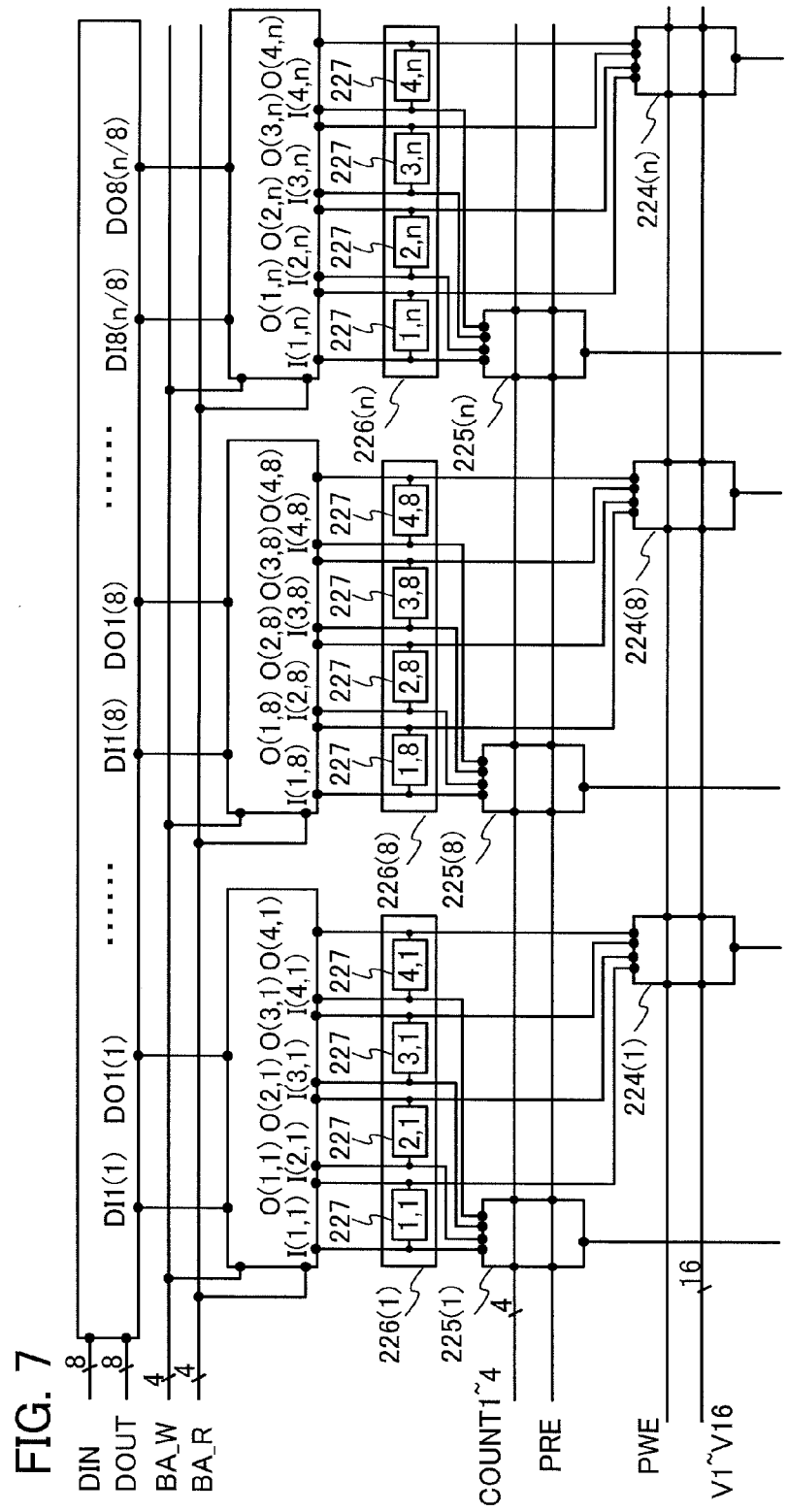
FIG. 7 is a circuit diagram of a semiconductor device.

Specific configurations of the selectors 228 and the latch groups 226 will be described with reference to FIG. 7.

The selector 228 (1) is connected to the input select signal line DI1 (1), the output select signal line DO1 (1), writing address signal lines BA_W1 to BA_W4, reading address signal lines BA_R1 to BA_R4, latch input signal lines I (1, 1) to I (4, 1), and latch output signal lines O (1, 1) to O (4, 1). In the same manner, the selector 228 (8) is connected to the input select signal line DI8 (1), the output select signal line DO8 (1), the writing address signal lines BA_W1 to BA_W4, the reading address signal lines BA_R1 to BA_R4, latch input signal lines I (1, 8) to I (4, 8), and latch output signal lines O (1, 8) to O (4, 8). Moreover, the selector 228 (n) is connected to the input select signal line DI8 (n/8), the output select signal line DO8 (n/8), the writing address signal lines BA_W1 to BA_W4, the reading address signal lines BA_R1 to BA_R4, latch input signal lines I (1, n) to I (4, n), and latch output signal lines O (1, n) to O (4, n).

The writing address signal lines $BA\_W_1$ to BA_W4 correspond to the latch input signal lines I (1, 1) to I (4, n) in the selector 228 (1) to 228 (n). When data of the writing address signal line BA_W1 is set at an H potential, the latch input signal line I (1, 1) in the selector 228 (1), the latch input signal line I (1, 8) in the selector 228 (8), and the latch input signal line I (1, n) in the selector 228 (n) are electrically connected to the input select signal line DI1 (1), the input select signal line DI8 (1), and the input select signal line DI8 (n/8), respectively. The reading address signal lines BA_R1 to BA_R4 correspond to the latch output signal lines O (1, 1) to O (4, n) in the selector 228 (1) to (n). When data of the reading address signal line BA_R1 is set at an H potential, the latch output signal line O (1, 1) in the selector 228 (1), the latch output signal line O (1, 8) in the selector 228 (8), and the latch output signal line O (1, n) in the selector 228 (n) are electrically connected to the output select signal line DO1 (1), the output select signal line DO8 (1), and the output select signal line DO8 (n/8), respectively. Data of only one of the writing address signal lines BA_W1 to BA_W4 and the reading address signal lines BA_R1 to BA_R4 is set to an H potential and a plurality of the writing address signal lines and reading address signal lines are not set at an H potential at the same time whatever the combination thereof is. When data of all of the writing address signal lines BA_W1 to BA_W4 and the reading address signal lines BA_R1 to BA_R4 are set at an L potential, the latch input signal lines I (1, 1) to I (4, n) and the latch output signal lines O (1, 1) to O (4, n) in the selectors 228 (1) to 228 (n) are placed in a floating state with respect to the input select signal lines DI1 (1) to DI8 (n/8) and the output select signal lines DO1 (1) to DO (n/8).

The number of the latch groups 226 is equivalent to the number of the columns of the memory cell. The latch group 226 (1) includes four latches 227 (1, 1) to 227 (4, 1). The latches 227 (1, 1) to 227 (4, 1) are connected to the latch input signal lines I (1, 1) to I (4, 1) respectively, and connected to the latch output signal lines O (1, 1) to O (4, 1) respectively. For example, the latch input signal line I (1, 1) and the latch output signal line O (1, 1) are connected to the latch 227 (1, 1); the latch input signal line I (4, 1) and the latch output signal line O (4, 1) are connected to the latch 227 (4, 1).

In the same manner, the latch group 226 (8) includes four latches 227 (1, 8) to 227 (4, 8). Moreover, the latch group 226 (n) includes four latches 227 (1, n) to 227 (4, n).

When the latch input signal lines I (1, 1) to I (4, n) are electrically connected to the input data signal lines DIN1 to DIN8 by data of the writing address signal lines $BA\_W_1$ to BA_W4 and data of the column decode signal line, the latches 227 (1, 1) to 227 (4, n) store data of the input data signal lines DIN1 to DIN8. When the latch input signal lines I (1, 1) to I (4, n) are placed in a floating state with respect to the input data signal lines DIN1 to DIN8, the latches 227 (1, 1) to 227 (4, n) hold the data which have been stored in the latches 227 (1, 1) to 227 (4, n) until just before then. The latch output signal lines O (1, 1) to O (4, n) output the data held in the latches 227 (1, 1) to 227 (4, n) by the latch input signal lines I (1, 1) to I (4, n).

Specifically, when the x-th (x is an integer of 1 to n/8) column decode signal line is set at an H potential and the writing address signal line BA_W2 is set at an H potential, the input data signal lines DIN1 to DIN8 are electrically connected to the latch select signal lines DI1 (x) to DI8 (x) and the latch input signal lines I (2, 8x-7) to I (2, 8x) in the selectors 228 (8x-7) to 228 (8x), whereby data of the input data signal lines DIN1 to DIN8 are stored in the latches 227 (2, 8x-7) to 227 (2, 8x) in the latch groups 226 (8x-7) to 226 (8x).

The latch output signal lines O (1, 1) to O (4, 1), a memory writing control signal line PWE, and the analog power supply voltage lines V1 to V16 are connected to the writing circuit 224 (1). The writing circuit 224 (1) is connected to the bit line BL (1) through the analog switch 223b.

Figure 8:
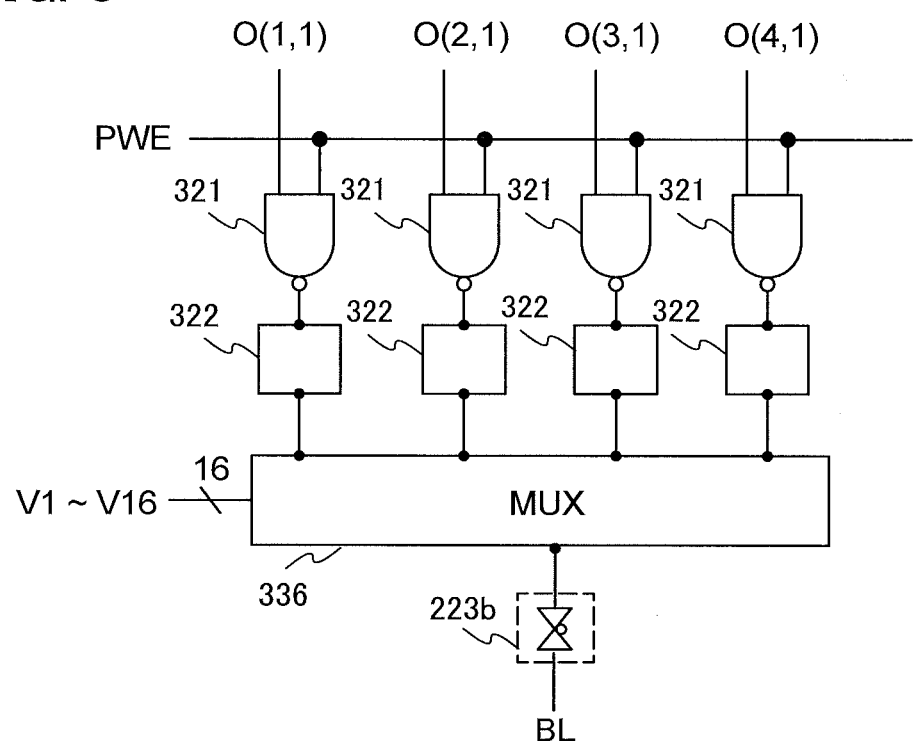
FIG. 8 is a circuit diagram of a semiconductor device.

An example of the writing circuit is illustrated in FIG. 8. A writing circuit illustrated in FIG. 8 includes NAND circuits 321, level shifters 322, and a 4-bit multiplexer 336. The four NAND circuits 321 and the four level shifters 322 are provided in each column. The memory writing control signal line PWE is connected to an input of each of the NAND circuits 321 and latch output signal lines O (1, 1) to O (4, 1) of the latch 227 are connected to the input of the NAND circuits 321. The level shifters 322 are connected to respective outputs of the NAND circuits 321. Further, the level shifters 322 are connected to the 4-bit multiplexer 336. The 4-bit multiplexer 336 is connected to a bit line BL through the analog switch 223b.

In the writing circuit illustrated in FIG. 8, when data of the memory writing control signal line PWE is set at an L potential, the voltage of the analog power supply voltage line V1 is output from the 4-bit multiplexer 336 regardless of data of the latch output signal lines O (1, 1) to O (4, 1). When data of the memory writing control signal line PWE is set at an H potential, a voltage output from the 4-bit multiplexer 336 in response to data of the latch output signal lines O (1, 1) to O (4, 1) is switched. In this embodiment, in the case where data of the memory writing control signal line PWE is set at an H potential, the following voltage is output from the 4-bit multiplexer 336: V1 when the data of the latch output signal lines O (1, 1) to O (4, 1) is "0 h"; V2, "1 h"; V3, "2 h"; V4, "3 h"; V5, "4 h"; V6, "5 h"; V7, "6 h"; V8, "7 h"; V9, "8 h"; V10, "9 h"; V11, "Ah"; V12, "Bh"; V13, "Ch"; V14, "Dh"; V15, "Eh"; and V16, "Fh".

An example of the reading circuit is illustrated in FIG. 9A. A reading circuit illustrated in FIG. 9A includes a load 323, a sense amplifier 324, and a NAND circuit 325. The sense amplifier 324 is connected to one of inputs of the NAND circuit 325 and the memory reading signal line PRE is connected to the other of the inputs of the NAND circuit 325. The sense amplifier 324 is connected to the load 323 and the sense amplifier 324 is connected to the bit line BL through the analog switch 223a. The latch input signal lines I (1, 1) to I (4, 1) and the counter signal lines COUNT0 to COUNT3 are connected to an output of the NAND circuit 325. Note that the case where the reading circuit illustrated in FIG. 9A is connected to memory cells in the first column is described.

Specific examples of the load 323 are illustrated in FIGS. 9B1 to 9B5. The constant power supply line VREAD may be connected to a gate terminal of an n-channel transistor as illustrated in FIG. 9B1. The load 323 may be a resistor as illustrated in FIG. 9B2. The constant power supply line VREAD may be connected to a gate terminal of a p-channel transistor as illustrated in FIG. 9B3. The load 323 comprises a gate terminal of an n-channel transistor, the gate terminal of the n-channel transistor being connected to one of a source terminal and a drain terminal of an n-channel transistor as illustrated in FIG. 9B4. The load 323 comprises a gate terminal of a p-channel transistor, the gate terminal of the p-channel transistor being connected to one of a source terminal and a drain terminal of the p-channel transistor as illustrated in FIG. 9B5.

In the reading circuit illustrated in FIG. 9A, the voltage of the bit line BL generated by resistance division of the load 323 and the p-channel transistor is determined by the sense amplifier 324. When data of the memory reading signal line PRE is set at an H potential, the counter signal lines COUNT0 to COUNT3 and the latch input signal lines I (1, 1) to I (4, 1) are brought into conduction or are placed in a floating state by an output of the sense amplifier 324. When data of the memory reading signal line PRE is set at an L potential, the latch input signal lines I (1, 1) to I (4, 1) are placed in a floating state with respect to the counter signal lines COUNT0 to COUNT3 regardless of the output of the sense amplifier 324.

As illustrated in FIG. 6, the analog switch 223a connects the reading circuit 225 to the memory cell and the analog switch 223b connects the writing circuit 224 to the memory cell. The analog switches 223a and 223b are connected to a high potential memory reading control signal line PREH and an inverted high potential memory reading control signal line PREHB. The analog switches 223a and 223b are controlled by the high potential memory reading control signal line PREH and the inverted high potential memory reading control signal line PREHB. Data of the high potential memory reading control signal line PREH is a signal obtained by setting the H potential of data of the memory reading control signal line PRE to a voltage VH. Data of the inverted high potential memory reading control signal line PREHB is an inverted signal of data of the high potential memory reading control signal line PREH. When data of the high potential memory reading control signal line PREH is set at a voltage VH and data of the inverted high potential memory reading control signal line PREHB is set at an L potential, the bit line BL is connected to the reading circuit 225. When data of the high potential memory reading control signal PREH is set at an L potential and data of the inverted high potential memory reading control signal PREHB is set at a voltage VH, the bit line BL is connected to the writing circuit 224.

The memory reading signal PRE and the source lines SL (1) to SL (n/8) are connected to the buffers 230 illustrated in FIG. 6. All of the source lines SL (1) to SL (n/8) each output a signal which is similar to that of the memory reading signal line PRE.

Next, the row driver circuit 203 connected to the memory cell array 201 will be described with reference to FIG. 10.

Figure 10:
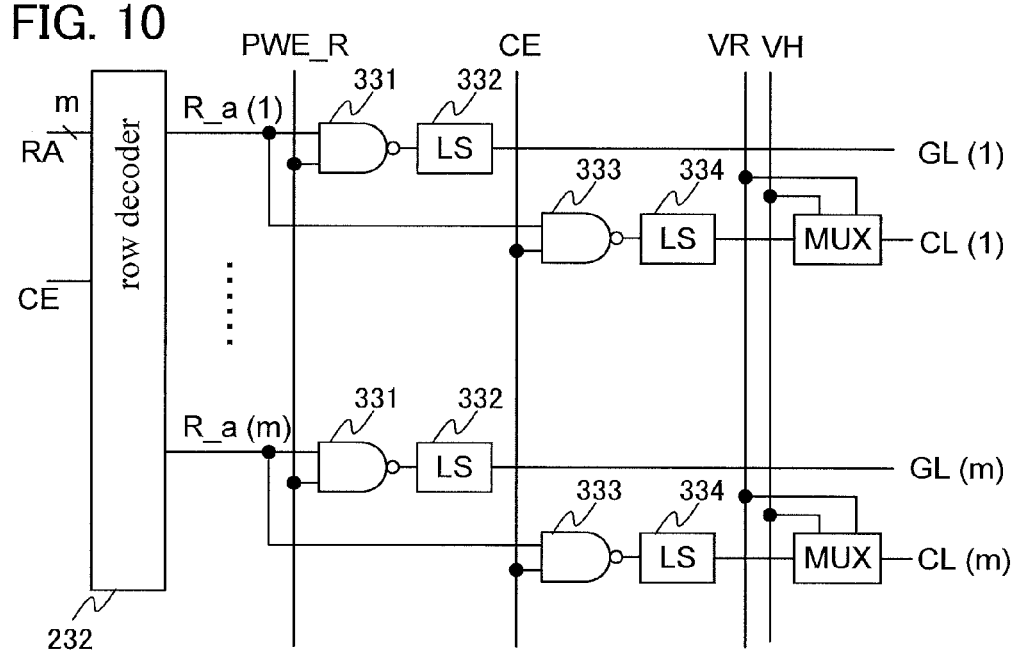
FIG. 10 is a circuit diagram of a semiconductor device.

In FIG. 10, the row driver circuit 203 includes a row decoder 232. In the row driver circuit 203, a NAND circuit 331, a NAND circuit 333, a level shifter 332, a level shifter 334, and the multiplexer MUX are included in each row of the memory cell. The Mr ($2^{Mr}$ is m) row address lines RA, the control line CE, column decode signal lines R_a (1) to R_a (m) are connected to the row decoder 232. The column decode signal line R_a (1) is connected to one of inputs of the NAND circuit 331 and a row memory writing control signal line PWE_R is connected to the other of the inputs. The level shifter 332 is connected to an output of the NAND circuit 331. The level shifter 332 is connected to the gate lines GL of the memory cell. The column decoder line R_a (1) is connected to one of inputs of the NAND circuit 333 and the control line CE is connected to the other of the inputs. The level shifter 334 is connected to an output of the NAND circuit 333. The multiplexer MUX is connected to the level shifter 334, the variable power supply line VR, a voltage line VH, and the capacitor lines CL.

In the row decoder 232, when data of the control line CE is set at an H potential, data of only one row decode line selected from the m row decode lines R_a (1) to R_a (m) in response to data of the row address signal line RA is set at an H potential. When data of the control line CE is set at an L potential, data of all of the row decode lines are set at an L potential regardless of data of the row address signal line RA.

Data of the row memory writing control signal line PWE_R is set at an H potential, whereby data of the gate line GL in the memory cells corresponding to the selected row decode line is set at a voltage VH. Data of the gate line GL in the other memory cells are set at an L potential. As data of the capacitor lines CL in the memory cells corresponding to the selected row decode line, the potential of the data of the variable power supply line VR is output from the multiplexer MUX. For data of the capacitor lines CL in the other memory cells, a voltage VH is output from the multiplexer MUX.

Data of the row memory writing control signal line PWE_R is set at an L potential, whereby data of the gate line GL in all of the memory cells are set at an L potential. As data of the capacitor lines CL in the memory cells corresponding to the selected row decode line, the potential of the data of the variable power supply line VR is output from the multiplexer MUX. For data of the capacitor lines CL in the other memory cells, a voltage VH is output from the multiplexer MUX.

Figure 11:
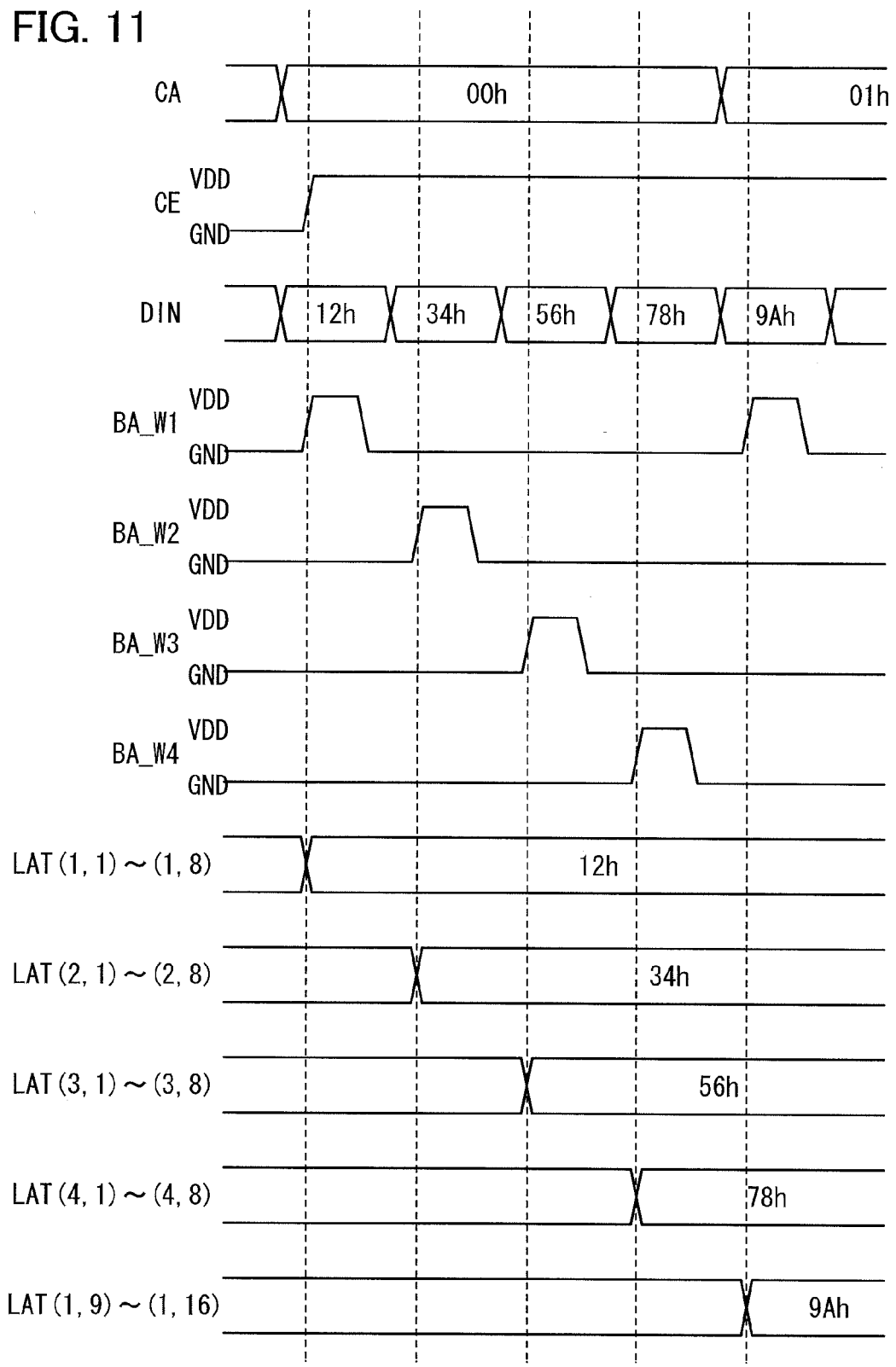
FIG. 11 is a timing chart.
Figure 12:
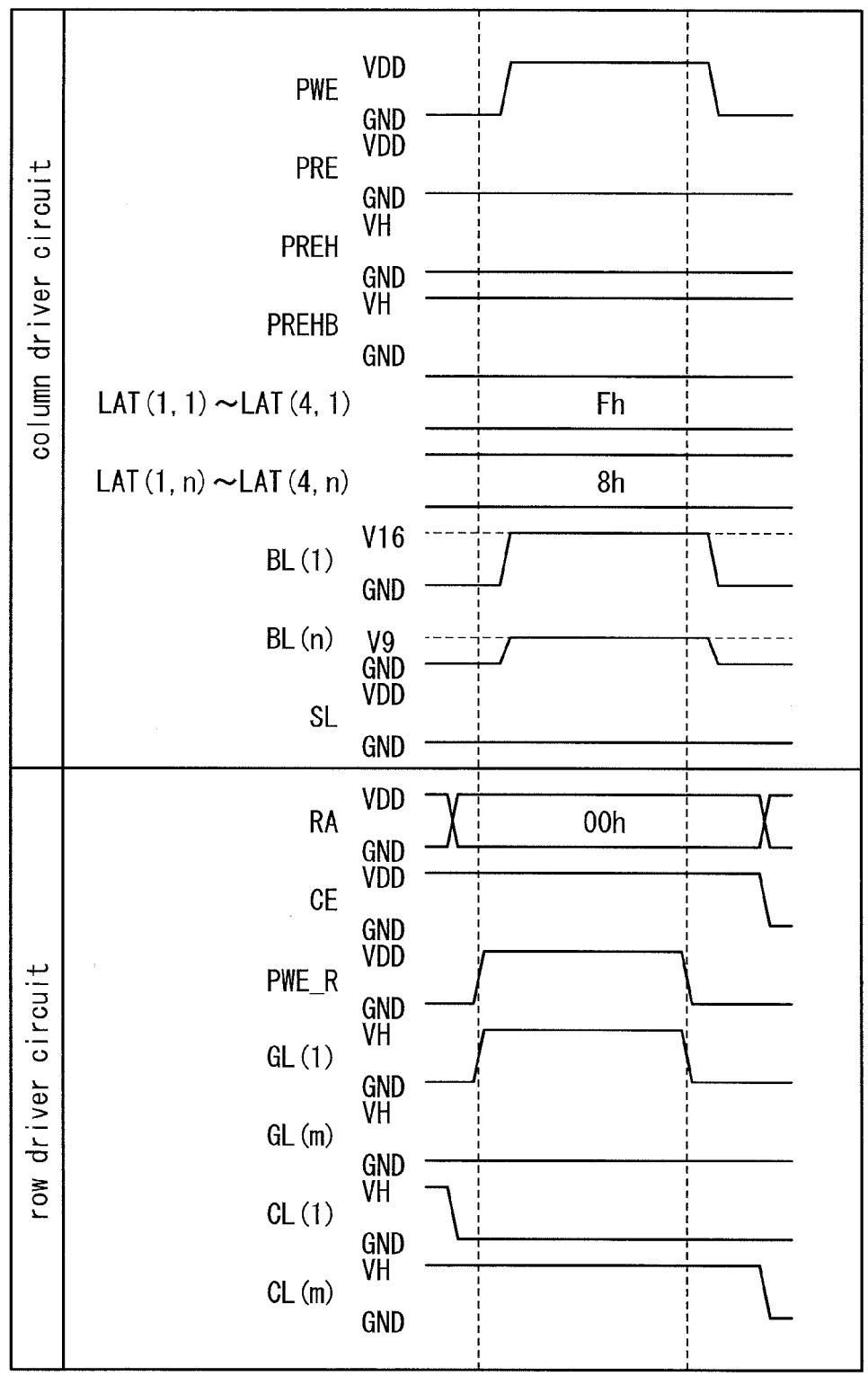
FIG. 12 is a timing chart.
Figure 13:
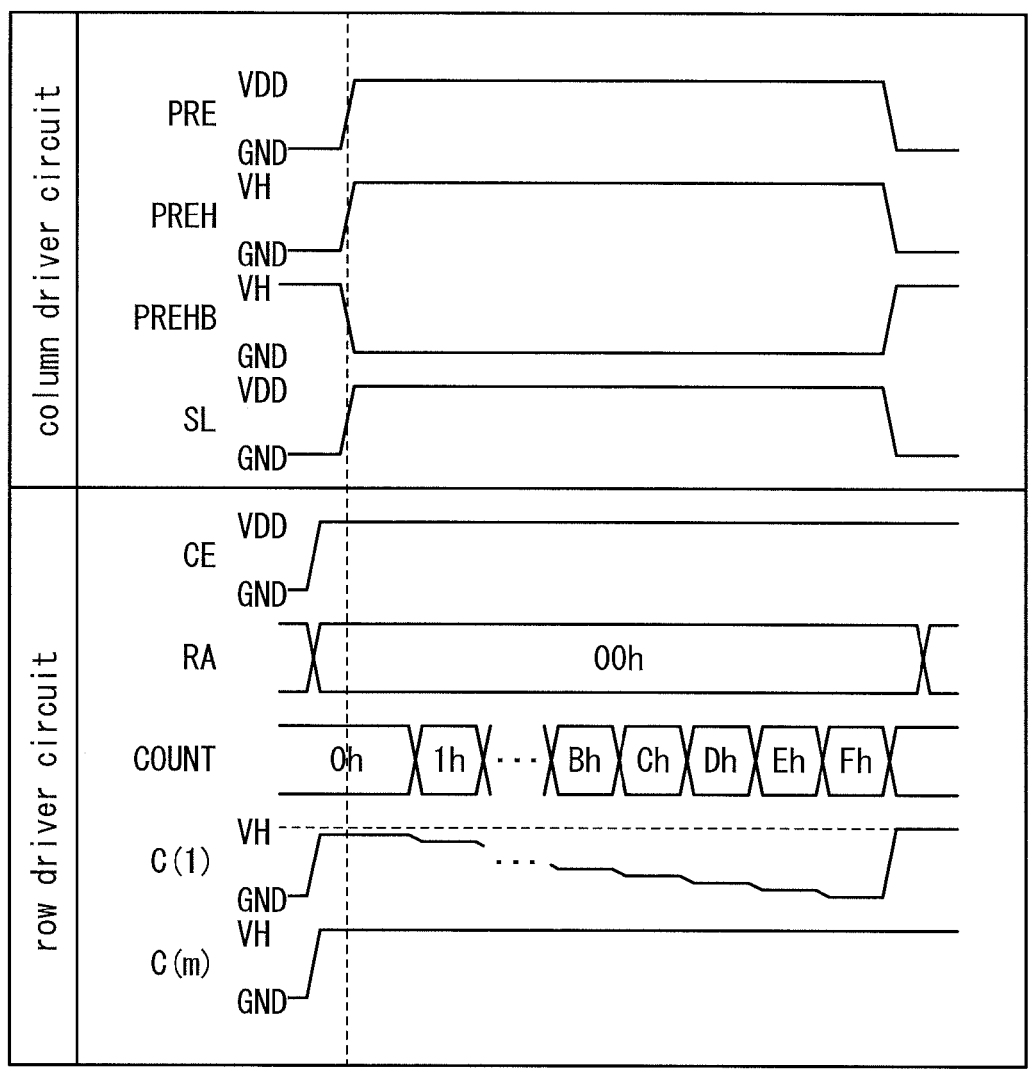
FIG. 13 is a timing chart.

Timing charts according to one embodiment of the present invention are shown in FIG. 11 to FIG. 16. FIG. 11 shows the timing of storing data from the input data signal lines DIN1 to DIN8 in n latch groups. FIG. 12 shows the timing of writing data stored in the n latch groups to memory cells. FIG. 13 shows the timing of reading data from the memory cells and storing the data to the n latch groups. FIG. 16 shows the timing of outputting data stored in the n latch groups to the output data signal lines DOUT1 to DOUT8.

FIG. 11 shows the timing of storing data from the input data signal lines DIN1 to DIN8 in latch groups. First, data of the column address signal lines CA and data of the input data signal lines DIN1 to DIN8 are determined and data of the control line CE is set to an H potential. Thus, one column decode signal line is selected. Description will be made with the premise of writing data of the column address lines CA in order from "00 h" in FIG. 11.

Next, data of the writing address signal line BAW1 is set to an H potential, whereby inputs of latches (1, 1) to (1, 8) are electrically connected to the input data signal lines DIN1 to DIN8 and data of the input data signal lines DINT to DIN8 are written. When data are written to the latches (1, 1) to (1, 8), the data are stored by setting data of the writing address signal line BA_W1 to an L potential.

Next, the data of the input data signal lines DIN1 to DIN8 are changed. Then, the data of the writing address signal line BA_W2 is set to an H potential, the data of the input data signal lines DIN1 to DIN8 are written to latches (2, 1) to (2, 8). When data are written to the latches (2, 1) to (2, 8), the data are stored by setting data of the writing address signal line BA_W2 to an L potential. In the same manner, this operation is performed on writing address signal lines BA_W3 and BA_W4.

In this operation, it is necessary to change values of data of the column address lines CA and data of the input data signal lines DIN1 to DIN8 while data of all of the writing address signal lines BA_W1 to BA_W4 are set at an L potential in order to prevent miswriting. The series of operations are continued until all of the combination of data of the column address lines CA and the writing address signal lines BA_W1 to BA_W4 are selected and the data of the input signal lines DINT to DIN8 are stored in all of the latch groups.

The data stored in the latch groups are written to the memory cells after the data of the input signal lines DIN1 to DIN8 are stored in all of the latch groups. The timing of writing data stored in the latch groups to the memory cells is shown in FIG. 12.

First, data of the row address signal lines RA is determined in a row driver circuit. Since data of the control line CE is set at the H potential at the time when the data is stored in the latch groups, one row decode signal is selected at the time of determining data of the row address signal lines RA. In this embodiment, the case where data of the row address signal lines RA is "00 h" is described. Data of the capacitor line CL (1) corresponding to the selected row decode signal line is set at an L potential, and data of the capacitor lines CL in the other rows are set at a potential VH.

Next, data of the row memory writing control signal line PWE_R is set at an H potential and data of the gate line GL (1) corresponding to the selected row decode signal line is set at a potential VH.

Then, data of the memory writing control signal line PWE is set at an H potential in the column driver circuit 202. Data of the memory writing control signal line PWE is set at the H potential, whereby voltages of the analog power supply voltage lines V1 to V16 corresponding to data stored in the latch groups from the writing circuit of the column driver circuit 202 are output. At this time, the analog switches in the column driver circuit 202 are connected to an output of each of the writing circuits and the bit lines BL (1) to BL (n) by the high potential memory reading control signal line PREH and the inverted high potential memory reading control signal line PREM. Consequently, the voltages of the analog power supply voltage lines V1 to V16 are output to the bit lines BL (1) to BL (n). In this embodiment, when data stored in the latch group is "0 h", it corresponds to a voltage of V1; "1 h", V2; "2 h", V3; "3 h", V4; "4 h", V5; "5 h", V6; "6 h", V7; "7 h", V8; "8 h", V9; "9 h", V10; "Ah", V11; "Bh", V12; "Ch", V13; "Dh", V14; "Eh", V15; and "Fh", V16.

At this time, in the row driver circuit, voltages of the voltage V1 to V16 output from each of the bit lines BL (1) to BL (n) are written to the floating gate portion FG of the memory cell to which the gate line GL (1) is connected.

Next, data of the row memory writing control signal line PWE_R is set at an L potential and data of the gate line GL (1) is set at an L potential. At this time, data of the memory cell to which the gate line GL (1) is connected is held.

Then, in the column driver circuit, data of the memory writing control signal line PWE is set at an L potential and a voltage of the analog power supply voltage line V1 (GND in FIG. 12) is output to the bit lines BL (1) to BL (n). Finally, data of the control line CE is set at an L potential in the row driver circuit, whereby data of the capacitor lines CL (1) to CL (m) are set at an L potential. Through the above-described steps, writing operation to memory cells is finished.

The timing of reading data from memory cells and storing data in latch groups is shown in FIG. 13.

First, in the row driver circuit, data of row address lines RA is determined and data of the control line CE is set at an H potential, whereby the row of the memory cell to be read is selected. In this embodiment, description will be made with the premise of the data of the row address lines RA being "00 h". At this time, a voltage of the variable voltage line VR supplied from the potential generating circuit is output to data of the selected capacitor line CL (1). The voltage of the variable voltage line VR varies in response to data of the counter signal lines COUNT0 to COUNT3. In this case, the voltage of the variable voltage line VR becomes high as data of the counter signal line COUNT0 to COUNT3 get smaller. An H potential is supplied to data of the other capacitor lines CL.

Next, in the column driver circuit, data of the memory reading control signal line PRE is set to an H potential. At this time, data of the high potential memory reading control signal line PREH is a signal of the same timing as the data of the memory reading control signal line PRE. The H potential of data of the high potential memory reading control signal line PREH is higher than that of data of the memory reading control signal line PRE. Data of the inverted high potential memory reading control signal line PREHB is an inverted signal of data of the high potential memory reading control signal line PREH. Data of the source lines SL is a signal of the memory reading control signal line PRE obtained through the buffer 230.

The bit lines BL (1) to BL (n) are electrically connected to the reading circuit by the high potential memory reading control signal line PREH and the inverted high potential memory reading control signal line PREHB. Thus, potentials of the bit lines BL (1) to BL (n) are determined by resistance division of the load of the reading circuit and the p-channel transistor in the memory cell.

Next, "0 h" to "Fh" are counted with data of the counter signal line COUNT0 to COUNT3. The capacitor line CL (1) outputs a voltage of the variable voltage line VR which varies in response to data of the counter signal lines COUNT0 to COUNT3. As values of the counter signal line COUNT0 to COUNT3 become higher, the voltage of the variable voltage line VR gets lower as illustrated in FIG. 13.

Figure 14:
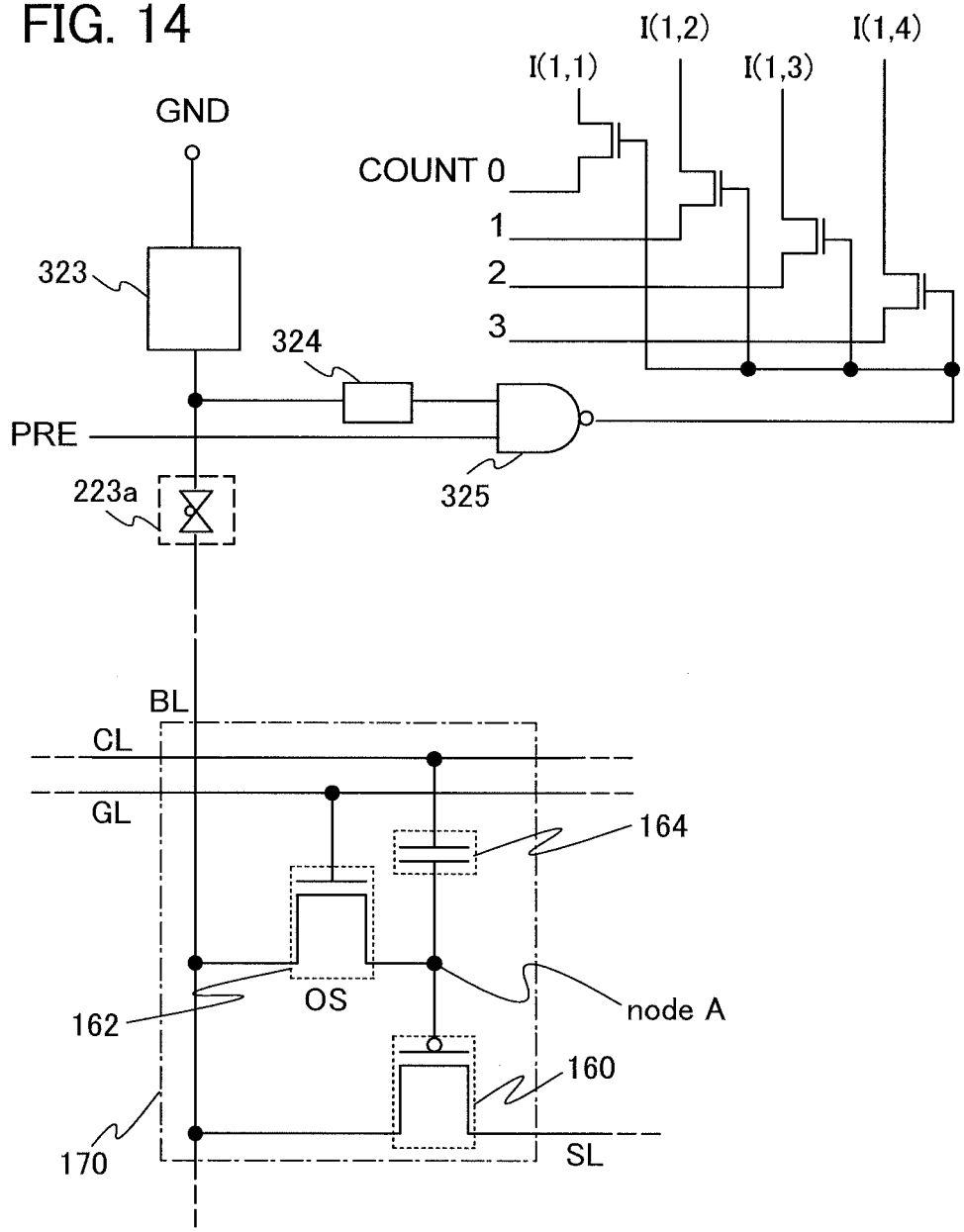
FIG. 14 is a circuit diagram of a semiconductor device.
Figure 15:
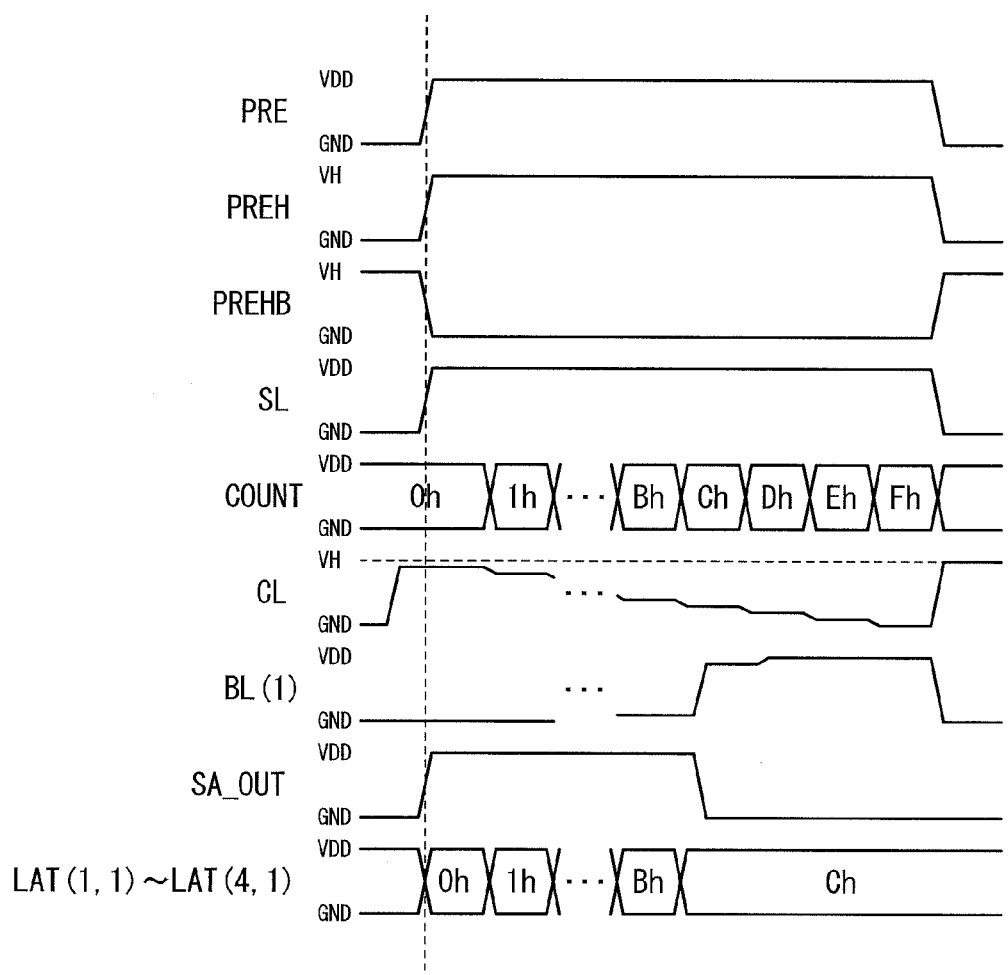
FIG. 15 is a timing chart.

FIG. 14 and FIG. 15 are shown as more specific descriptions of the reading operation. FIG. 14 illustrates a reading circuit and a memory cell. FIG. 15 shows a timing chart of FIG. 14.

In FIG. 15, the potential of the floating gate portion FG varies by capacitive coupling when the potential of the capacitor line CL (1) varies. The resistance value between a source and a drain of a p-channel transistor varies by the potential of the floating gate portion FG and the potential of a bit line BL varies by resistance division of the load 323 of the reading circuit and the p-channel transistor.

The resistance value of the p-channel transistor 160 in the memory cell 170 varies and the potentials of the bit lines BL (1) to BL (n) exceed a certain value, whereby an output of the sense amplifier 324 in the reading circuit is switched from an H potential to an L potential. Thus, an output of SA_OUT is similarly switched from an H potential to an L potential as illustrated in FIG. 15, so that values of the counter signal lines COUNT0 to COUNT3 stored in the latch group in the column driver circuit are determined.

The relation between the bit lines BL (1) to BL (n) and the capacitor line CL (1) varies depending on data stored in, that is, a voltage held in the floating gate portion FG of each memory cell. Therefore, data of the counter signal lines COUNT0 to COUNT3, the potential of the capacitor line CL (1), and the potentials of the bit lines BL (1) to BL (n) vary corresponding to the potential of the floating gate portion FG in the memory cells, whereby reading of a multi-valued memory can be realized.

The timing of outputting data stored in latch groups to the output data signal lines DOUT1 to DOUT8 is shown in FIG. 16.

Data of the column address line CA is set to "00 h". Data of the control line CE is kept at an H potential since data is stored in the latch groups, so that one column decode signal line is selected. Next, data of the reading address signal line BA_R1 is set at an H potential. Thus, data stored in latches (1, 1) to (1, 8) are output to the output data signal lines DOUT1 to DOUT8 through latch output signal lines.

Next, data of the reading address signal line BA_R2 is set at an H potential after the reading address signal line BA_R2 is set at an H potential, whereby data stored in latches (2, 1) to (2, 8) are output to the output data signal lines DOUT1 to DOUT8 through latch output signal lines. In the same manner, this operation is performed on the reading address signal line BA_R3 and the reading address signal line BA_R4.

Data of all of the reading address signal lines BA_R1 to BA_R4 are set at an L potential when changing data of the column address lines CA. Data of the reading address signal lines BA_R1 to BA_R4 are controlled in order when reading data stored in the latch groups.

As described above, a $2^4$-valued memory includes a 4-bit latch portion and a 4-bit multiplexer in each column, and one potential is selected from potentials V (1) to V ($2^4$) and output in the 4-bit multiplexer; thus, a multi-valued data can be written to memory cells in one row at one time and at high speed, resulting in shortening of writing time.

Further, the $2^4$-valued memory includes a 4-bit counter and an output of the 4-bit counter is connected to an input terminal of the 4-bit latch portion in each column; thus, the size of a reading circuit can be small, so that space of a peripheral circuit of the memory can be saved.

In this embodiment, a circuit configuration in which 4-bit (16-valued ($2^4$-valued)) data is written or read to/from one memory cell is described as an example; however, one embodiment of the present invention can be applied to a circuit configuration in which K-bit ($2^K$-valued) data is written or read to/from one memory cell. Note that a circuit configuration in which 2-valued data is written or read can be applied.

A $2^K$-valued memory includes a K-bit latch portion and a K-bit multiplexer in each column, and one potential is selected from potentials V (1) to V ($2^K$) and output in the K-bit multiplexer; thus, a multi-valued data can be written to memory cells in one row at one time and at high speed, resulting in shortening of writing time.

Further, the $2^K$-valued memory includes a K-bit counter and an output of the K-bit counter is connected to an input terminal of the K-bit latch portion in each column; thus, the size of a reading circuit can be small, so that space of a peripheral circuit of the memory can be saved.

The structures, method, and the like described in this embodiment can be combined as appropriate with any of the structures, methods, and the like described in the other embodiments.

(Embodiment 2)

In this embodiment, a structure of a semiconductor device and a method for manufacturing the semiconductor device according to one embodiment of the disclosed invention will be described with reference to FIGS. 17A and 17B, FIGS. 18A to 18G, FIGS. 19A to 19E, FIGS. 20A to 20D, FIGS. 21A to 21D, and FIGS. 22A to 22C.

<Cross-sectional Structure and Planar Structure of Semiconductor Device>

Figure 17A:
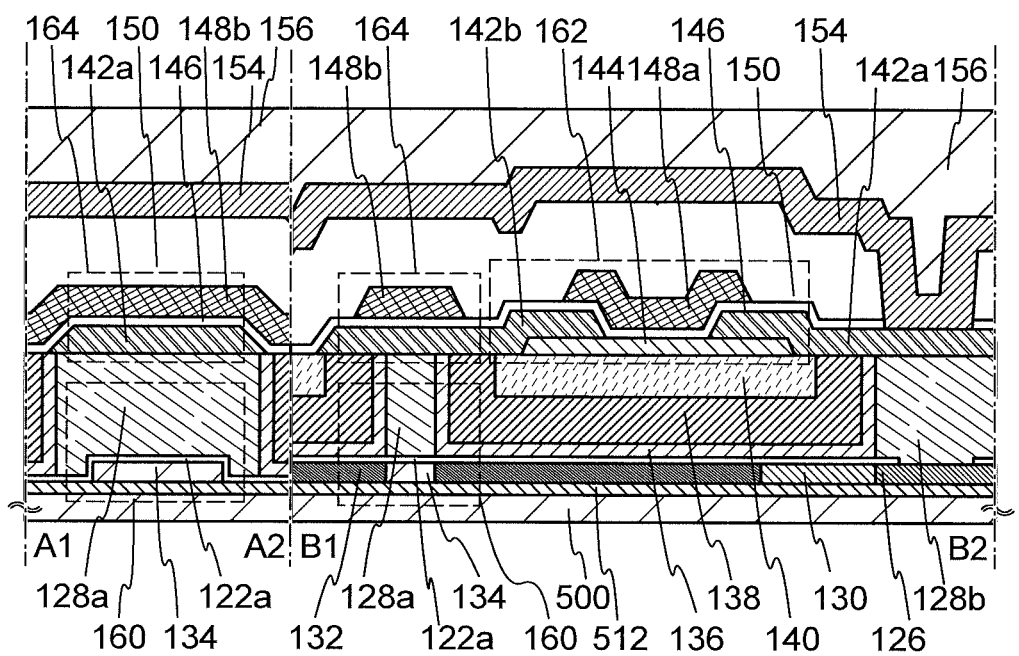
FIG. 17A is a cross-sectional view and FIG. 17B is a plan view of a semiconductor device.
Figure 17B:
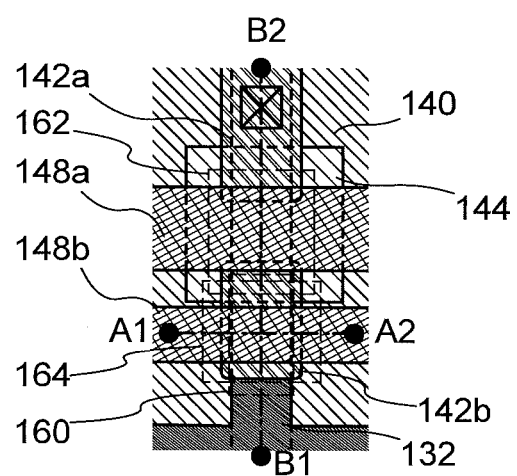

FIGS. 17A and 17B illustrate an example of a structure of a semiconductor device. FIG. 17A illustrates a cross section of the semiconductor device, and FIG. 17B illustrates a plan view of the semiconductor device. Here, FIG. 17A corresponds to the cross section along lines A1-A2 and B1-B2 in FIG. 17B. The semiconductor device illustrated in FIGS. 17A and 17B includes a transistor 160 including a first semiconductor material in a lower portion, and a transistor 162 including a second semiconductor material in an upper portion. Here, the first semiconductor material is preferably different from the second semiconductor material. For example, a semiconductor material except an oxide semiconductor can be used as the first semiconductor material, and an oxide semiconductor can be used as the second semiconductor material. The semiconductor material except an oxide semiconductor can be, for example, silicon, germanium, silicon germanium, silicon carbide, gallium arsenide, or the like and is preferably single crystalline. Alternatively, an organic semiconductor material or the like may be used. A transistor including such a semiconductor material can operate at high speed easily. On the other hand, a transistor including an oxide semiconductor can hold charge for a long time owing to its characteristics. The semiconductor device in FIGS. 17A and 17B can be used as a memory cell.

Note that the technical feature of the disclosed invention is to use a semiconductor material with which off-state current can be sufficiently reduced, such as an oxide semiconductor, in the transistor 162 in order to hold data. Therefore, it is not necessary to limit specific conditions such as a material, a structure, and the like of the semiconductor device to those described here.

The transistor 160 in FIGS. 17A and 17B includes a channel formation region 134 provided in a semiconductor layer over a semiconductor substrate 500, an impurity region 132 (also referred to as a source region and a drain region) with the channel formation region 134 provided therebetween, a gate insulating layer 122a provided over the channel formation region 134, and a gate electrode 128a provided over the gate insulating layer 122a so as to overlap with the channel formation region 134. Note that a transistor whose source electrode and drain electrode are not illustrated in a drawing may be referred to as a transistor for the sake of convenience. Further, in such a case, in description of a connection of a transistor, a source region and a source electrode are collectively referred to as a "source electrode," and a drain region and a drain electrode are collectively referred to as a "drain electrode". That is, in this specification, the term "source electrode" may include a source region.

Further, a conductive layer 128b is connected to an impurity region 126 provided in the semiconductor layer over the semiconductor substrate 500. Here, the conductive layer 128b functions as a source electrode or a drain electrode of the transistor 160. In addition, an impurity region 130 is provided between the impurity region 132 and the impurity region 126.

Further, insulating layers 136, 138, and 140 are provided so as to cover the transistor 160. Note that in order to realize higher integration, the transistor 160 preferably has a structure without a sidewall insulating layer as illustrated in FIGS. 17A and 17B. On the other hand, when importance is put on the characteristics of the transistor 160, sidewall insulating layers may be provided on side surfaces of the gate electrode 128a, and the impurity region 132 may include regions with a different impurity concentrations.

The transistor 162 in FIGS. 17A and 17B includes an oxide semiconductor layer 144 provided over an insulating layer 140 and the like; a source electrode (or a drain electrode) 142a and a drain electrode (or a source electrode) 142b which are electrically connected to the oxide semiconductor layer 144; a gate insulating layer 146 covering the oxide semiconductor layer 144, the source electrode 142a, and the drain electrode 142b; and a gate electrode 148a provided over the gate insulating layer 146 so as to overlap with the oxide semiconductor layer 144.

Here, the oxide semiconductor layer 144 is preferably an oxide semiconductor layer which is highly purified by sufficiently removing impurities such as hydrogen or sufficiently supplying oxygen. Specifically, the hydrogen concentration of the oxide semiconductor layer 144 is lower than or equal to $5 \times 10^{19}$ atoms/cm$^3$, preferably lower than or equal to $5 \times 10^{18}$ atoms/cm$^3$, more preferably lower than or equal to $5 \times 10^{17}$ atoms/cm$^3$. Note that the hydrogen concentration of the oxide semiconductor layer 144 is measured by secondary ion mass spectrometry (SIMS). The carrier concentration of the oxide semiconductor layer 144, in which hydrogen is reduced to a sufficiently low concentration so that the oxide semiconductor layer is highly purified and in which defect levels in an energy gap due to oxygen deficiency are reduced by sufficiently supplying oxygen, is lower than $1 \times 10^{12}$/cm$^3$, preferably lower than $1 \times 10^{11}$/cm$^3$, more preferably lower than $1.45 \times 10^{10}$/cm$^3$. For example, the off-state current (per unit channel width (1 μm) here) at room temperature (25° C.) is less than or equal to 100 zA (1 zA (zeptoampere) is $1 \times 10^{-21}$ A), preferably less than or equal to 10 zA. In this manner, by using an oxide semiconductor which is made to be an i-type (intrinsic) oxide semiconductor or a substantially i-type oxide semiconductor, the transistor 162 which has extremely favorable off-state current characteristics can be obtained.

Note that although the transistor 162 in FIGS. 17A and 17B includes the oxide semiconductor layer 144 which is processed into an island shape in order to suppress a leakage current between elements which is caused due to miniaturization, the oxide semiconductor layer 144 which is not processed into an island shape may be employed. In the case where the oxide semiconductor layer is not processed into an island shape, contamination of the oxide semiconductor layer 144 due to etching in the processing can be prevented.

A capacitor 164 in FIGS. 17A and 17B includes the drain electrode 142b, the gate insulating layer 146, and a conductive layer 148b. That is, the drain electrode 142b functions as one electrode of the capacitor 164 and the conductive layer 148b functions as the other electrode of the capacitor 164. With such a structure, capacitance can be sufficiently secured. Further, insulation between the drain electrode 142b and the conductive layer 148b can be sufficiently secured by stacking the oxide semiconductor layer 144 and the gate insulating layer 146. Further alternatively, the capacitor 164 may be omitted in the case where a capacitor is not needed.

In this embodiment, the transistor 162 and the capacitor 164 are provided so as to overlap with at least part of the transistor 160. By employing such a planar layout, high integration can be realized. For example, given that the minimum feature size is F, the area occupied by a memory cell can be 15F$^2$ to 25F$^2$.

An insulating layer 150 is provided over the transistor 162 and the capacitor 164. A wiring 154 is provided in an opening formed in the gate insulating layer 146 and the insulating layer 150. The wiring 154 is a wiring for connecting one memory cell and another memory cell and corresponds to the bit line BL in FIG. 2. The wiring 154 is connected to the impurity region 126 through the source electrode 142a and the conductive layer 128b. The above structure allows a reduction in the number of wirings in comparison with a structure in which the source region or the drain region in the transistor 160 and the source electrode 142a in the transistor 162 are connected to different wirings. Thus, the integration degree of a semiconductor device can be increased.

Since the conductive layer 128b is provided, a position where the impurity region 126 and the source electrode 142a are connected and a position where the source electrode 142a and the wiring 154 are connected can overlap with each other. With such a planar layout, the element area can be prevented from increasing due to contact regions. In other words, the integration degree of the semiconductor device can be increased.

<Method for Manufacturing SOI Substrate>

Next, an example of a method for manufacturing an SOI substrate used for manufacturing the semiconductor device will be described with reference to FIGS. 18A to 18G.

Figure 18A:
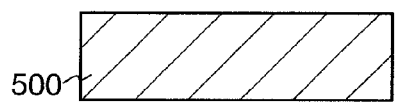
FIGS. 18A to 18G are cross-sectional views relating to manufacturing steps of an SOI substrate.
Figure 18B:

First, the semiconductor substrate 500 is prepared as a base substrate (see FIG. 18A). As the semiconductor substrate 500, a semiconductor substrate such as a single crystal silicon substrate or a single crystal germanium substrate can be used. Alternatively, as the semiconductor substrate, a solar grade silicon (SOG-Si) substrate or the like may be used. Further alternatively, a polycrystalline semiconductor substrate may be used. In the case of using a SOG-Si substrate, a polycrystalline semiconductor substrate, or the like, manufacturing cost can be lower as compared to the case of using a single crystal silicon substrate or the like.

Note that, in place of the semiconductor substrate 500, a variety of glass substrates that are used in the electronics industry, such as aluminosilicate glass substrates, aluminoborosilicate glass substrates, and barium borosilicate glass substrates; quartz substrates; ceramic substrates; and sapphire substrates can be used. Further, a ceramic substrate which contains silicon nitride and aluminum nitride as its main components and whose coefficient of thermal expansion is close to that of silicon may be used.

A surface of the semiconductor substrate 500 is preferably cleaned in advance. Specifically, the semiconductor substrate 500 is preferably subjected to cleaning with a hydrochloric acid/hydrogen peroxide mixture (HPM), a sulfuric acid/hydrogen peroxide mixture (SPM), an ammonium hydrogen peroxide mixture (APM), diluted hydrofluoric acid (DHF), or the like.

Next, a bond substrate is prepared. Here, a single crystal semiconductor substrate 510 is used as the bond substrate (see FIG. 18B). Note that although the substrate whose crystallinity is single crystal is used as the bond substrate here, the crystallinity of the bond substrate is not necessarily limited to single crystal.

For example, as the single crystal semiconductor substrate 510, a single crystal semiconductor substrate formed using an element of Group 14, such as a single crystal silicon substrate, a single crystal germanium substrate, or a single crystal silicon germanium substrate, can be used. Further, a compound semiconductor substrate using gallium arsenide, indium phosphide, or the like can be used. Typical examples of commercially available silicon substrates are circular silicon substrates which are 5 inches (125 mm) in diameter, 6 inches (150 mm) in diameter, 8 inches (200 mm) in diameter, 12 inches (300 mm) in diameter, and 16 inches (400 mm) in diameter. Note that the shape of the single crystal semiconductor substrate 510 is not limited to circular, and the single crystal semiconductor substrate 510 may be a substrate which has been processed into, for example, a rectangular shape or the like. Further, the single crystal semiconductor substrate 510 can be formed by a Czochralski (CZ) method or a Floating Zone (FZ) method.

Figure 18C:
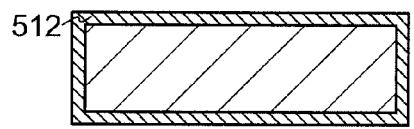

An oxide film 512 is formed over a surface of the single crystal semiconductor substrate 510 (see FIG. 18C). In view of removal of contamination, it is preferable that the surface of the single crystal semiconductor substrate 510 be cleaned with a hydrochloric acid/hydrogen peroxide mixture (RPM), a sulfuric acid/hydrogen peroxide mixture (SPM), an ammonium hydrogen peroxide mixture (APM), diluted hydrofluoric acid (DHF), FPM (a mixed solution of hydrofluoric acid, hydrogen peroxide water, and pure water), or the like before the formation of the oxide film 512. Alternatively, diluted hydrogen fluoride and ozone water may be discharged alternately for cleaning.

The oxide film 512 can be formed with, for example, a single layer or a stacked layer of a silicon oxide film, a silicon oxynitride film, and the like. As a method for forming the oxide film 512, a thermal oxidation method, a CVD method, a sputtering method, or the like can be used. When the oxide film 512 is formed by a CVD method, a silicon oxide film is preferably formed using organosilane such as tetraethoxysilane (abbreviation: TEOS) (chemical formula: $Si(OC_2H_5)_4$), so that favorable bonding can be achieved.

In this embodiment, the oxide film 512 (here, a SiO), film) is formed by performing thermal oxidation treatment on the single crystal semiconductor substrate 510. The thermal oxidation treatment is preferably performed in an oxidizing atmosphere to which a halogen is added.

For example, thermal oxidation treatment of the single crystal semiconductor substrate 510 is performed in an oxidation atmosphere to which chlorine (Cl) is added, whereby the oxide film 512 can be formed through chlorine oxidation. In this case, the oxide film 512 is a film containing chlorine atoms. By such chlorine oxidation, heavy metal (e.g., Fe, Cr, Ni, or Mo) that is an extrinsic impurity is trapped and chloride of the metal is formed and then removed to the outside; thus, contamination of the single crystal semiconductor substrate 510 can be reduced.

Note that the halogen atoms contained in the oxide film 512 are not limited to chlorine atoms. A fluorine atom may be contained in the oxide film 512. As a method for fluorine oxidation of the surface of the single crystal semiconductor substrate 510, a method in which the single crystal semiconductor substrate 510 is soaked in an HF solution and then subjected to thermal oxidation treatment in an oxidizing atmosphere, a method in which thermal oxidation treatment is performed in an oxidizing atmosphere to which $NF_3$ is added, or the like can be used.

Figure 18D:
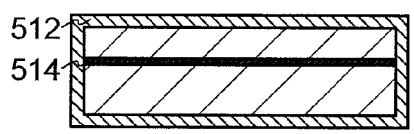
Figure 18E:
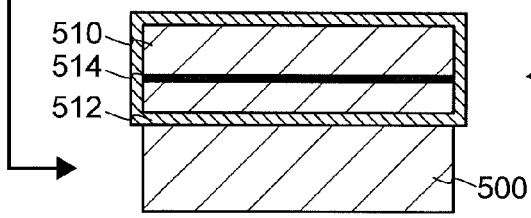

Next, ions are accelerated by an electric field and the single crystal semiconductor substrate 510 is irradiated with the ions and the ions are added thereto, whereby an embrittled region 514 where the crystal structure is damaged is formed in the single crystal semiconductor substrate 510 at a predetermined depth (see FIG. 18D).

The depth at which the embrittled region 514 is formed can be adjusted by the kinetic energy, mass, charge, or incidence angle of the ions, or the like. The embrittled region 514 is formed at approximately the same depth as the average penetration depth of the ions. Therefore, the thickness of the single crystal semiconductor layer to be separated from the single crystal semiconductor substrate 510 can be adjusted with the depth at which the ions are added. For example, the average penetration depth may be adjusted such that the thickness of a single crystal semiconductor layer is approximately 10 nm to 500 nm, preferably, 50 nm to 200 nm.

The above ion irradiation treatment can be performed with an ion-doping apparatus or an ion-implantation apparatus. As a typical example of the ion-doping apparatus, there is a non-mass-separation type apparatus in which plasma excitation of a process gas is performed and an object is irradiated with all kinds of ion species generated. In this apparatus, the object is irradiated with ion species of plasma without mass separation. In contrast, an ion-implantation apparatus is a mass-separation apparatus. In the ion-implantation apparatus, mass separation of ion species of plasma is performed and the object is irradiated with ion species having predetermined masses.

In this embodiment, an example is described in which an ion-doping apparatus is used to add hydrogen to the single crystal semiconductor substrate 510. A gas containing hydrogen is used as a source gas. As for ions used for the irradiation, the proportion of $H_3+$ is preferably set high. Specifically, it is preferable that the proportion of $H_3^+$, be set higher than or equal to 50% (more preferably, higher than or equal to 80%) with respect to the total amount of $H^+$, $H_2^+$, and $H_3^+$. With a high proportion of $H_3^+$, the efficiency of ion irradiation can be improved.

Note that ions to be added are not limited to ions of hydrogen. Ions of helium or the like may be added. Further, ions to be added are not limited to one kind of ions, and plural kinds of ions may be added. For example, in the case of performing irradiation with hydrogen and helium concurrently using an ion-doping apparatus, the number of steps can be smaller as compared to the case of performing irradiation with hydrogen and helium in different steps, and surface roughness of a single crystal semiconductor layer to be formed later can be suppressed.

Note that heavy metal may also be added when the embrittled region 514 is formed with the ion-doping apparatus; however, the ion irradiation is performed through the oxide film 512 containing halogen atoms, whereby contamination of the single crystal semiconductor substrate 510 due to the heavy metal can be prevented.

Next, the semiconductor substrate 500 and the single crystal semiconductor substrate 510 are disposed to face each other and then disposed in close contact with each other with the oxide film 512 provided therebetween. Thus, the semiconductor substrate 500 and the single crystal semiconductor substrate 510 can be bonded to each other (see FIG. 18E). Note that an oxide film or a nitride film may be deposited over a surface of the semiconductor substrate 500 bonded to the single crystal semiconductor substrate 510.

When bonding is performed, it is preferable that a pressure greater than or equal to 0.001 $N/cm^2$ and less than or equal to 100 $N/cm^2$, e.g., a pressure greater than or equal to 1 $N/cm^2$ and less than or equal to 20 $N/cm^2$, be applied to one part of the semiconductor substrate 500 or one part of the single crystal semiconductor substrate 510. When the bonding surfaces are made close to each other and disposed in close contact with each other by applying a pressure, a bonding between the semiconductor substrate 500 and the oxide film 512 is generated at the part where the close contact is made, and the bonding spontaneously spreads to almost the entire area. This bonding is performed under the action of the Van der Waals force or hydrogen bonding and can be performed at room temperature.

Note that before the single crystal semiconductor substrate 510 and the semiconductor substrate 500 are bonded to each other, the surfaces to be bonded to are preferably subjected to surface treatment. Surface treatment can improve the bonding strength at the interface between the single crystal semiconductor substrate 510 and the semiconductor substrate 500.

As the surface treatment, wet treatment, dry treatment, or a combination of wet treatment and dry treatment can be used. Alternatively, wet treatment may be used in combination with different wet treatment or dry treatment may be used in combination with different dry treatment.

Note that heat treatment for increasing the bonding strength may be performed after bonding. This heat treatment is performed at a temperature at which separation at the embrittled region 514 does not occur (for example, a temperature higher than or equal to room temperature and lower than 400° C.). Alternatively, bonding of the semiconductor substrate 500 and the oxide film 512 may be performed while heating them at a temperature in this range. The heat treatment can be performed using a diffusion furnace, a heating furnace such as a resistance heating furnace, a rapid thermal annealing (RTA) apparatus, a microwave heating apparatus, or the like. Note that the above temperature condition is merely an example, and one embodiment of the disclosed invention should not be construed as being limited to this example.

Figure 18F:
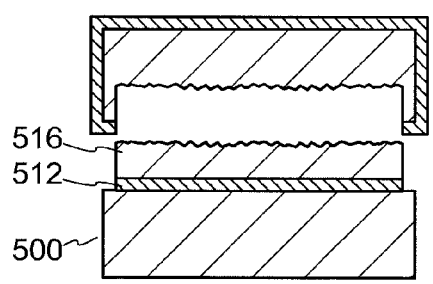

Next, heat treatment is performed for separation of the single crystal semiconductor substrate 510 at the embrittlement region, whereby a single crystal semiconductor layer 516 is fowled over the semiconductor substrate 500 with the oxide film 512 provided therebetween (FIG. 18F).

Note that the temperature for heat treatment in the separation is desirably as low as possible. This is because as the temperature in the separation is low, generation of roughness on the surface of the single crystal semiconductor layer 516 can be suppressed. Specifically, the temperature of the heat treatment in the separation may be higher than or equal to 300° C. and lower than or equal to 600° C., and the heat treatment is more effective when the temperature is lower than or equal to 500° C. (higher than or equal to 400° C.).

Note that after the single crystal semiconductor substrate 510 is separated, the single crystal semiconductor layer 516 may be subjected to heat treatment at higher than or equal to 500° C. so that concentration of hydrogen remaining in the single crystal semiconductor layer 516 is reduced.

Figure 18G:
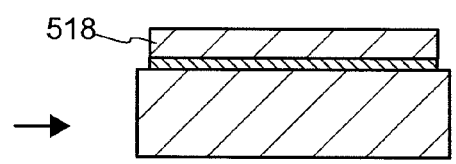

Then, the surface of the single crystal semiconductor layer 516 is irradiated with laser light, whereby a single crystal semiconductor layer 518 in which the planarity of the surface is improved and the number of defects is reduced is formed (see FIG. 18G). Note that instead of the laser light irradiation treatment, heat treatment may be performed.

Although the irradiation treatment with the laser light is performed immediately after the heat treatment for separation of the single crystal semiconductor layer 516 in this embodiment, one embodiment of the present invention is not construed as being limited to this. Etching may be performed after the heat treatment for separation of the single crystal semiconductor layer 516, to remove a region where there are many defects on the surface of the single crystal semiconductor layer 516, and then the laser light irradiation treatment may be performed. Alternatively, after the surface planarity of the single crystal semiconductor layer 516 is improved, the laser light irradiation treatment may be performed. Note that the etching may be either wet etching or dry etching. Further, in this embodiment, a step of reducing the thickness of the single crystal semiconductor layer 516 may be performed after the laser light irradiation. In order to reduce the thickness of the single crystal semiconductor layer 516, any one or both of dry etching and wet etching may be employed.

Through the above steps, an SOI substrate having the single crystal semiconductor layer 518 with favorable characteristics can be obtained (see FIG. 18G).

<Method for Manufacturing Semiconductor Device>

Next, a method for manufacturing a semiconductor device in which the above SOI substrate is used will be described with reference to FIGS. 19A to 19E, FIGS. 20A to 20D, FIGS. 21A to 21D, and FIGS. 22A to 22C.

<Method for Manufacturing Transistor in Lower Portion>

First, a method for manufacturing the transistor 160 in a lower portion is described with reference to FIGS. 19A to 19E and FIGS. 20A to 20D. Note that FIGS. 19A to 19E and FIGS. 20A to 20D illustrate part of the SOI substrate formed by the method illustrated in FIGS. 18A to 18G and are cross-sectional process views illustrating the transistor in the lower portion illustrated in FIG. 17A.

Figure 19A:
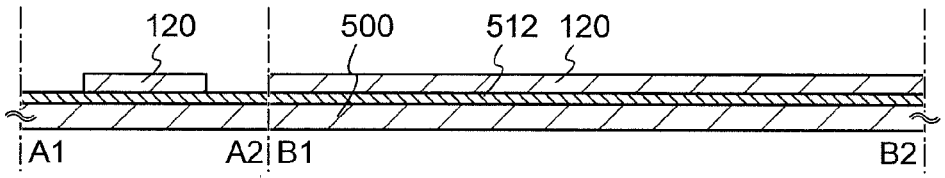
FIGS. 19A to 19E are cross-sectional views relating to manufacturing steps of a semiconductor device.

First, the single crystal semiconductor layer 518 is patterned into an island shape so that a semiconductor layer 120 is formed (see FIG. 19A). Note that before or after this step, an impurity element imparting n-type conductivity or an impurity element imparting p-type conductivity may be added to the semiconductor layer in order to control the threshold voltage of the transistor. In the case where silicon is used as the semiconductor, phosphorus, arsenic, or the like can be used as an impurity element imparting n-type conductivity. On the other hand, boron, aluminum, gallium, or the like can be used as an impurity element imparting p-type conductivity.

Figure 19B:
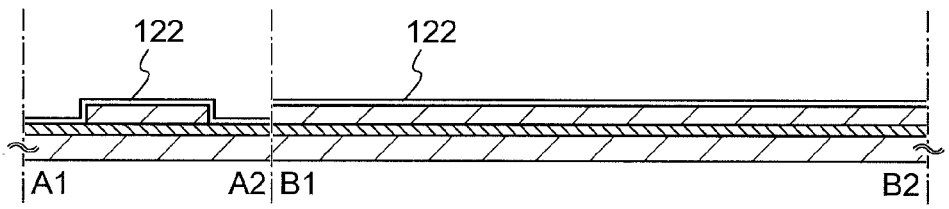

Next, an insulating layer 122 is formed so as to cover the semiconductor layer 120 (see FIG. 19B). The insulating layer 122 is to be a gate insulating layer later. The insulating layer 122 can be formed, for example, by performing heat treatment (thermal oxidation treatment, thermal nitridation treatment, or the like) on a surface of the semiconductor layer 120. Instead of heat treatment, high-density plasma treatment may be employed. The high-density plasma treatment can be performed with the use of, for example, a mixed gas of a rare gas such as He, Ar, Kr, or Xe and any of oxygen, nitrogen oxide, ammonia, nitrogen, and hydrogen. Needless to say, the insulating layer may be formed by using a CVD method, a sputtering method, or the like. The insulating layer 122 preferably has a single-layer structure or a layered structure using a film including any of silicon oxide, silicon oxynitride, silicon nitride, hafnium oxide, aluminum oxide, tantalum oxide, yttrium oxide, hafnium silicate ($HfSi_xO_y$ (x>0, y>0)), hafnium silicate ($HfSi_xO_y$ (x>0, y>0)) to which nitrogen is added, hafnium aluminate ($HfAl_xO_y$ (x>0, y>0)) to which nitrogen is added, and the like. The thickness of the insulating layer 122 may be, for example, greater than or equal to 1 nm and less than or equal to 100 nm, preferably greater than or equal to 10 nm and less than or equal to 50 nm Here, a single-layer insulating layer containing silicon oxide is formed by using a plasma CVD method.

Figure 19C:
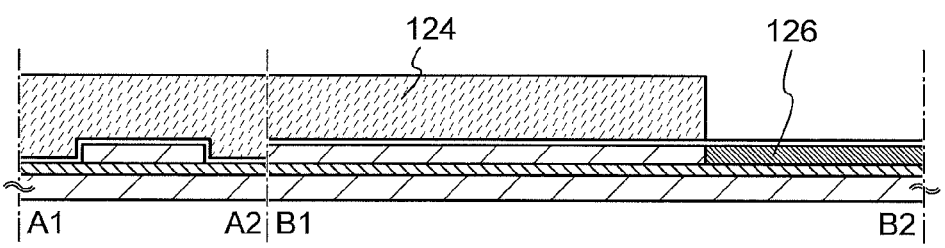

Next, a mask 124 is formed over the insulating layer 122 and an impurity element imparting one conductivity type is added to the semiconductor layer 120, so that the impurity region 126 is formed (see FIG. 19C). Note that here, the mask 124 is removed after the impurity element is added.

Figure 19D:
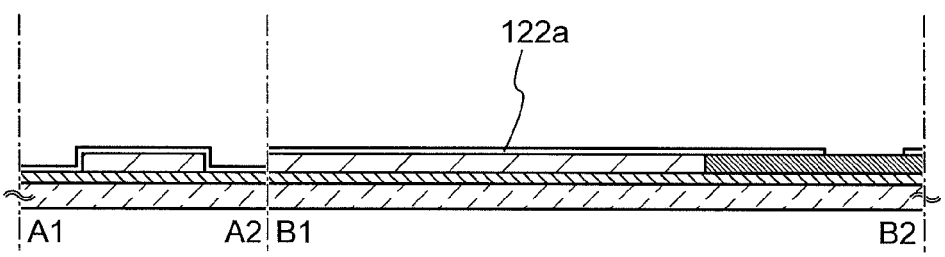

Next, a mask is formed over the insulating layer 122 and a region of the insulating layer 122 that overlaps with the impurity region 126 is partly removed, so that the gate insulating layer 122a is formed (see FIG. 19D). Part of the insulating layer 122 can be removed by etching such as wet etching or dry etching.

Figure 19E:
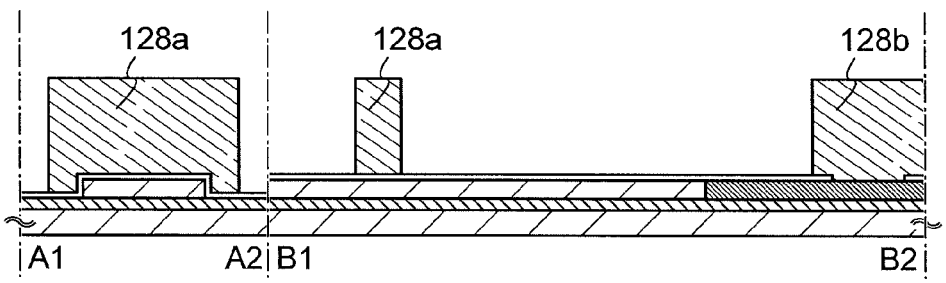

Next, a conductive layer for forming a gate electrode (including a wiring formed in the same layer as the gate electrode) is formed over the gate insulating layer 122a and is processed, so that the gate electrode 128a and the conductive layer 128b are formed (see FIG. 19E).

The conductive layer used for the gate electrode 128a and the conductive layer 128b can be formed using a metal material such as aluminum, copper, titanium, tantalum, or tungsten. The layer including a conductive material may be foamed using a semiconductor material such as polycrystalline silicon. There is no particular limitation on the method for forming the layer containing a conductive material, and a variety of film formation methods such as an evaporation method, a CVD method, a sputtering method, or a spin coating method can be employed. The conductive layer may be processed by etching using a resist mask.

Figure 20A:
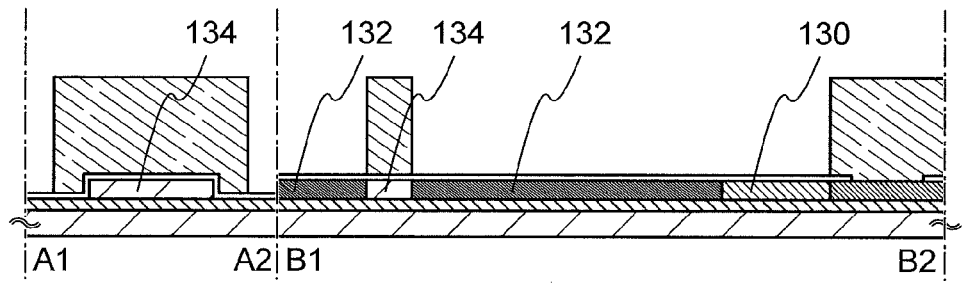
FIGS. 20A to 20D are cross-sectional views relating to manufacturing steps of a semiconductor device.

Next, an impurity element imparting one conductivity type is added to the semiconductor layer with the use of the gate electrode 128a and the conductive layer 128b as masks, so that the channel formation region 134, the impurity region 132, and the impurity region 130 are formed (see FIG. 20A). Here, an impurity element such as boron (B) is added in order to form a p-channel transistor. In the case of forming an n-channel transistor, an impurity element such as phosphorus (P) or arsenic (As) may be added. Here, the concentration of an impurity element to be added can be set as appropriate. In addition, after the impurity element is added, heat treatment for activation is performed. Here, the concentration in the impurity region is increased in the following order: the impurity region 126, the impurity region 132, and the impurity region 130.

Figure 20B:
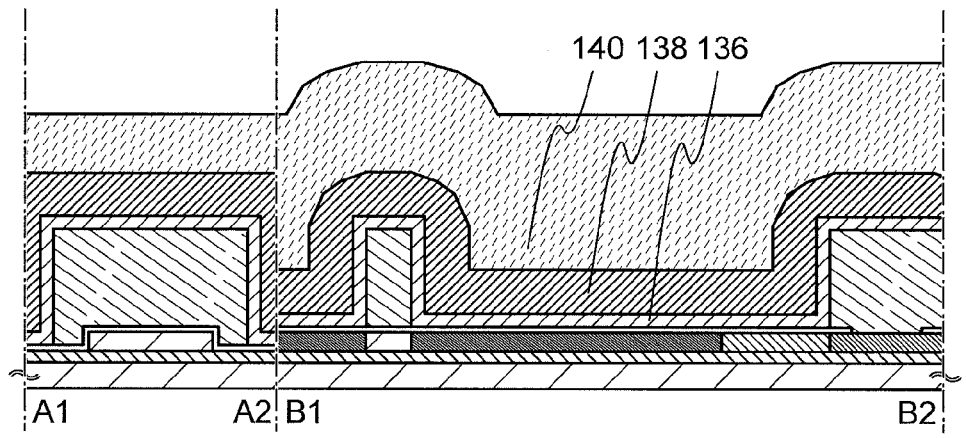

Next, the insulating layer 136, the insulating layer 138, and the insulating layer 140 are formed so as to cover the gate insulating layer 122a, the gate electrode 128a, and the conductive layer 128b (see FIG. 20B).

The insulating layer 136, the insulating layer 138, and the insulating layer 140 can be formed using a material including an inorganic insulating material such as silicon oxide, silicon oxynitride, silicon nitride oxide, silicon nitride, or aluminum oxide. The insulating layer 136, the insulating layer 138, and the insulating layer 140 are particularly preferably formed using a low dielectric constant (low-k) material, because capacitance due to overlapping electrodes or wirings can be sufficiently reduced. Note that the insulating layer 136, the insulating layer 138, and the insulating layer 140 may be porous insulating layers formed using any of these materials. Since the porous insulating layer has low dielectric constant as compared to a dense insulating layer, capacitance due to electrodes or wirings can be further reduced. Alternatively, the insulating layer 136, the insulating layer 138, and the insulating layer 140 can be formed using an organic insulating material such as polyimide or acrylic. In this embodiment, the case of using silicon oxynitride for the insulating layer 136, silicon nitride oxide for the insulating layer 138, and silicon oxide for the insulating layer 140 will be described. A layered structure of the insulating layer 136, the insulating layer 138, and the insulating layer 140 is employed here; however, one embodiment of the disclosed invention is not limited to this. A single-layer structure, a layered structure of two layers, or a layered structure of four or more layers may also be used.

Figure 20C:
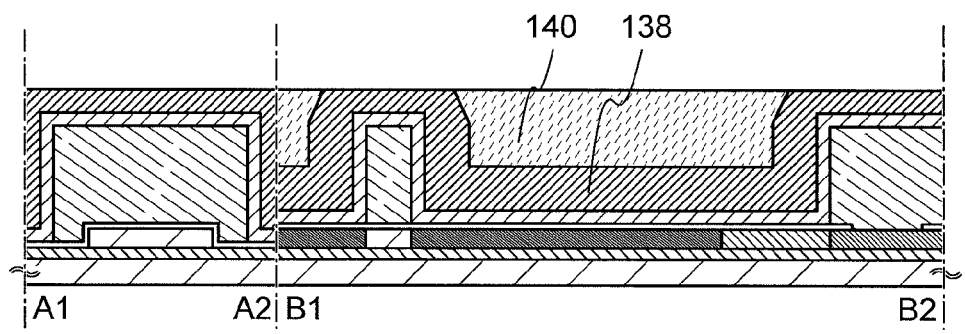

Next, the insulating layer 138 and the insulating layer 140 are subjected to chemical mechanical polishing (CMP) treatment or etching, so that the insulating layer 138 and the insulating layer 140 are planarized (see FIG. 20C). Here, CMP treatment is performed until the insulating layer 138 is partly exposed. When silicon nitride oxide is used for the insulating layer 138 and silicon oxide is used for the insulating layer 140, the insulating layer 138 functions as an etching stopper.

Figure 20D:
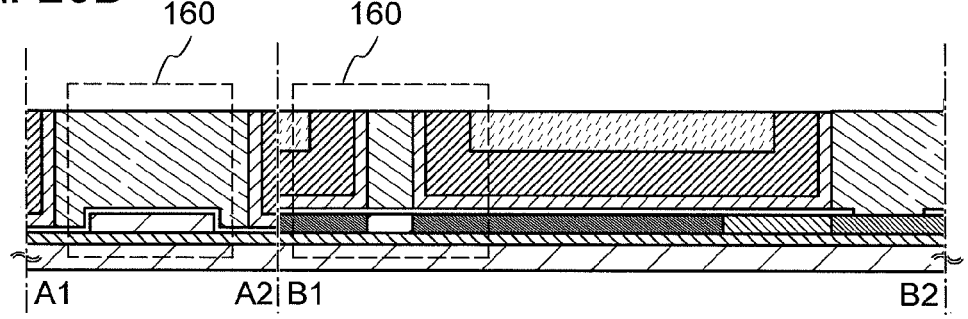

Next, the insulating layer 138 and the insulating layer 140 are subjected to CMP treatment or etching, so that upper surfaces of the gate electrode 128a and the conductive layer 128b are exposed (see FIG. 20D). Here, etching is performed until the gate electrode 128a and the conductive layer 128b are partly exposed. For the etching, dry etching is preferably performed, but wet etching may be performed. In the step of partly exposing the gate electrode 128a and the conductive layer 128b, in order to improve the characteristics of the transistor 162 which is formed later, the surfaces of the insulating layer 136, the insulating layer 138, and the insulating layer 140 are preferably planarized as much as possible.

Through the above steps, the transistor 160 in the lower portion can be formed (see FIG. 20D).

Note that before or after the above steps, a step for forming an additional electrode, wiring, semiconductor layer, or insulating layer may be performed. For example, a multilayer wiring structure in which an insulating layer and a conductive layer are stacked is employed as a wiring structure, so that a highly-integrated semiconductor device can be provided.

<Method for Manufacturing Transistor in Upper Portion>

Next, a method for manufacturing the transistor 162 in the upper portion will be described with reference to FIGS. 21A to 21D and FIGS. 22A to 22C.

Figure 21A:
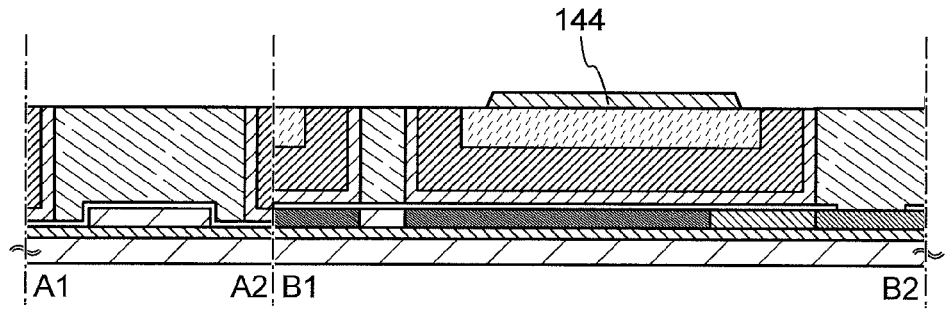
FIGS. 21A to 21D are cross-sectional views relating to manufacturing steps of a semiconductor device.

First, an oxide semiconductor layer is formed over the gate electrode 128a, the conductive layer 128b, the insulating layer 136, the insulating layer 138, the insulating layer 140, and the like and is processed, so that the oxide semiconductor layer 144 is formed (see FIG. 21A). Note that an insulating layer functioning as a base may be formed over the insulating layer 136, the insulating layer 138, and the insulating layer 140 before the oxide semiconductor layer is knitted. The insulating layer can be formed by a PVD method such as a sputtering method, or a CVD method such as a plasma CVD method.

An oxide semiconductor to be used preferably contains at least indium (In) or zinc (Zn). In particular, In and Zn are preferably contained. As a stabilizer for reducing variation in electric characteristics of a transistor using the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As a material used for the oxide semiconductor layer, a four-component metal oxide material such as an In—Sn—Ga—Zn—O-based material, an In—Hf—Ga—Zn—O-based material, an In—Al—Ga—Zn—O-based material, an In—Sn—Al—Zn—O-based material, an In—Sn—Hf—Zn—O-based material, or In—Hf—Al—Zn—O-based material; a three-component metal oxide material such as an In—Ga—Zn—O-based material, an In—Sn—Zn—O-based material, an In—Al—Zn—O-based material, a Sn—Ga—Zn—O-based material, an Al—Ga—Zn—O-based material, a Sn—Al—Zn—O-based material, an In—Hf—Zn—O-based material, an In—La—Zn—O-based material, an In—Ce—Zn—O-based material, an In—Pr—Zn—O-based material, an In—Nd—Zn—O-based material, an In—Sm—Zn—O-based material, an In—Eu—Zn—O-based material, an In—Gd—Zn—O-based material, an In—Tb—Zn—O-based material, an In—Dy—Zn—O-based material, an In—Ho—Zn—O-based material, an In—Er—Zn—O-based material, an In—Tm—Zn—O-based material, an In—Yb—Zn—O-based material, or an In—Lu—Zn—O-based material; or a two-component metal oxide material such as an In—Zn—O-based material, a Sn—Zn—O-based material, an Al—Zn—O-based material, a Zn—Mg—O-based material, a Sn—Mg—O-based material, an In—Mg—O-based material, or an In—Ga—O-based material; an In—O-based material; a Sn—O-based material; or a Zn—O-based material; or the like can be used. In addition, the above materials may contain $SiO_2$. Here, for example, an In—Ga—Zn—O-based material means an oxide film containing indium (In), gallium (Ga), and zinc (Zn), and there is no particular limitation on the composition ratio. Further, the In—Ga—Zn—O-based oxide semiconductor may contain an element other than In, Ga, and Zn.

Alternatively, a material represented by a chemical formula, $InMO_3(ZnO)_m$ (m>0 is satisfied) may be used as an oxide semiconductor. Here, M represents one or more metal elements selected from Ga, Al, Fe, Mn, and Co. For example, M may be Ga, Ga and Al, Ga and Mn, Ga and Co, or the like. Still alternatively, a material represented by $In_3SnO_5(ZnO)_n$ (n>0 is satisfied, and n is an integer) may be used as an oxide semiconductor.

For example, an In—Ga—Zn—O-based material with an atomic ratio of In:Ga:Zn=1:1:1 (=1/3:1/3:1/3) or In: Ga: Zn=2:2:1 (=2/5:2/5:1/5), or any of oxides whose composition is in the neighborhood of the above compositions can be used. Alternatively, an In—Sn—Zn—O-based material with an atomic ratio of In:Sn:Zn=1:1:1 (=1/3:1/3:1/3), In:Sn:Zn=2: 1:3 (=1/3:1/6:1/2), or In:Sn:Zn=2:1:5 (=1/4:1/8:5/8), or any of oxides whose composition is in the neighborhood of the above compositions may be used.

However, one embodiment of the present invention is not limited thereto and a material having suitable composition may be used, depending on needed semiconductor characteristics (such as mobility, a threshold voltage, and variation). Further, in order to obtain needed semiconductor characteristics, suitable carrier concentration, impurity concentration, defect density, atomic ratio of metal elements and oxygen, interatomic bond distance, density, and the like are preferably employed.

For example, with an In—Sn—Zn—O-based material, it is relatively easy to obtain a high mobility. However, even with an In—Ga—Zn—O-based material, a mobility can be increased by reducing the defect density in the bulk.

Note that for example, the expression "the composition of an oxide including In, Ga, and Zn at the atomic ratio, In:Ga: Zn=a: b: c (a+b+c=1), is in the neighborhood of the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

The oxide semiconductor may be either single crystal or non-single-crystal. In the latter case, the oxide semiconductor may be either amorphous or polycrystal. Further, the oxide semiconductor may have either an amorphous structure including a portion having crystallinity or a non-amorphous structure.

In an oxide semiconductor in an amorphous state, a planar surface can be obtained with relative ease, so that when a transistor is manufactured with the use of the oxide semiconductor, interface scattering can be reduced, and relatively high mobility can be obtained with relative ease.

In an oxide semiconductor having crystallinity, defects in the bulk can be further reduced and when a surface planarity is improved, mobility higher than that of an oxide semiconductor layer in an amorphous state can be obtained. In order to improve the surface planarity, the oxide semiconductor is preferably formed over a planar surface. Specifically, the oxide semiconductor may be formed over a surface with the average surface roughness (Ra) of less than or equal to 1 nm, preferably less than or equal to 0.3 nm, more preferably less than or equal to 0.1 nm.

Note that the Ra in this specification refers to a centerline average roughness obtained by three-dimensionally expanding a centerline average roughness defined by JIS B0601 so as to be applied to a plane. The Ra can be expressed as an "average value of absolute values of deviations from a reference plane to a designated plane", and is defined with the following formula.

$$Ra = \frac{1}{S_0} \int_{x_2}^{x_1} \int_{y_2}^{y_1} |f(x, y) - Z_0| dx dy \qquad \text{[FORMULA 1]}$$

In the above formula, $S_0$ represents an area of a plane to be measured (a rectangular region which is defined by four points represented by coordinates $(x_1, y_1)$, $(x_1, y_2)$, $(x_2, y_2)$, and $(x_2, y_2)$), and $Z_0$ represents an average height of the plane to be measured. Ra can be measured using an atomic force microscope (AFM).

The thickness of the oxide semiconductor layer is preferably greater than or equal to 3 nm and less than or equal to 30 nm. This is because the transistor might possibly be normally on when the oxide semiconductor layer is too thick (e.g., the thickness is 50 nm or more).

The oxide semiconductor layer is preferably formed by a method in which impurities such as hydrogen, water, a hydroxyl group, or hydride do not enter the oxide semiconductor layer. For example, a sputtering method can be used.

As an In—Ga—Zn—O-based target, for example, a target having a composition ratio of $In_2O_3:Ga_2O_3:ZnO=1:1:1$ [molar ratio] can be used. Note that it is not necessary to limit the material and the composition ratio of the target to the above. For example, a target having a composition ratio of $In_2O_3:Ga_2O_3:ZnO=1:1:2$ [molar ratio] can be used.

As a target of an In—Zn—O-based material, a target with the following composition ratio is used: the composition ratio of In:Zn is 50:1 to 1:2 in an atomic ratio ($In_2O_3:ZnO=25:1$ to 1:4 in a molar ratio), preferably 20:1 to 1:1 in an atomic ratio ($In_2O_3:ZnO=10:1$ to 1:2 in a molar ratio), further preferably 15:1 to 1.5:1 in an atomic ratio ($In_2O_3:ZnO=15:2$ to 3:4 in a molar ratio). For example, when a target used for forming an In—Zn—O-based oxide semiconductor has a composition ratio of In:Zn:O=X:Y:Z in an atomic ratio, Z>(1.5X+Y).

In addition, the In—Sn—Zn—O-based material can also be referred to as ITZO, and an oxide target having a composition ratio of In:Sn:Zn=1:2:2, In: Sn: Zn=2:1:3, In:Sn:Zn=1: 1:1, In:Sn:Zn=20:45:35, or the like in an atomic ratio is used.

The relative density of the oxide target is higher than or equal to 90% and lower than or equal to 100%, preferably higher than or equal to 95% and lower than or equal to 99.9%. This is because, with the use of a target with a high relative density, the deposited oxide semiconductor layer can be a dense film.

The film formation atmosphere may be a rare gas (typically argon) atmosphere, an oxygen atmosphere, or a mixed atmosphere of a rare gas and oxygen. An atmosphere of a high-purity gas from which an impurity such as hydrogen, water, a hydroxyl group, or hydride is removed is preferable in order to prevent hydrogen, water, a hydroxyl group, hydride, or the like from entering the oxide semiconductor layer.

In this embodiment, the oxide semiconductor layer is formed by a sputtering method with the use of an In—Ga—Zn—O-based oxide target.

First, the substrate is held in a film formation chamber which is kept under reduced pressure, and then is heated so that the substrate temperature reaches a temperature higher than 200° C. and lower than or equal to 500° C., preferably higher than 300° C. and lower than or equal to 500° C., further preferably higher than or equal to 350° C. and lower than or equal to 450° C.

Then, a high-purity gas in which impurities such as hydrogen, water, a hydroxyl group, or hydride are sufficiently removed is introduced into the film formation chamber from which remaining moisture is being removed, and the oxide semiconductor layer is formed over the substrate with the use of the target. To remove moisture remaining in the film formation chamber, an entrapment vacuum pump such as a cryopump, an ion pump, or a titanium sublimation pump is desirably used. Further, an evacuation unit may be a turbo pump provided with a cold trap. In the film formation chamber which is evacuated with the cryopump, for example, impurities such as hydrogen, water, a hydroxyl group, or hydride (preferably, also a compound containing a carbon atom) and the like are removed, whereby the concentration of impurities such as hydrogen, water, a hydroxyl group, and hydride in the oxide semiconductor layer formed in the film formation chamber can be reduced.

In the case where the substrate temperature is low (for example, 100° C. or lower) during deposition, a substance including a hydrogen atom may enter the oxide semiconductor; thus, it is preferable that the substrate be heated at a temperature in the above range. When the oxide semiconductor layer is formed with the substrate heated at the temperature, the substrate temperature is increased, so that hydrogen bonds are cut by heat and the substance including a hydrogen atom is less likely to be taken into the oxide semiconductor layer. Therefore, the oxide semiconductor layer is formed with the substrate heated at the temperature, whereby the concentration of impurities such as hydrogen, water, a hydroxyl group, or hydride in the oxide semiconductor layer can be sufficiently reduced. Moreover, damage due to sputtering can be reduced.

As an example of film formation conditions, the following conditions are employed: the distance between the substrate and the target is 60 mm; the pressure is 0.4 Pa; the direct-current (DC) power is 0.5 kW; the substrate temperature is 400° C.; and the film formation atmosphere is an oxygen atmosphere (the proportion of the oxygen flow rate is 100%). Note that a pulse direct current power source is preferable because powder substances (also referred to as particles or dust) generated in film formation can be reduced and the film thickness can be uniform.

Note that before the oxide semiconductor layer is formed by a sputtering method, powdery substances (also referred to as particles or dust) attached on a formation surface of the oxide semiconductor layer are preferably removed by reverse sputtering in which an argon gas is introduced and plasma is generated. The reverse sputtering refers to a method in which a voltage is applied to a substrate side to generate plasma in the vicinity of the substrate to modify a surface. Note that instead of argon, a gas of nitrogen, helium, oxygen, or the like may be used.

The oxide semiconductor layer can be processed by being etched after a mask having a desired shape is formed over the oxide semiconductor layer. The mask may be formed by a method such as photolithography or an ink-jet method. For the etching of the oxide semiconductor layer, either wet etching or dry etching may be employed. It is needless to say that both of them may be employed in combination.

After that, heat treatment (first heat treatment) may be performed on the oxide semiconductor layer 144. The heat treatment eliminates substances including hydrogen atoms in the oxide semiconductor layer 144; thus, the structure of the oxide semiconductor layer 144 can be improved and defect level in the energy gap can be reduced. The heat treatment is performed in an inert gas atmosphere at a temperature higher than or equal to 250° C. and lower than or equal to 700° C., preferably higher than or equal to 450° C. and lower than or equal to 600° C. or lower than a strain point of the substrate. The inert gas atmosphere is preferably an atmosphere which contains nitrogen or a rare gas (e.g., helium, neon, or argon) as its main component and does not contain water, hydrogen, or the like. For example, the purity of nitrogen or a rare gas such as helium, neon, or argon introduced into a heat treatment apparatus is higher than or equal to 6 N (99.9999%), preferably higher than or equal to 7 N (99.99999%) (that is, the concentration of the impurities is lower than or equal to 1 ppm, preferably lower than or equal to 0.1 ppm).

The heat treatment can be performed in such a manner that, for example, an object is introduced into an electric furnace including a resistance heating element or the like, and heated, in a nitrogen atmosphere at 450° C. for an hour. The oxide semiconductor layer 144 is not exposed to the air during the heat treatment so that entry of water and hydrogen can be prevented.

The above heat treatment has an effect of removing hydrogen, water, and the like and can be referred to as dehydration treatment, dehydrogenation treatment, or the like. The heat treatment can be performed at the timing, for example, before the oxide semiconductor layer is processed into an island shape, after the gate insulating layer is formed, or the like. Such dehydration treatment or dehydrogenation treatment may be conducted once or plural times.

Figure 21B:
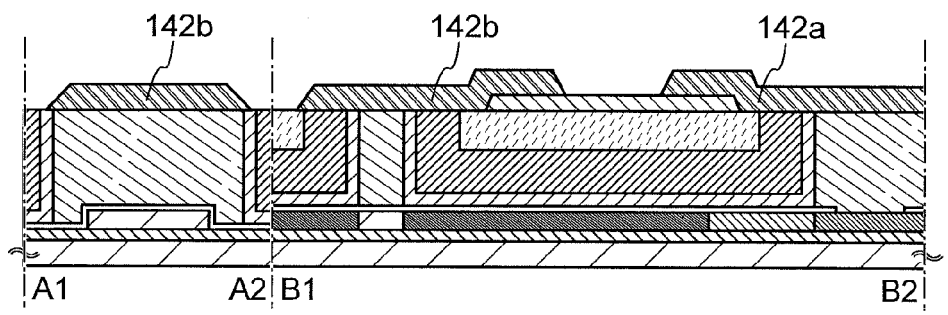

Next, a conductive layer for forming a source electrode and a drain electrode (including a wiring formed in the same layer as the source electrode and the drain electrode) is formed over the oxide semiconductor layer 144 and the like and is processed, so that the source electrode 142*a* and the drain electrode 142*b* are formed (see FIG. 21B).

The conductive layer can be formed by a PVD method or a CVD method. As a material for the conductive layer, an element selected from aluminum, chromium, copper, tantalum, titanium, molybdenum, and tungsten; an alloy containing any of these elements as a component; or the like can be used. Further, one or more materials selected from manganese, magnesium, zirconium, beryllium, neodymium, and scandium may be used.

The conductive layer can have a single-layer structure or a layered structure including two or more layers. For example, the conductive layer can have a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, or a three-layer structure in which a titanium film, an aluminum film, and a titanium film are stacked in this order. Note that the conductive layer having a single-layer structure of a titanium film or a titanium nitride film has an advantage in that it can be easily processed into the source electrode 142a and the drain electrode 142b having a tapered shape.

Alternatively, the conductive layer may be formed using conductive metal oxide. As the conductive metal oxide, indium oxide ($In_2O_3$), tin oxide ($SnO_2$), zinc oxide (ZnO), an indium oxide-tin oxide alloy ($In_2O_3$—$SnO_2$, which may be abbreviated to ITO), an indium oxide-zinc oxide alloy ($In_2O_3$—ZnO), or any of these metal oxide materials in which silicon or silicon oxide is included can be used.

The conductive layer is preferably etched so that the source electrode 142a and the drain electrode 142b are formed to have tapered end portions. Here, a taper angle is, for example, preferably greater than or equal to 30° and less than or equal to 60°. The etching is performed so that the end portions of the source electrode 142a and the drain electrode 142b are tapered, whereby coverage with the gate insulating layer 146 formed later can be improved and disconnection can be prevented.

The channel length (L) of the transistor in the upper portion is determined by a distance between lower edge portions of the source electrode 142a and the drain electrode 142b. Note that for light exposure for forming a mask used in the case where a transistor with a channel length (L) less than 25 nm is formed, it is preferable to use extreme ultraviolet rays whose wavelength is as short as several nanometers to several tens of nanometers. In the light exposure by extreme ultraviolet light, the resolution is high and the focus depth is large. For these reasons, the channel length (L) of the transistor to be formed later can be in the range of greater than or equal to 10 nm and less than or equal to 1000 nm (1 µm), and the circuit can operate at higher speed. Moreover, miniaturization can lead to low power consumption of a semiconductor device.

As another example which is different from FIG. 21B, oxide conductive layers may be provided as a source region and a drain region between the oxide semiconductor layer 144 and the source electrode and between the oxide semiconductor layer 144 and the drain electrode.

For example, an oxide conductive film is formed over the oxide semiconductor layer 144, a conductive layer is formed thereover, and the oxide conductive film and the conductive layer are processed through the same photolithography step, so that the oxide conductive layers serving as the source region and the drain region, the source electrode 142a, and the drain electrode 142b can be formed.

Alternatively, a stack of an oxide semiconductor film and an oxide conductive film is formed and the shape of the stack of the oxide semiconductor film and the oxide conductive film is processed through the same photolithography step, so that the oxide semiconductor layer 144 and an oxide semiconductor film which have island shapes are formed. After the source electrode 142a and the drain electrode 142b are formed, the island-shaped oxide conductive film is further etched with the use of the source electrode 142a and the drain electrode 142b as masks, so that the oxide conductive layers serving as the source region and the drain region can be formed.

Note that in the etching for processing the shape of the oxide conductive layers, etching conditions (the kind of etchant, the concentration, the etching time, and the like) are appropriately adjusted so that the oxide semiconductor layer is not excessively etched.

A material of the oxide conductive layers preferably contains zinc oxide as a component and preferably does not contain indium oxide. For such oxide conductive layers, zinc oxide, zinc aluminum oxide, zinc aluminum oxynitride, zinc gallium oxide, or the like can be used.

When the oxide conductive layers are provided between the oxide semiconductor layer and the source and drain electrodes, the source region and the drain region can have lower resistance and the transistor can operate at high speed.

With the structure of the oxide semiconductor layer 144, the oxide conductive layers, and the drain electrode and the source electrode formed of a metal material, withstand voltage of the transistor can be further increased.

It is effective to use the oxide conductive layers for the source region and the drain region in order to improve frequency characteristics of a peripheral circuit (a driver circuit). This is because the contact of a metal electrode (e.g., molybdenum or tungsten) with the oxide semiconductor layer can reduce more contact resistance than the contact of a metal electrode (e.g., molybdenum or tungsten) with the oxide conductive layer. The contact resistance can be reduced by interposing the oxide conductive layers between the oxide semiconductor layer and the source and drain electrode; accordingly, frequency characteristics of a peripheral circuit (a driver circuit) can be improved.

Figure 21C:
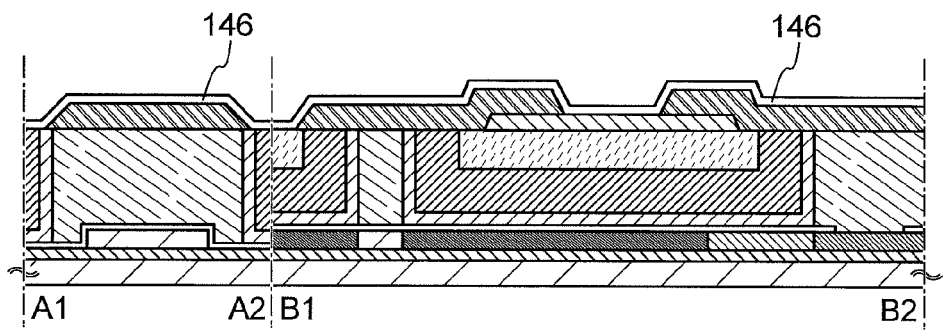

Next, the gate insulating layer 146 is formed so as to cover the source electrode 142a and the drain electrode 142b and to be in contact with part of the oxide semiconductor layer 144 (see FIG. 21C).

The gate insulating layer 146 can be formed by a CVD method, a sputtering method, or the like. In addition, the gate insulating layer 146 is preferably formed so as to contain silicon oxide, silicon nitride, silicon oxynitride, gallium oxide, aluminum oxide, tantalum oxide, hafnium oxide, yttrium oxide, hafnium silicate ($HfSi_xO_y$ (x>0, y>0)), hafnium silicate ($HfSi_xO_y$ (x>0, y>0)) to which nitrogen is added, hafnium aluminate ($HfAl_xO_y$ (x>0, y>0)) to which nitrogen is added, or the like. The gate insulating layer 146 may have a single-layer structure or a layered structure including a combination of the above materials. There is no particular limitation on the thickness; however, in the case where a semiconductor device is miniaturized, the thickness is preferably small for ensuring operation of the transistor. For example, in the case where silicon oxide is used, the thickness can be set to greater than or equal to 1 nm and less than or equal to 100 nm, preferably greater than or equal to 10 nm and less than or equal to 50 nm.

When the gate insulating layer is thin as described above, a problem of gate leakage due to a tunnel effect or the like is caused. In order to solve the problem of gate leakage, a high dielectric constant (high-k) material such as hafnium oxide, tantalum oxide, yttrium oxide, hafnium silicate ($HfSi_xO_y$ (x>0, y>0)), hafnium silicate ($HfSi_3O_y$ (x>0, y>0)) to which nitrogen is added, or hafnium aluminate ($HfAl_xO_y$ (x>0, y>0)) to which nitrogen is added is preferably used for the gate insulating layer 146. By using a high-k material for the gate insulating layer 146, electrical characteristics can be ensured and the thickness can be large to prevent gate leakage. Note that a layered structure of a film containing a high-k material and a film containing any one of silicon oxide, silicon nitride, silicon oxynitride, silicon nitride oxide, aluminum oxide, and the like may be employed.

In addition, an insulating layer (the gate insulating layer 146 in this embodiment) in contact with the oxide semiconductor layer 144 may be formed using an insulating material containing an element of Group 13 and oxygen. Many of oxide semiconductor materials include elements of Group 13, and an insulating material containing an element of Group 13 is compatible with an oxide semiconductor. Thus, when an insulating material containing an element of Group 13 is used for an insulating layer in contact with the oxide semiconductor layer, the state of the interface with the oxide semiconductor layer can be kept well.

Here, an insulating material including an element of Group 13 refers to an insulating material including one or more elements of Group 13. As the insulating material containing an element of Group 13, a gallium oxide, an aluminum oxide, an aluminum gallium oxide, a gallium aluminum oxide, and the like are given. Here, aluminum gallium oxide refers to a material in which the amount of aluminum is larger than that of gallium in atomic percent, and gallium aluminum oxide refers to a material in which the amount of gallium is larger than or equal to that of aluminum in atomic percent.

For example, in the case of forming a gate insulating layer in contact with an oxide semiconductor layer containing gallium, a material containing gallium oxide may be used for the gate insulating layer, so that favorable characteristics can be kept at the interface between the oxide semiconductor layer and gate the insulating layer. In addition, when the oxide semiconductor layer and the insulating layer containing a gallium oxide are provided in contact with each other, pileup of hydrogen at the interface between the oxide semiconductor layer and the insulating layer can be reduced. Note that a similar effect can be obtained in the case where an element belonging to the same group as a constituent element of the oxide semiconductor is used for the insulating layer. For example, it is effective to form an insulating layer with the use of a material containing an aluminum oxide. Aluminum oxide has a property of not easily transmitting water. Thus, it is preferable to use the material including aluminum oxide in terms of preventing entry of water to the oxide semiconductor layer.

An insulating material of the insulating layer in contact with the oxide semiconductor layer 144 preferably contains oxygen at a proportion higher than that in the stoichiometric composition, by heat treatment in an oxygen atmosphere, oxygen doping, or the like. "Oxygen doping" refers to addition of oxygen into a bulk. Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk. The oxygen doping may be performed by using an ion implantation method or an ion doping method.

For example, in the case where the insulating layer in contact with the oxide semiconductor layer 144 is formed using gallium oxide, the composition of gallium oxide can be set to be $Ga_2O_x$ ($X=3+\alpha$, $0<\alpha<1$) by heat treatment in an oxygen atmosphere or oxygen doping. In the case where the insulating layer in contact with the oxide semiconductor layer 144 is formed using aluminum oxide, the composition of aluminum oxide can be set to be $Al_2O_x$ ($X=3+\alpha$, $0<\alpha<1$) by heat treatment in an oxygen atmosphere or oxygen doping. In the case where the insulating layer in contact with the oxide semiconductor layer 144 is formed using gallium aluminum oxide (or aluminum gallium oxide), the composition of gallium aluminum oxide (or aluminum gallium oxide) can be set to be $Ga_XAl_{2-X}O_{3+\alpha}$ ($0<X<2$, $0<\alpha<1$) by heat treatment in an oxygen atmosphere or oxygen doping.

By oxygen doping treatment or the like, an insulating layer including a region where the proportion of oxygen is higher than that in the stoichiometric composition can be formed. When the insulating layer including such a region is in contact with the oxide semiconductor layer, oxygen that exists excessively in the insulating layer is supplied to the oxide semiconductor layer, and oxygen deficiency in the oxide semiconductor layer or at an interface between the oxide semiconductor layer and the insulating layer can be reduced.

Note that instead of the gate insulating layer 146, the insulating layer including the region where the proportion of oxygen is higher than that in the stoichiometric composition may be used for an insulating layer serving as a base film of the oxide semiconductor layer 144 or may be used for both the gate insulating layer 146 and the base insulating layer.

After the gate insulating layer 146 is formed, second heat treatment is desirably performed in an inert gas atmosphere or an oxygen atmosphere. The temperature of the heat treatment is set to higher than or equal to 200° C. and lower than or equal to 450° C., preferably higher than or equal to 250° C. and lower than or equal to 350° C. For example, the heat treatment may be performed at 250° C. for 1 hour in a nitrogen atmosphere. The second heat treatment can reduce variation in electric characteristics of the transistor. Further, in the case where the gate insulating layer 146 contains oxygen, oxygen can be supplied to the oxide semiconductor layer 144 to cover oxygen deficiency in the oxide semiconductor layer 144.

Note that in this embodiment, the second heat treatment is performed after the gate insulating layer 146 is formed; however, the timing of the second heat treatment is not limited thereto. For example, the second heat treatment may be performed after the gate electrode is formed. Alternatively, the second heat treatment may be performed following the first heat treatment, the first heat treatment may double as the second heat treatment, or the second heat treatment may double as the first heat treatment By performing at least one of the first heat treatment and the second heat treatment as described above, the oxide semiconductor layer 144 can be highly purified so as to include the substance including a hydrogen atom as few as possible.

Figure 21D:
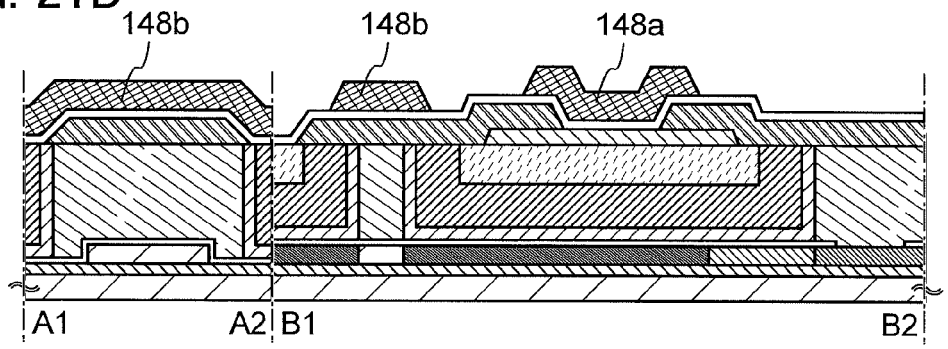

Next, a conductive layer for forming a gate electrode (including a wiring formed of the same layer as the gate electrode) is fowled and is processed, so that the gate electrode 148a and the conductive layer 148b are formed (see FIG. 21D).

The gate electrode 148a and the conductive layer 148b can be formed using a metal material such as molybdenum, titanium, tantalum, tungsten, aluminum, copper, neodymium, or scandium, or an alloy material containing any of these materials as a main component. Note that the gate electrode 148a and the conductive layer 148b may have a single-layer structure or a layered structure.

Figure 22A:
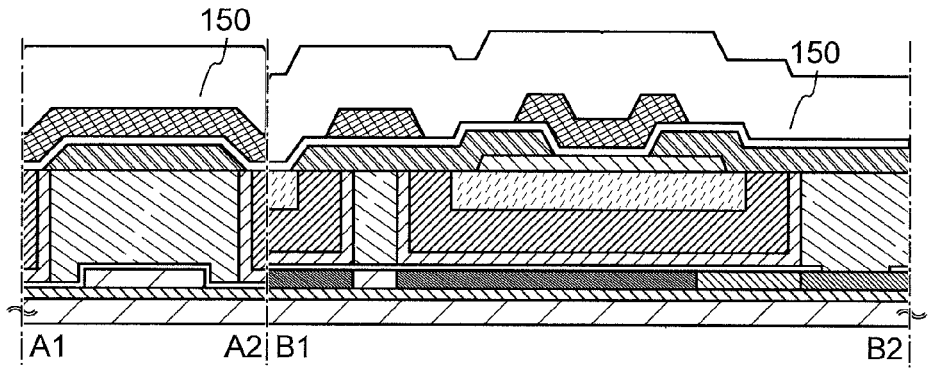
FIGS. 22A to 22C are cross-sectional views relating to manufacturing steps of a semiconductor device.
Figure 22B:
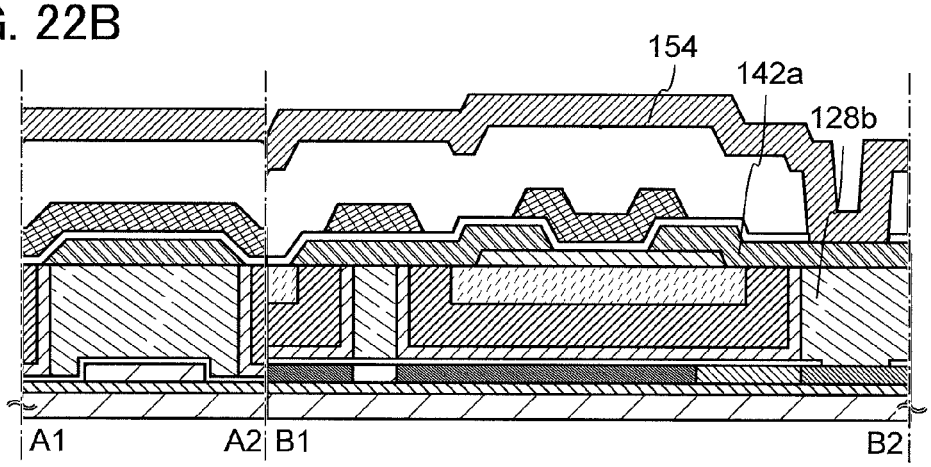

Next, the insulating layer 150 is formed over the gate insulating layer 146, the gate electrode 148a, and the conductive layer 148b (see FIG. 22A). The insulating layer 150 can be fanned by a PVD method, a CVD method, or the like. The insulating layer 150 can be formed using a material including an inorganic insulating material such as silicon oxide, silicon oxynitride, silicon nitride, hafnium oxide, gallium oxide, or aluminum oxide. Note that for the insulating layer 150, a material with a low dielectric constant may be preferably used or a structure with a low dielectric constant (e.g., a porous structure) may be preferably employed. This is because by reducing the dielectric constant of the insulating layer 150, capacitance between wirings and electrodes can be reduced, which will increase operation speed. Note that although the insulating layer 150 has a single-layer structure in this embodiment, one embodiment of the disclosed invention is not limited to this structure. The insulating layer 150 may have a layered structure including two or more layers.

Next, an opening reaching the source electrode 142a is formed in the gate insulating layer 146 and the insulating layer 150. Then, the wiring 154 connected to the source electrode 142*a* is formed over the insulating layer 150 (see FIG. 22B). The opening is formed by selective etching using a mask or the like.

A conductive layer is formed by a PVD method or a CVD method and then is patterned, so that the wiring 154 is formed. As a material for the conductive layer, an element selected from aluminum, chromium, copper, tantalum, titanium, molybdenum, and tungsten; an alloy containing any of these elements as a component; or the like can be used. Further, a material including one of manganese, magnesium, zirconium, beryllium, neodymium, and scandium or a combination of any of these elements may be used.

Specifically, it is possible to employ a method, for example, in which a thin titanium film (about 5 nm) is formed in a region including the opening of the insulating layer 150 by a PVD method, and then, an aluminum film is formed so as to be embedded in the openings. Here, the titanium film formed by a PVD method functions to reduce an oxide film (e.g., a natural oxide film) formed on a surface where the titanium film is formed, and to decrease the contact resistance with a lower electrode or the like (here, the source electrode 142*a*). In addition, hillock of the aluminum film can be prevented. A copper film may be formed by a plating method after the formation of the barrier film of titanium, titanium nitride, or the like.

The opening formed in the insulating layer 150 is preferably formed in a region overlapping with the conductive layer 128*b*. With the opening in such a region, the element area can be prevented from increasing due to contact regions.

Here, the case where a connection position of the impurity region 126 and the source electrode 142*a* and a connection position of the source electrode 142*a* and the wiring 154 overlap with each other without using the conductive layer 128*b* will be described. In this case, an opening (also referred to as a contact in a lower portion) is formed in the insulating layer 136, the insulating layer 138, and the insulating layer 140 that are formed over the impurity region 126, and the source electrode 142*a* is formed in the contact in the lower portion. Then, an opening (also referred to as a contact in an upper portion) is formed in a region overlapping with the contact in the lower portion in the gate insulating layer 146 and the insulating layer 150, and then the wiring 154 is formed. When the contact in the upper portion is formed in the region overlapping with the contact in the lower portion, the source electrode 142*a* formed in the contact in the lower portion by etching might be disconnected. In order to avoid the disconnection, the contacts in the lower portion and in the upper portion are formed so as not to overlap with each other, so that a problem of the increase in the element area occurs.

As described in this embodiment, with the use of the conductive layer 128*b*, the contact in the upper portion can be formed without disconnection of the source electrode 142*a*. Thus, the contacts in the lower portion and in the upper portion can be formed overlapping with each other, so that the element area can be prevented from increasing due to contact regions. In other words, the integration degree of the semiconductor device can be increased.

Figure 22C:
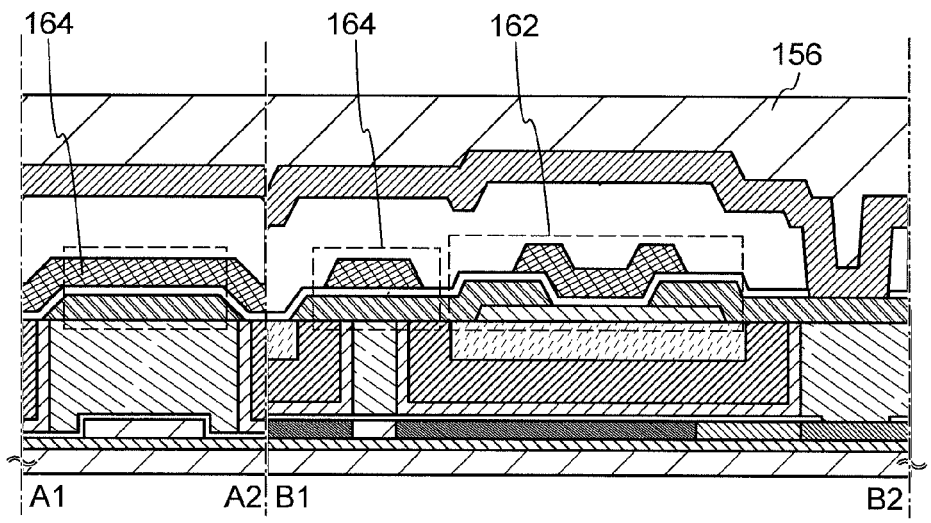

Next, an insulating layer 156 is formed so as to cover the wiring 154 (see FIG. 22C).

Through the above steps, the transistor 162 and the capacitor 164 including the highly purified oxide semiconductor layer 144 are completed (see FIG. 22C).

Next, an example of a transistor which can be used as the transistor 162 illustrated in FIGS. 17A and 17B is described.

Figure 26A:
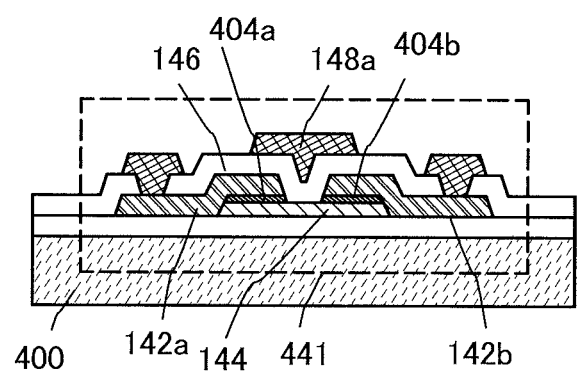
FIGS. 26A and 26B are cross-sectional views of a semiconductor device.
Figure 26B:
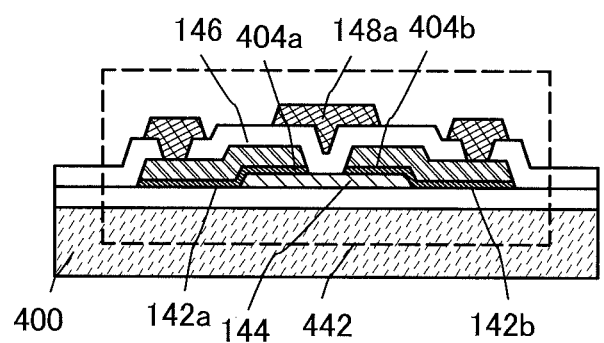

Oxide conductive layers serving as a source region and a drain region may be provided as buffer layers between the oxide semiconductor layer 144 and the source electrode 142*a* and between the oxide semiconductor layer 144 and the drain electrode 142*b*. Transistors 441 and 442 each having the structure of the transistor 162 in which oxide conductive layers are provided are illustrated in FIGS. 26A and 26B. Note that an insulating layer 400 corresponds to the insulating layer 136, the insulating layer 138, the insulating layer 140, or the like.

In each of the transistors 441 and 442 in FIGS. 26A and 26B, oxide conductive layers 404*a* and 404*b* serving as a source region and a drain region are provided between the oxide semiconductor layer 144 and the source electrode 142*a* and between the oxide semiconductor layer 144 and the drain electrode 142*b*. The shapes of the oxide conductive layers 404*a* and 404*b* are different between the transistors 441 and 442 of FIGS. 26A and 26B because of the difference between their manufacturing processes.

As for the transistor 441 of FIG. 26A, a stack of an oxide semiconductor film and an oxide conductive film is formed and the shape of the stack is processed to form the island-shaped oxide semiconductor layer 144 and the island-shaped oxide conductive film through the same photolithography step. The source electrode 142*a* and the drain electrode 142*b* are formed over the oxide semiconductor layer and the oxide conductive film. Then, the island-shaped oxide conductive film is etched with the use of the source electrode 142*a* and the drain electrode 142*b* as masks to form the oxide semiconductor conductive layers 404*a* and 404*b* serving as the source region and the drain region.

As for the transistor 442 in FIG. 26B, an oxide conductive film is formed over the oxide semiconductor layer 144, and a metal conductive film is formed thereover. Then, the oxide conductive film and the metal conductive film are processed through the same photolithography step to form the oxide conductive layers 404*a* and 404*b* serving as the source region and the drain region, the source electrode 142*a*, and the drain electrode 142*b*.

Note that in the etching for processing the shape of the oxide conductive layer, etching conditions (such as the kind of an etchant, the concentration, or the etching time) are adjusted as appropriate so that the oxide semiconductor layer is not excessively etched.

As the formation method of the oxide conductive layers 404*a* and 404*b*, a sputtering method, a vacuum evaporation method (an electron beam evaporation method or the like), an arc discharge ion plating method, or a spray method is used. As a material of the oxide conductive layers, zinc oxide, zinc aluminum oxide, zinc aluminum oxynitride, zinc gallium oxide, indium tin oxide containing silicon oxide, or the like can be used. In addition, the above materials may contain silicon oxide.

When the oxide conductive layers are provided as the source region and the drain region between the oxide semiconductor layer 144 and the source electrode 142*a* and between the oxide semiconductor layer 144 and the drain electrode 142*b*, the source region and the drain region can have lower resistance and the transistors 441 and 442 can operate at high speed.

With the structure including the oxide semiconductor layer 144, the oxide conductive layers 404*a* and 404*b*, the source electrode 142*a*, and the drain electrode 142*b*, withstand voltages of the transistors 441 and 442 can be improved.

Figure 28A:
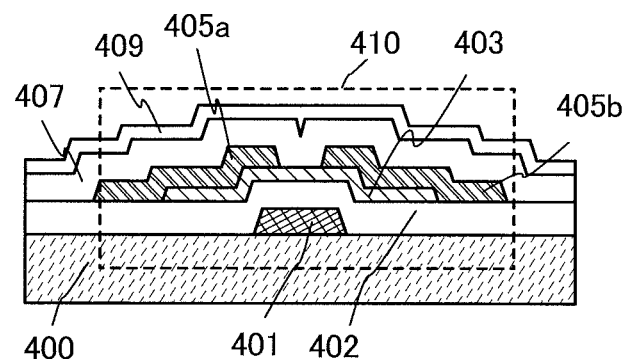
FIGS. 28A to 28C are cross-sectional views of a semiconductor device.
Figure 28B:
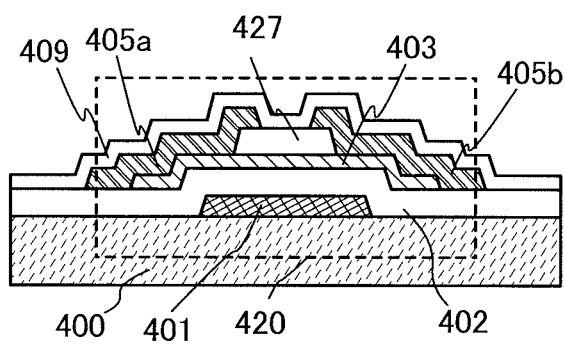
Figure 28C:
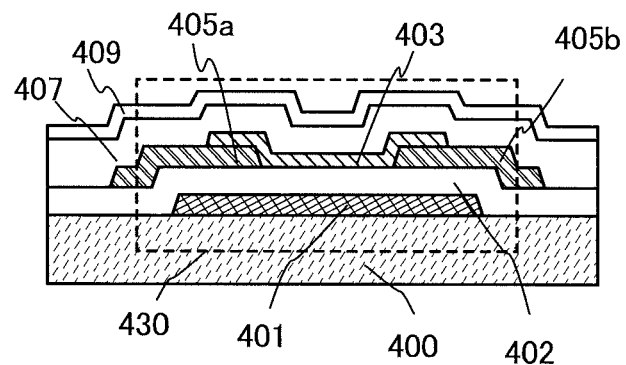

Next, a top-gate structure is employed as the structure of the transistor 162 illustrated in FIGS. 17A and 17B; however, one embodiment of the present invention is not limited thereto, and a bottom gate structure can be employed. FIGS. 28A to 28C illustrate examples of a bottom-gate structure.

In a transistor 410 illustrated in FIG. 28A, a gate insulating layer 402 is provided over the gate electrode 401, an oxide semiconductor layer 403 is provided over the gate insulating layer 402, and a source electrode 405a and a drain electrode 405b which are connected to the oxide semiconductor layer 403 are provided. Note that the gate electrode 401, the oxide semiconductor layer 403, the gate insulating layer 402, the source electrode 405a, and the drain electrode 405b correspond to the gate electrode 148a, the oxide semiconductor layer 144, the gate insulating layer 146, the source electrode 142a, and the drain electrode 142b in FIGS. 17A and 17B, respectively.

A transistor 420 illustrated in FIG. 28B are the same as the transistor of FIG. 28A in that the gate electrode 401, the gate insulating layer 402, the oxide semiconductor layer 403, the source electrode 405a, and the drain electrode 405b are provided. The transistor 420 in FIG. 28B is different point from the transistor 410 in FIG. 28A in that an insulating layer 427 is provided in contact with the oxide semiconductor layer 403.

A transistor 430 illustrated in FIG. 28C is the same as the transistor of FIG. 28A in that the gate electrode 401, the gate insulating layer 402, the oxide semiconductor layer 403, the source electrode 405a, and the drain electrode 405b are provided. A difference between the transistor 430 in FIG. 28C and the transistor 410 in FIG. 28A is positions where the source electrode 405a and the drain electrode 405b are in contact with the oxide semiconductor layer 403. In other words, the source electrode 405a and the drain electrode 405b are provided over and in contact with the oxide semiconductor layer 403 in the transistor 410 illustrated in FIG. 28A, whereas the source electrode 405a and the drain electrode 405b are provided below and in contact with the oxide semiconductor layer 403 in FIG. 28C.

Since the oxide semiconductor layer 144 is highly purified in the transistor 162 described in this embodiment, the hydrogen concentration is lower than or equal to $5 \times 10^{19}$ atoms/cm$^3$, preferably lower than or equal to $5 \times 10^{18}$ atoms/cm$^3$, more preferably lower than or equal to $5 \times 10^{17}$ atoms/cm$^3$. In addition, since oxygen deficiency is reduced by the reduction of hydrogen, water, and the like in the oxide semiconductor layer 144, the value of the carrier density of the oxide semiconductor layer 144 is sufficiently small (e.g., lower than $1 \times 10^{12}$/cm$^3$, preferably lower than $1.45 \times 10^{10}$/cm$^3$) as compared with the carrier density of a general silicon wafer (approximately $1 \times 10^{14}$/cm$^3$). The off-state current of the transistor 162 is also sufficiently small. For example, the off-state current (here, per unit channel width (1 μm)) at room temperature (25° C.) is lower than or equal to 100 zA (1 zA (zeptoampere) is $1 \times 10^{-21}$ A), preferably lower than or equal to 10 zA.

By using the oxide semiconductor layer 144 which is highly purified in this manner, it becomes easy to sufficiently reduce the off-state current of the transistor. Then, by using such a transistor, a semiconductor device in which stored data can be held for an extremely long time can be obtained.

The structures and methods described in this embodiment can be combined as appropriate with any of the structures and methods described in the other embodiments.

(Embodiment 3)

Figure 27A:
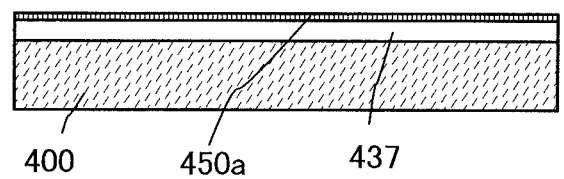
FIGS. 27A to 27C are cross-sectional views relating to manufacturing steps of a semiconductor device.
Figure 27B:
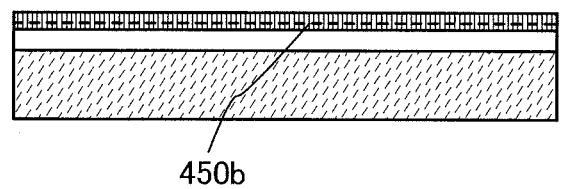

One embodiment of an oxide semiconductor layer which can be used as any of the semiconductor layers of the transistors in the above embodiments will be described with reference to FIGS. 27A to 27C.

The oxide semiconductor layer of this embodiment has a structure including a first crystalline oxide semiconductor layer and a second crystalline oxide semiconductor layer which is stacked over the first crystalline oxide semiconductor layer and is thicker than the first crystalline oxide semiconductor layer.

An insulating layer 437 is formed over the insulating layer 400. In this embodiment, an oxide insulating layer with a thickness greater than or equal to 50 nm and less than or equal to 600 nm is formed as the insulating layer 437 by a PCVD method or a sputtering method. For example, a single layer selected from a silicon oxide film, a gallium oxide film, an aluminum oxide film, a silicon oxynitride film, an aluminum oxynitride film, and a silicon nitride oxide film or a stack of any of these films can be used. Note that an insulating layer 400 corresponds to the insulating layer 136, the insulating layer 138, the insulating layer 140, or the like.

Next, a first oxide semiconductor film with a thickness greater than or equal to 1 nm and less than or equal to 10 nm is formed over the insulating layer 437. The first oxide semiconductor film is formed by a sputtering method, and the substrate temperature in the film formation by a sputtering method is set to be higher than or equal to 200° C. and lower than or equal to 400° C.

In this embodiment, the first oxide semiconductor film is formed to a thickness of 5 nm in an oxygen atmosphere, an argon atmosphere, or an atmosphere including argon and oxygen under conditions where a target for an oxide semiconductor (a target for an In—Ga—Zn—O-based oxide semiconductor including $In_2O_3$, $Ga_2O_3$, and ZnO at 1:1:2 [molar ratio]) is used, the distance between the substrate and the target is 170 mm, the substrate temperature is 250° C., the pressure is 0.4 Pa, and the direct current (DC) power is 0.5 kW.

Next, first heat treatment is performed under a condition where the atmosphere of a chamber in which the substrate is set is an atmosphere of nitrogen or dry air. The temperature of the first heat treatment is higher than or equal to 400° C. and lower than or equal to 750° C. Through the first heat treatment, a first crystalline oxide semiconductor layer 450a is formed (see FIG. 27A).

Depending on the substrate temperature at the time of deposition or the temperature of the first heat treatment, the first heat treatment causes crystallization from a film surface and crystal grows from the film surface toward the inside of the film; thus, c-axis aligned crystal is obtained. By the first heat treatment, large amounts of zinc and oxygen gather to the film surface, and one or more layers of graphene-type two-dimensional crystal including zinc and oxygen and having a hexagonal upper plane are formed at the outermost surface; the layer(s) at the outermost surface grow in the thickness direction to form a stack of layers. By increasing the temperature of the heat treatment, crystal growth proceeds from the surface to the inside and further from the inside to the bottom.

By the first heat treatment, oxygen in the insulating layer 437 that is an oxide insulating layer is diffused to an interface between the insulating layer 437 and the first crystalline oxide semiconductor layer 450a or the vicinity of the interface (within ±5 nm from the interface), whereby oxygen deficiency in the first crystalline oxide semiconductor layer is reduced. Therefore, it is preferable that oxygen be included in (in a bulk of) the insulating layer 437 used as a base insulating layer or at the interface between the first crystalline oxide semiconductor layer 450a and the insulating layer 437 at an amount that exceeds at least the amount of oxygen in the stoichiometric composition ratio.

Next, a second oxide semiconductor film with a thickness more than 10 nm is formed over the first crystalline oxide semiconductor layer 450a. The second oxide semiconductor film is formed by a sputtering method, and the substrate temperature in the film formation is set to be higher than or equal to 200° C. and lower than or equal to 400° C. By setting the substrate temperature in the film formation to be higher than or equal to 200° C. and lower than or equal to 400° C., precursors can be arranged in the oxide semiconductor layer formed over and in contact with the surface of the first crystalline oxide semiconductor layer and so-called orderliness can be obtained.

In this embodiment, the second oxide semiconductor film is formed to a thickness of 25 nm in an oxygen atmosphere, an argon atmosphere, or an atmosphere including argon and oxygen under conditions where a target for an oxide semiconductor (a target for an In—Ga—Zn—O-based oxide semiconductor including $In_2O_3$, $Ga_2O_3$, and ZnO at 1:1:2 [molar ratio]) is used, the distance between the substrate and the target is 170 mm, the substrate temperature is 400° C., the pressure is 0.4 Pa, and the direct current (DC) power is 0.5 kW.

Next, second heat treatment is performed under a condition where the atmosphere of a chamber in which the substrate is set is a nitrogen atmosphere, an oxygen atmosphere, or a mixed atmosphere of nitrogen and oxygen. The temperature of the second heat treatment is higher than or equal to 400° C. and lower than or equal to 750° C. Through the second heat treatment, a second crystalline oxide semiconductor layer 450b is formed (see FIG. 27B). The second heat treatment is performed in a nitrogen atmosphere, an oxygen atmosphere, or a mixed atmosphere of nitrogen and oxygen, whereby the density of the second crystalline oxide semiconductor layer is increased and the number of defects therein is reduced. By the second heat treatment, crystal growth proceeds in the thickness direction with the use of the first crystalline oxide semiconductor layer 450a as a nucleus, that is, crystal growth proceeds from the bottom to the inside; thus, the second crystalline oxide semiconductor layer 450b is formed.

It is preferable that steps from the formation of the insulating layer 437 to the second heat treatment be successively performed without exposure to the air. The steps from the formation of the insulating layer 437 to the second heat treatment are preferably performed in an atmosphere which is controlled to include little hydrogen and moisture (such as an inert gas atmosphere, a reduced-pressure atmosphere, or a dry-air atmosphere); in terms of moisture, for example, a dry nitrogen atmosphere with a dew point of −40° C. or lower, preferably a dew point of −50° C. or lower may be employed.

Figure 27C:
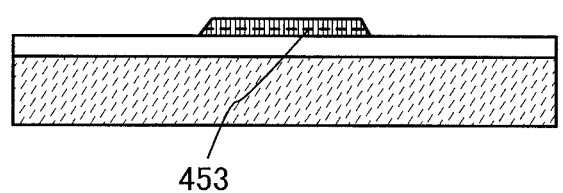

Next, the stack of the oxide semiconductor layers, the first crystalline oxide semiconductor layer 450a and the second crystalline oxide semiconductor layer 450b, is processed into an oxide semiconductor layer 453 including a stack of island-shaped oxide semiconductor layers (see FIG. 27C). In the drawing, the interface between the first crystalline oxide semiconductor layer 450a and the second crystalline oxide semiconductor layer 450b is indicated by a dotted line, and the first crystalline oxide semiconductor layer 450a and the second crystalline oxide semiconductor layer 450b are illustrated as a stack of oxide semiconductor layers; however, the interface is actually not distinct and is illustrated for easy understanding.

The stack of the oxide semiconductor layers can be processed by being etched after a mask having a desired shape is formed over the stack of the oxide semiconductor layers. The mask can be formed by a method such as photolithography. Alternatively, the mask may be formed by a method such as an ink-jet method.

For the etching of the stack of the oxide semiconductor layers, either dry etching or wet etching may be employed. Needless to say, both of them may be employed in combination.

A feature of the first crystalline oxide semiconductor layer and the second crystalline oxide semiconductor layer obtained by the above formation method is that they have c-axis alignment. Note that the first crystalline oxide semiconductor layer and the second crystalline oxide semiconductor layer comprise an oxide including a crystal with c-axis alignment (also referred to as C-Axis Aligned Crystal (CAAC)), which has neither a single crystal structure nor an amorphous structure. The first crystalline oxide semiconductor layer and the second crystalline oxide semiconductor layer partly include a crystal grain boundary.

Note that examples of a material for the first crystalline oxide semiconductor layer and the second crystalline oxide semiconductor layer include a four-component metal oxide such as an In—Sn—Ga—Zn—O-based material; three-component metal oxides such as an In—Ga—Zn—O-based material (also referred to as IGZO), an In—Sn—Zn—O-based material (also referred to as ITZO), an In—Al—Zn—O-based material, a Sn—Ga—Zn—O-based material, an Al—Ga—Zn—O-based material, a Sn—Al—Zn—O-based material, an In—Hf—Zn—O-based material, an In—La—Zn—O-based material, an In—Ce—Zn—O-based material, an In—Pr—Zn—O-based material, an In—Nd—Zn—O-based material, an In—Sm—Zn—O-based material, an In—Eu—Zn—O-based material, an In—Gd—Zn—O-based material, an In—Tb—Zn—O-based material, an In—Dy—Zn—O-based material, an In—Ho—Zn—O-based material, an In—Er—Zn—O-based material, an In—Tm—Zn—O-based material, an In—Yb—Zn—O-based material, and an In—Lu—Zn—O-based material; two-component metal oxides such as an In—Zn—O-based material, a Sn—Zn—O-based material, an Al—Zn—O-based material, a Zn—Mg—O-based material, a Sn—Mg—O-based material, an In—Mg—O-based material, and an In—Ga—O-based material; and single-component metal oxides such as an In—O-based material, a Sn—O-based material, and a Zn—O-based material. In addition, the above materials may include $SiO_2$. Here, for example, an In—Ga—Zn—O-based material means an oxide film including indium (In), gallium (Ga), and zinc (Zn), and there is no particular limitation on the composition ratio. Further, the In—Ga—Zn—O-based material may include an element other than In, Ga, and Zn.

Without limitation to the two-layer structure in which the second crystalline oxide semiconductor layer is formed over the first crystalline oxide semiconductor layer, a stacked structure including three or more layers may be formed by repeatedly performing a process of film formation and heat treatment for forming a third crystalline oxide semiconductor layer after the second crystalline oxide semiconductor layer is formed.

The oxide semiconductor layer 453 including the stack of the oxide semiconductor layers formed by the above formation method can be used as appropriate for a transistor (e.g., the transistor 162 in Embodiments 1 and 2, the transistors 410, 420, 430, 441, and 442 in Embodiment 2) which can be applied to a semiconductor device disclosed in this specification.

In the transistor 162 in Embodiment 2, in which the stack of the oxide semiconductor layers of this embodiment is used as the oxide semiconductor layer 403, an electric field is not applied from one surface to the other surface of the oxide semiconductor layer and current does not flow in the thickness direction (from one surface to the other surface, specifically, in the vertical direction in the transistor 162 in FIGS. 17A and 17B) of the stack of the oxide semiconductor layers. The transistor has a structure in which current mainly flows along the interface of the stack of the oxide semiconductor layers; therefore, even when the transistor is irradiated with light or even when a BT stress is applied to the transistor, deterioration of transistor characteristics is suppressed or reduced.

By forming a transistor with the use of a stack of a first crystalline oxide semiconductor layer and a second crystalline oxide semiconductor layer, like the oxide semiconductor layer 453, the transistor can have stable electric characteristics and high reliability.

This embodiment can be implemented in an appropriate combination with any of the structures described in the other embodiments.

(Embodiment 4)

In this embodiment, an oxide including a crystal with c-axis alignment (also referred to as C-Axis Aligned Crystal (CAAC)), which has a triangular or hexagonal atomic arrangement when seen from the direction of an a-b plane, a surface, or an interface will be described. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis).

In a broad sense, an oxide including CAAC means a non-single-crystal oxide including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC oxide is not a single crystal oxide, but this does not mean that the CAAC oxide is composed of only an amorphous component. Although the CAAC oxide includes a crystallized portion (crystalline portion), a boundary between one crystalline portion and another crystalline portion is not clear in some cases.

In the case where oxygen is included in the CAAC, nitrogen may be substituted for part of oxygen included in the CAAC. The c-axes of individual crystalline portions included in the CAAC oxide may be aligned in one direction (e.g., a direction perpendicular to a surface of a substrate over which the CAAC oxide is formed or a surface of the CAAC oxide). Alternatively, the normals of the a-b planes of the individual crystalline portions included in the CAAC oxide may be aligned in one direction (e.g., a direction perpendicular to a surface of a substrate over which the CAAC oxide is formed or a surface of the CAAC oxide).

The CAAC oxide becomes a conductor, a semiconductor, or an insulator depending on its composition or the like. The CAAC oxide transmits or does not transmit visible light depending on its composition or the like.

As an example of such a CAAC, there is a crystal which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

An example of a crystal structure of the CAAC oxide will be described in detail with reference to FIGS. 29A to 29E, FIGS. 30A to 30C, and FIGS. 31A to 31C. In FIGS. 29A to 29E, FIGS. 30A to 30C, and FIGS. 31A to 31C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 29A to 29E, O surrounded by a circle represents tetracoordinate O and O surrounded by a double circle represents tricoordinate O.

Figure 29A:
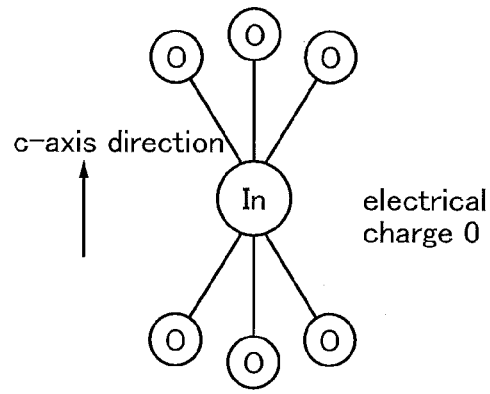
FIGS. 29A to 29E are diagrams each illustrating a structure of an oxide material.

FIG. 29A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 29A is actually an octahedral structure, but is illustrated as a planar structure for simplicity. Note that three tetracoordinate O atoms exist in each of an upper half and a lower half in FIG. 29A. In the small group illustrated in FIG. 29A, charge is 0.

Figure 29D:
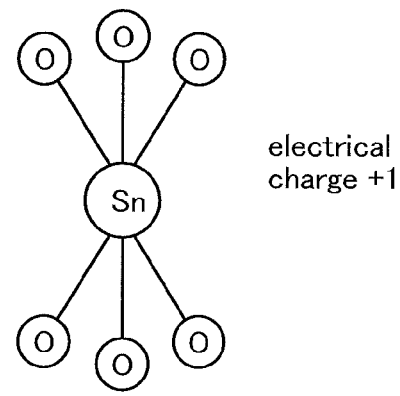
Figure 29B:
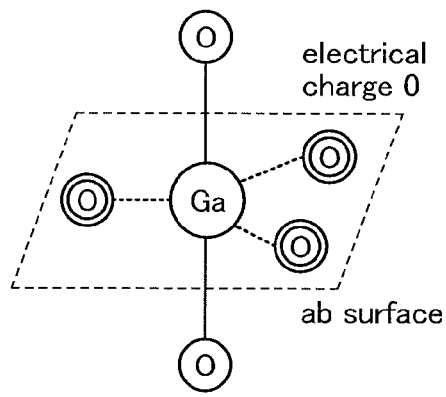

FIG. 29B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 29B. An In atom can also have the structure illustrated in FIG. 29B because an In atom can have five ligands. In the small group illustrated in FIG. 29B, charge is 0.

Figure 29E:
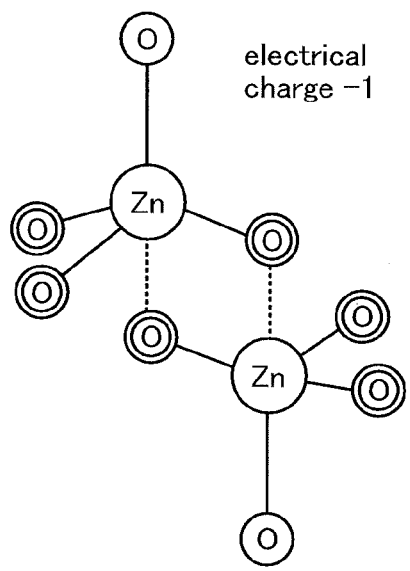
Figure 29C:
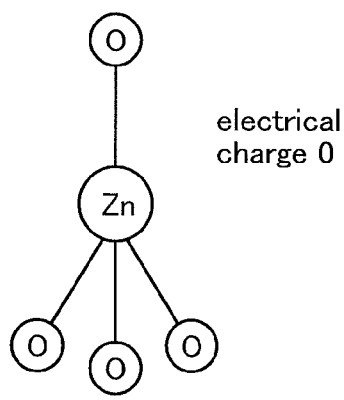

FIG. 29C illustrates a structure including one tetracoordinate Zn atom and four tetracoordinate O atoms proximate to the Zn atom. In FIG. 29C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 29C. In the small group illustrated in FIG. 29C, charge is 0.

FIG. 29D illustrates a structure including one hexacoordinate Sn atom and six tetracoordinate O atoms proximate to the Sn atom. In FIG. 29D, three tetracoordinate O atoms exist in each of an upper half and a lower half. In the small group illustrated in FIG. 29D, charge is +1.

FIG. 29E illustrates a small group including two Zn atoms. In FIG. 29E, one tetracoordinate O atom exists in each of an upper half and a lower half In the small group illustrated in FIG. 29E, charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 29A each have three proximate In atoms in the downward direction, and the three O atoms in the lower half each have three proximate In atoms in the upward direction. The one O atom in the upper half with respect to the pentacoordinate Ga atom has one proximate Ga atom in the downward direction, and the one O atom in the lower half has one proximate Ga atom in the upward direction. The one O atom in the upper half with respect to the tetracoordinate Zn atom has one proximate Zn atom in the downward direction, and the three O atoms in the lower half each have three proximate Zn atoms in the upward direction. In this manner, the number of the tetracoordinate O atoms proximate to and above the metal atom is equal to the number of the metal atoms proximate to and below each of the tetracoordinate O atoms. Similarly, the number of the tetracoordinate O atoms proximate to and below the metal atom is equal to the number of the metal atoms proximate to and above each of the tetracoordinate O atoms. Since O atoms contributing the binding between the small groups are the coordination number of the tetracoordinate O atom, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total charge of the layered structure is 0.

FIG. 30A illustrates a model of a medium group included in a layered structure of an In—Sn—Zn—O-based material. FIG. 30B illustrates a large group including three medium groups. Note that FIG. 30C illustrates an atomic arrangement in the case where the layered structure in FIG. 30B is observed from the c-axis direction.

In FIG. 30A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 30A, one tetracoordinate O atom existing in each of an upper half and a lower half with respect to an In atom is denoted by circled 1. FIG. 30A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based material in FIG. 30A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups is bonded, so that a large group is formed.

Here, charge for one bond of a tricoordinate O atom and charge for one bond of a tetracoordinate O atom can be assumed to be −0.667 and −0.5, respectively. For example, charge of a (hexacoordinate or pentacoordinate) In atom, charge of a (tetracoordinate) Zn atom, and charge of a (pentacoordinate or hexacoordinate) Sn atom are +3, +2, and +4, respectively. Consequently, charge in a small group including a Sn atom is +1. Therefore, charge of −1, which cancels +1, is needed to form a layered structure including a Sn atom. As a structure having charge of −1, the small group including two Zn atoms as illustrated in FIG. 29E can be given. For example, with one small group including two Zn atoms, charge of one small group including a Sn atom can be cancelled, so that the total charge of the layered structure can be 0.

When the large group illustrated in FIG. 30B is repeated, an In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_7(ZnO)_m$ (m is 0 or a natural number).

The above-described rule also applies to the following oxide materials: a four-component metal oxide material such as an In—Sn—Ga—Zn—O-based material; a three-component metal oxide material such as an In—Ga—Zn—O-based material (also referred to as IGZO), an In—Al—Zn—O-based material, a Sn—Ga—Zn—O-based material, an Al—Ga—Zn—O-based material, a Sn—Al—Zn—O-based material, an In—Hf—Zn—O-based material, an In—La—Zn—O-based material, an In—Ce—Zn—O-based material, an In—Pr—Zn—O-based material, an In—Nd—Zn—O-based material, an In—Sm—Zn—O-based material, an In—Eu—Zn—O-based material, an In—Gd—Zn—O-based material, an In—Tb—Zn—O-based material, an In—Dy—Zn—O-based material, an In—Ho—Zn—O-based material, an In—Er—Zn—O-based material, an In—Tm—Zn—O-based material, an In—Yb—Zn—O-based material, or an In—Lu—Zn—O-based material; or a two-component metal oxide material such as an In—Zn—O-based material, a Sn—Zn—O-based material, an Al—Zn—O-based material, a Zn—Mg—O-based material, a Sn—Mg—O-based material, an In—Mg—O-based material, or an In—Ga—O-based material.

Figure 31A:
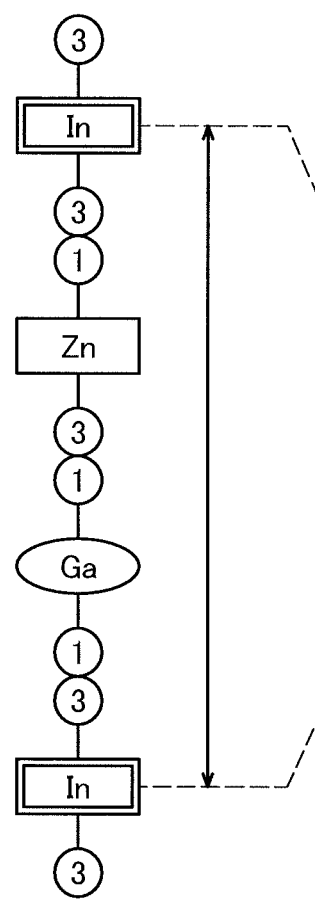
FIGS. 31A to 31C are diagrams illustrating a structure of an oxide material.

As an example, FIG. 31A illustrates a model of a medium group included in a layered structure of an In—Ga—Zn—O-based material.

In the medium group included in the layered structure of the In—Ga—Zn—O-based material in FIG. 31A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate atoms in each of an upper half and a lower half through one tetracoordinate O atom in a lower half with respect to the Ga atom. A plurality of such medium groups is bonded, so that a large group is formed.

Figure 31B:
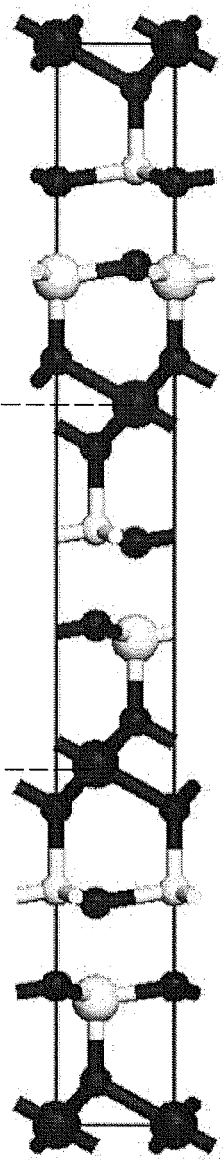
Figure 31C:
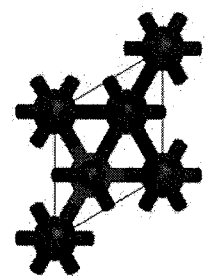

FIG. 31B illustrates a large group including three medium groups. Note that FIG. 31C illustrates an atomic arrangement in the case where the layered structure in FIG. 31B is observed from the c-axis direction.

Here, since charge of a (hexacoordinate or pentacoordinate) In atom, charge of a (tetracoordinate) Zn atom, and charge of a (pentacoordinate) Ga atom are +3, +2, and +3, respectively, charge of a small group including any of an In atom, a Zn atom, and a Ga atom is 0. As a result, the total charge of a medium group having a combination of such small groups is always 0.

In order to form the layered structure of the In—Ga—Zn—O-based material, a large group can be formed using not only the medium group illustrated in FIG. 31A but also a medium group in which the arrangement of the In atom, the Ga atom, and the Zn atom is different from that in FIG. 31A.

(Embodiment 5)

In this embodiment, the field-effect mobility of a transistor is described.

The actually measured field-effect mobility of an insulated gate transistor can be lower than its original mobility because of a variety of reasons; this phenomenon occurs not only in the case of using an oxide semiconductor. One of the reasons that reduce the mobility is a defect inside a semiconductor or a defect at an interface between the semiconductor and an insulating film. When a Levinson model is used, the field-effect mobility on the assumption that no defect exists inside the semiconductor can be calculated theoretically.

Assuming that the original mobility and the measured field-effect mobility of a semiconductor are $\mu_0$ and $\mu$, respectively, and a potential barrier (such as a grain boundary) exists in the semiconductor, the measured field-effect mobility can be expressed as the following formula.

$$\mu = \mu_0 \exp\left(-\frac{E}{kT}\right) \quad \text{[FORMULA 2]}$$

Here, E represents the height of the potential barrier, k represents the Boltzmann constant, and T represents the absolute temperature. When the potential barrier is assumed to be attributed to a defect, the height of the potential barrier can be expressed as the following formula according to the Levinson model.

$$E = \frac{e^2 N^2}{8\varepsilon n} = \frac{e^3 N^2 t}{8\varepsilon C_{ox} V_g} \quad \text{[FORMULA 3]}$$

Here, e represents the elementary charge, N represents the average defect density per unit area in a channel, c represents the dielectric constant of the semiconductor, n represents the number of carriers per unit area in the channel, $C_{ox}$ represents the capacitance per unit area, $V_g$ represents the gate voltage, and t represents the thickness of the channel. In the case where the thickness of the semiconductor layer is less than or equal to 30 nm, the thickness of the channel may be regarded as being the same as the thickness of the semiconductor layer. The drain current $I_d$ in a linear region can be expressed as the following formula.

$$I_d = \frac{W \mu V_g V_d C_{ox}}{L} \exp\left(-\frac{E}{kT}\right) \quad \text{[FORMULA 4]}$$

Here, L represents the channel length and W represents the channel width, and L and W are each 10 μm. In addition, $V_d$ represents the drain voltage. When dividing both sides of the above equation by $V_g$ and then taking logarithms of both sides, the following formula can be obtained.

$$\ln\left(\frac{I_d}{V_g}\right) = \ln\left(\frac{W \mu V_d C_{ox}}{L}\right) - \frac{E}{kT} \quad \text{[FORMULA 5]}$$

-continued
$$= \ln\left(\frac{W \mu V_d C_{ox}}{L}\right) - \frac{e^3 N^2 t}{8kT\varepsilon C_{ox} V_g}$$

The right side of Formula 5 is a function of $V_g$. From the formula, it is found that the defect density N can be obtained from the slope of a line in a graph which is obtained by plotting actual measured values with $\ln(I_d/V_g)$ as the ordinate and $1/V_g$ as the abscissa. That is, the defect density can be evaluated from the $I_d$-$V_g$ characteristics of the transistor. The defect density N of an oxide semiconductor in which the ratio of indium (In), tin (Sn), and zinc (Zn) is 1:1:1 is approximately $1 \times 10^{12}/cm^2$.

On the basis of the defect density obtained in this manner, or the like, $\mu_0$ can be calculated to be 120 cm²/Vs from Formula 2 and Formula 3. The measured mobility of an In—Sn—Zn oxide including a defect is approximately 35 cm²/Vs. However, assuming that no defect exists inside the semiconductor and at the interface between the semiconductor and an insulating film, the mobility $\mu_0$ of the oxide semiconductor is expected to be 120 cm²/Vs.

Note that even when no defect exists inside a semiconductor, scattering at an interface between a channel and a gate insulating layer affects the transport property of the transistor. In other words, the mobility $\mu_1$ at a position that is distance x away from the interface between the channel and the gate insulating layer can be expressed as the following formula.

$$\frac{1}{\mu_1} = \frac{1}{\mu_0} + \frac{D}{B}\exp\left(-\frac{x}{G}\right) \quad \text{[FORMULA 6]}$$

Here, D represents the electric field in the gate direction, and B and G are constants. B and G can be obtained from actual measurement results; according to the above measurement results, B is $4.75 \times 10^7$ cm/s and G is 10 nm (the depth to which the influence of interface scattering reaches). When D is increased (i.e., when the gate voltage is increased), the second term of Formula 6 is increased and accordingly the mobility $\mu_1$ is decreased.

Figure 32:
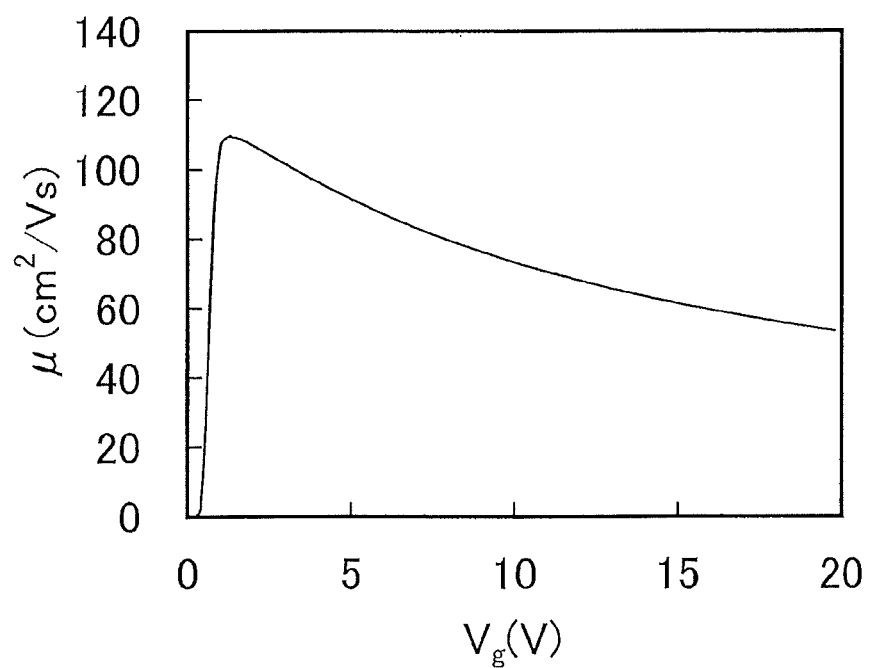
FIG. 32 is a graph showing the gate voltage dependence of mobility obtained from a calculation.

Calculation results of the mobility $\mu_2$ of a transistor whose channel includes an ideal oxide semiconductor without a defect inside the semiconductor are shown in FIG. 32. For the calculation, device simulation software Sentaurus Device manufactured by Synopsys, Inc. was used, and the bandgap, the electron affinity, the relative dielectric constant, and the thickness of the oxide semiconductor were assumed to be 2.8 eV, 4.7 eV, 15, and 15 nm, respectively. These values were obtained by measurement of a thin film that was formed by a sputtering method.

Further, the work functions of a gate, a source, and a drain were assumed to be 5.5 eV, 4.6 eV, and 4.6 eV, respectively. The thickness of a gate insulating layer was assumed to be 100 nm, and the relative dielectric constant thereof was assumed to be 4.1. The channel length and the channel width were each assumed to be 10 μm, and the drain voltage $V_d$ was assumed to be 0.1 V.

As shown in FIG. 32, the mobility has a peak of more than or equal to 100 cm²/Vs at a gate voltage that is a little over 1 V and is decreased as the gate voltage becomes higher because the influence of interface scattering is increased. Note that in order to reduce interface scattering, it is desirable that a surface of the semiconductor layer be flat at the atomic level (atomic layer flatness).

Calculation results of characteristics of minute transistors which are manufactured using an oxide semiconductor having such a mobility are shown in FIGS. 33A to 33C, FIGS. 34A to 34C, and FIGS. 35A to 35C. FIGS. 36A and 36B illustrate cross-sectional structures of the transistors used for the calculation. The transistors illustrated in FIGS. 36A and 36B each include a semiconductor region 1103a and a semiconductor region 1103c which have n+-type conductivity in an oxide semiconductor layer. The resistivities of the semiconductor region 1103a and the semiconductor region 1103c are $2\times10^{-3}$ Ωcm.

The transistor illustrated in FIG. 36A is formed over a base insulating layer 1101 and an embedded insulator 1102 which is embedded in the base insulating layer 1101 and formed of aluminum oxide. The transistor includes the semiconductor region 1103a, the semiconductor region 1103c, an intrinsic semiconductor region 1103b serving as a channel formation region therebetween, and a gate 1105. The width of the gate 1105 is 33 nm.

A gate insulating layer 1104 is formed between the gate 1105 and the semiconductor region 1103b. In addition, a sidewall insulator 1106a and a sidewall insulator 1106b are formed on both side surfaces of the gate 1105, and an insulator 1107 is formed over the gate 1105 so as to prevent a short circuit between the gate 1105 and another wiring. The sidewall insulating layer has a width of 5 nm. A source 1108a and a drain 1108b are provided in contact with the semiconductor region 1103a and the semiconductor region 1103c, respectively. Note that the channel width of this transistor is 40 nm.

The transistor of FIG. 36B is the same as the transistor of FIG. 36A in that it is formed over the base insulating layer 1101 and the embedded insulator 1102 formed of aluminum oxide and that it includes the semiconductor region 1103a, the semiconductor region 1103c, the intrinsic semiconductor region 1103b provided therebetween, the gate 1105 having a width of 33 nm, the gate insulating layer 1104, the sidewall insulator 1106a, the sidewall insulator 1106b, the insulator 1107, the source 1108a, and the drain 1108b.

The transistor illustrated in FIG. 36A is different from the transistor illustrated in FIG. 36B in the conductivity type of semiconductor regions under the sidewall insulator 1106a and the sidewall insulator 1106b. In the transistor illustrated in FIG. 36A, the semiconductor regions under the sidewall insulator 1106a and the sidewall insulator 1106b are part of the semiconductor region 1103a having n+-type conductivity and part of the semiconductor region 1103c having n+-type conductivity, whereas in the transistor illustrated in FIG. 36B, the semiconductor regions under the sidewall insulator 1106a and the sidewall insulator 1106b are part of the intrinsic semiconductor region 1103b. In other words, in the semiconductor layer of FIG. 36B, a region having a width of $L_{off}$ which overlaps with neither the semiconductor region 1103a (the semiconductor region 1103c) nor the gate 1105 is provided. This region is called an offset region, and the width $L_{off}$ is called an offset length. As is seen from the drawing, the offset length is equal to the width of the sidewall insulator 1106a (the sidewall insulator 1106b).

Figure 33A:
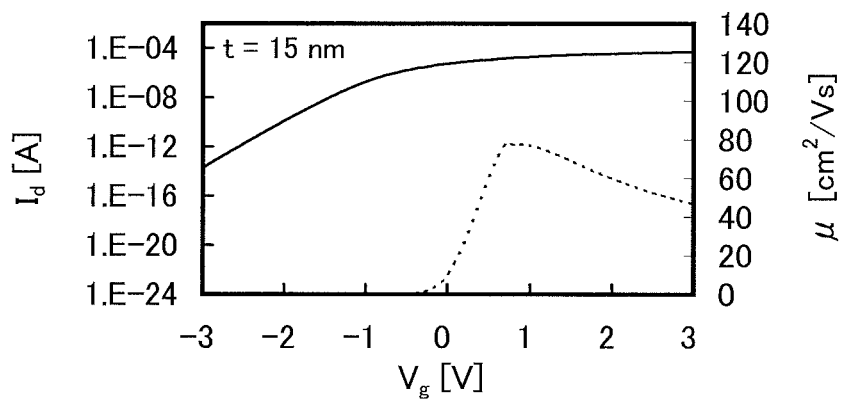
FIGS. 33A to 33C are graphs showing the gate voltage dependence of a drain current and mobility obtained from a calculation.
Figure 33B:
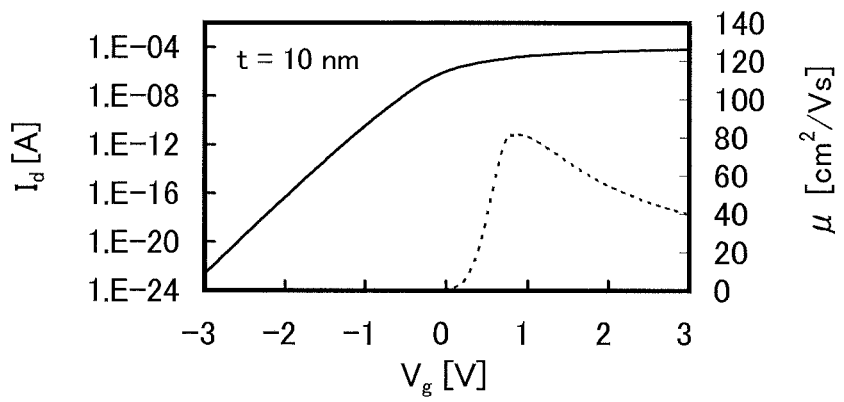
Figure 33C:
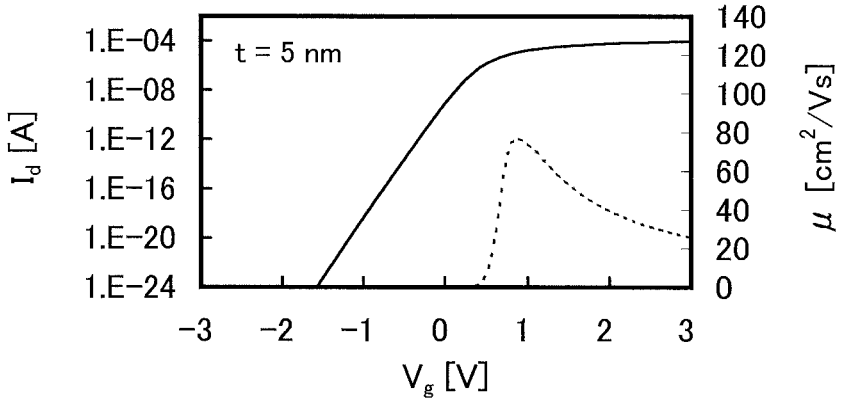

The other parameters used in calculation are as described above. For the calculation, device simulation software Sentaurus Device manufactured by Synopsys, Inc. was used. FIGS. 33A to 33C show the gate voltage ($V_g$: a potential difference between the gate and the source) dependence of the drain current ($I_d$, a solid line) and the mobility (μ, a dotted line) of the transistor having the structure illustrated in FIG. 36A. The drain current $I_d$ is obtained by calculation under the assumption that the drain voltage (a potential difference between the drain and the source) is +1 V and the mobility μ is obtained by calculation under the assumption that the drain voltage is +0.1 V.

FIG. 33A shows the gate voltage dependence of the transistor in the case where the thickness of the gate insulating layer is 15 nm, FIG. 33B shows that of the transistor in the case where the thickness of the gate insulating layer is 10 nm, and FIG. 33C shows that of the transistor in the case where the thickness of the gate insulating layer is 5 nm. As the gate insulating layer is thinner, the drain current $I_d$ (off-state current) particularly in an off state is significantly decreased. In contrast, there is no noticeable change in the peak value of the mobility μ and the drain current $I_d$ in an on state (on-state current). The graphs show that the drain current exceeds 10 μA, which is required in a memory element and the like, at a gate voltage of around 1 V.

Figure 34A:
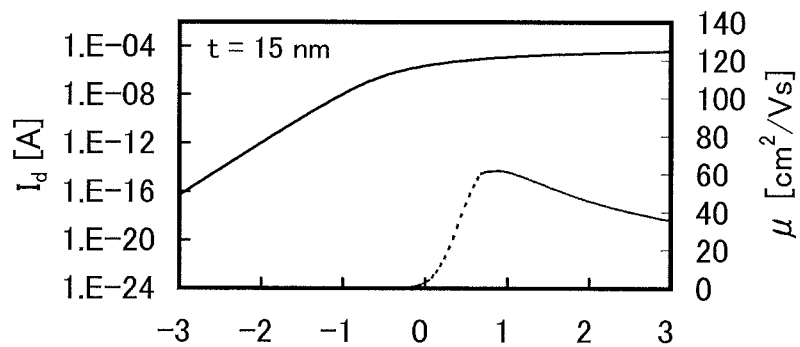
FIGS. 34A to 34C are graphs showing the gate voltage dependence of a drain current and mobility obtained from a calculation.
Figure 34B:
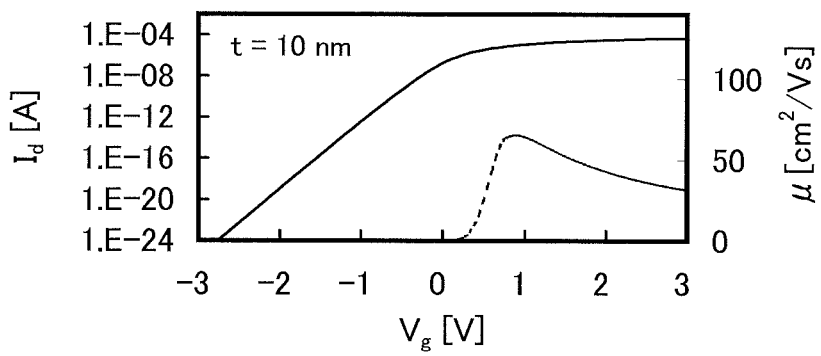
Figure 34C:
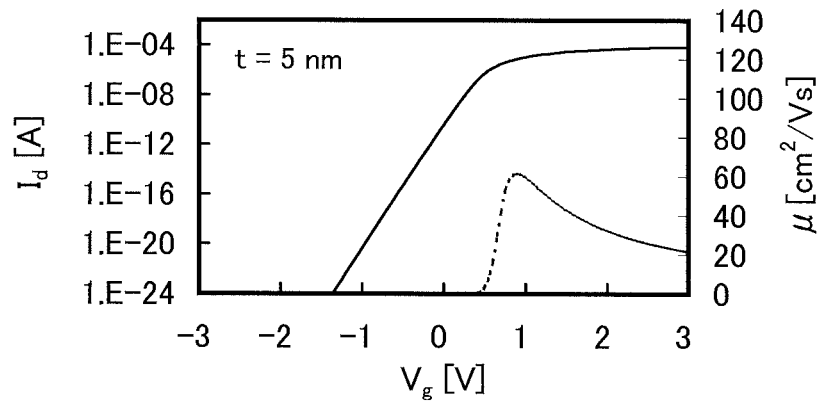

FIGS. 34A to 34C show the gate voltage $V_g$ dependence of the drain current $I_d$ (a solid line) and the mobility u (a dotted line) of the transistor having the structure illustrated in FIG. 36B where the offset length $L_{off}$ is 5 nm. The drain current $I_d$ is obtained by calculation under the assumption that the drain voltage is +1 V and the mobility μ is obtained by calculation under the assumption that the drain voltage is +0.1 V. FIG. 34A shows the gate voltage dependence of the transistor in the case where the thickness of the gate insulating layer is 15 nm, FIG. 34B shows that of the transistor in the case where the thickness of the gate insulating layer is 10 nm, and FIG. 34C shows that of the transistor in the case where the thickness of the gate insulating layer is 5 nm.

Figure 35A:
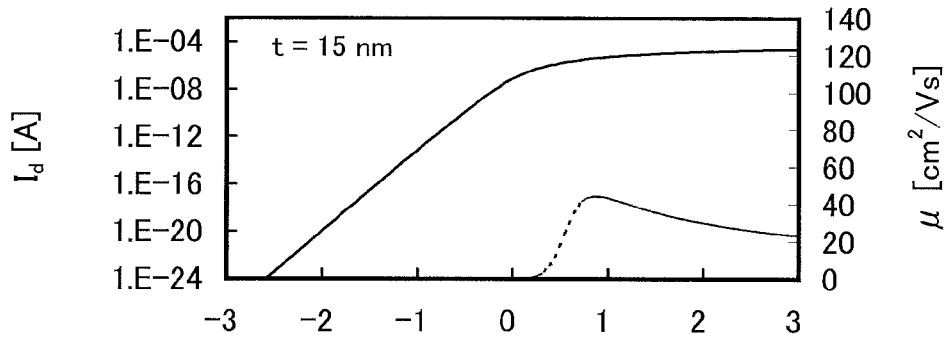
FIGS. 35A to 35C are graphs showing the gate voltage dependence of a drain current and mobility obtained from a calculation.
Figure 35B:
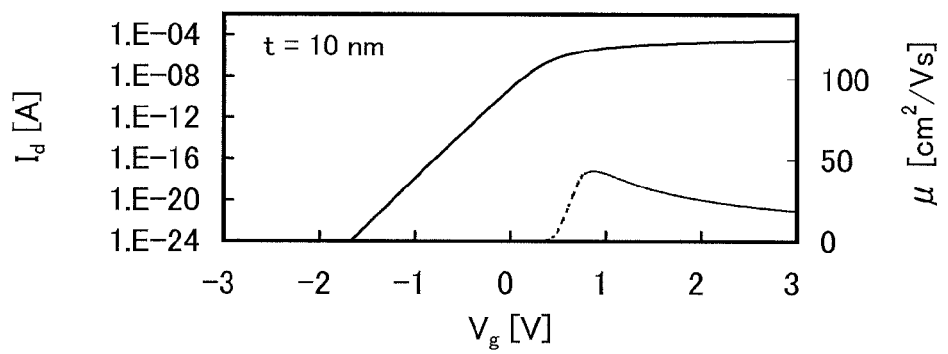
Figure 35C:
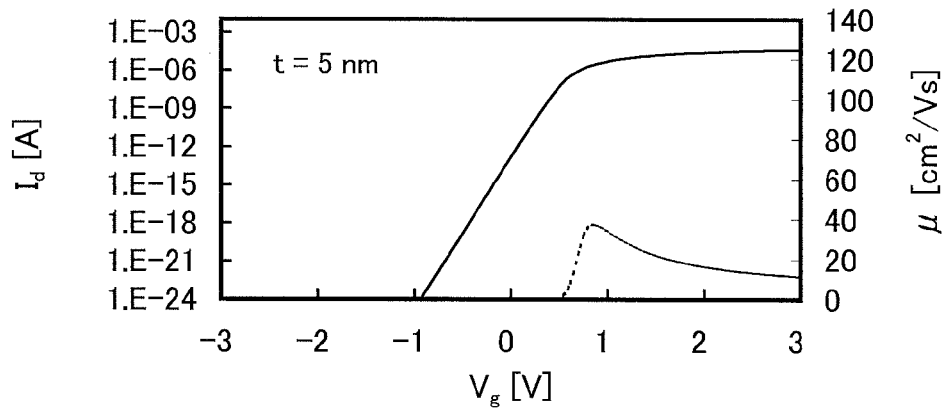
Figure 36A:
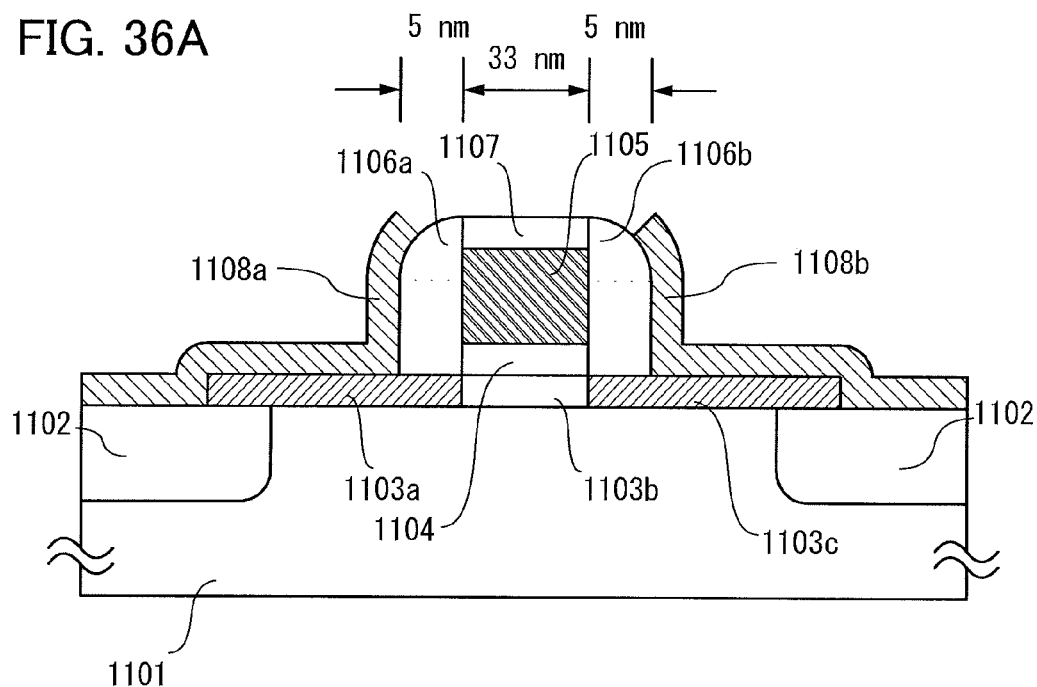
FIGS. 36A and 36B are diagrams each illustrating a cross-sectional structure of a transistor used in a calculation.
Figure 36B:
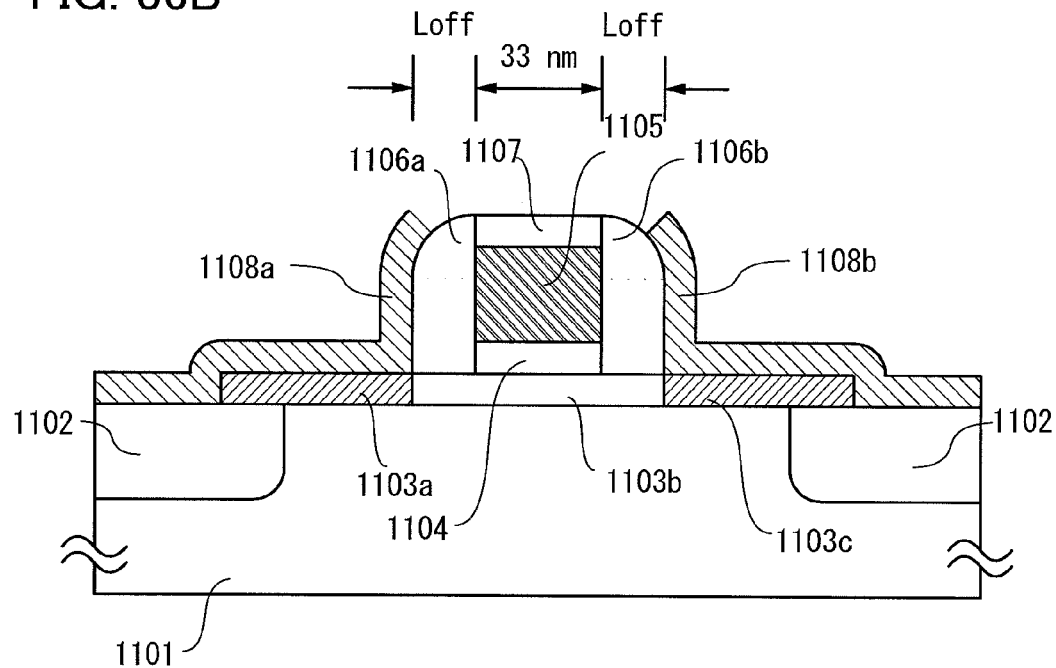

Further, FIGS. 35A to 35C show the gate voltage dependence of the drain current $I_d$ (a solid line) and the mobility μ (a dotted line) of the transistor having the structure illustrated in FIG. 36B where the offset length $L_{off}$ is 15 nm. The drain current $I_d$ is obtained by calculation under the assumption that the drain voltage is +1 V and the mobility p is obtained by calculation under the assumption that the drain voltage is +0.1 V. FIG. 35A shows the gate voltage dependence of the transistor in the case where the thickness of the gate insulating layer is 15 nm, FIG. 35B shows that of the transistor in the case where the thickness of the gate insulating layer is 10 nm, and FIG. 35C shows that of the transistor in the case where the thickness of the gate insulating layer is 5 nm.

In either of the structures, as the gate insulating layer is thinner, the off-state current is significantly decreased, whereas no noticeable change arises in the peak value of the mobility μ and the on-state current.

Note that the peak of the mobility p is approximately 80 $cm^2$/Vs in FIGS. 33A to 33C, approximately 60 $cm^2$/Vs in FIGS. 34A to 34C, and approximately 40 $cm^2$/Vs in FIGS. 35A to 35C; thus, the peak of the mobility μ is decreased as the offset length $L_{off}$ is increased. Further, the same applies to the off-state current. The on-state current is also decreased as the offset length $L_{off}$ is increased; however, the decrease in the on-state current is much more gradual than the decrease in the off-state current. Further, the graphs show that in either of the structures, the drain current exceeds 10 μA, which is required in a memory element and the like, at a gate voltage of around 1 V.

(Embodiment 6)

In this embodiment, a transistor in which an oxide semiconductor including In, Sn, and Zn as main components is used as an oxide semiconductor will be described.

A transistor in which an oxide semiconductor including In, Sn, and Zn as main components is used as a channel formation region can have favorable characteristics by forming the oxide semiconductor while heating a substrate or by performing heat treatment after an oxide semiconductor film is formed. Note that a main component refers to an element included in a composition at more than or equal to 5 atomic %.

By intentionally heating the substrate after formation of the oxide semiconductor film including In, Sn, and Zn as main components, the field-effect mobility of the transistor can be improved. Further, the threshold voltage of the transistor can be positively shifted to make the transistor normally off.

Figure 37A:
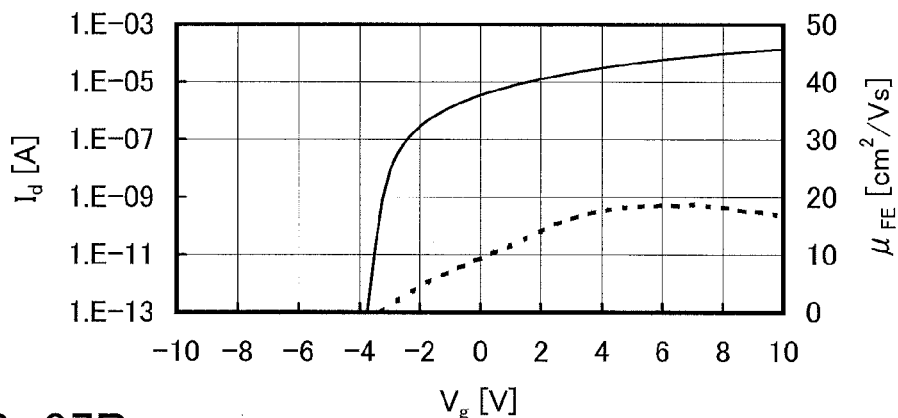
FIGS. 37A to 37C are graphs each showing the characteristics of a transistor.
Figure 37B:
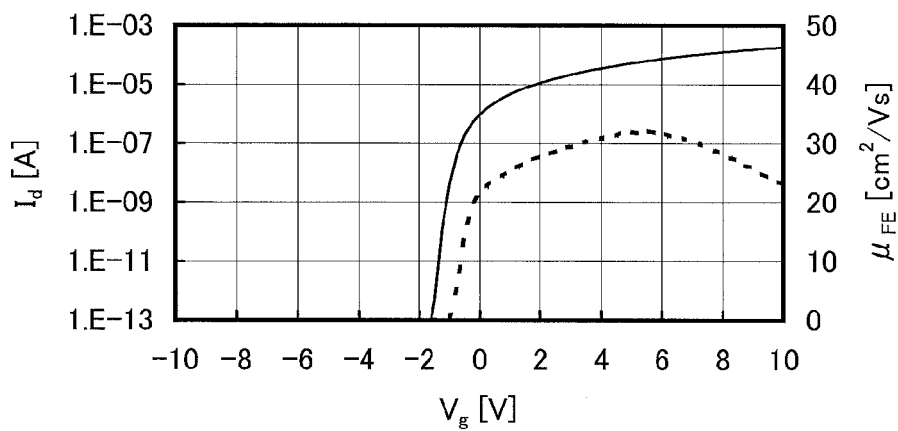
Figure 37C:
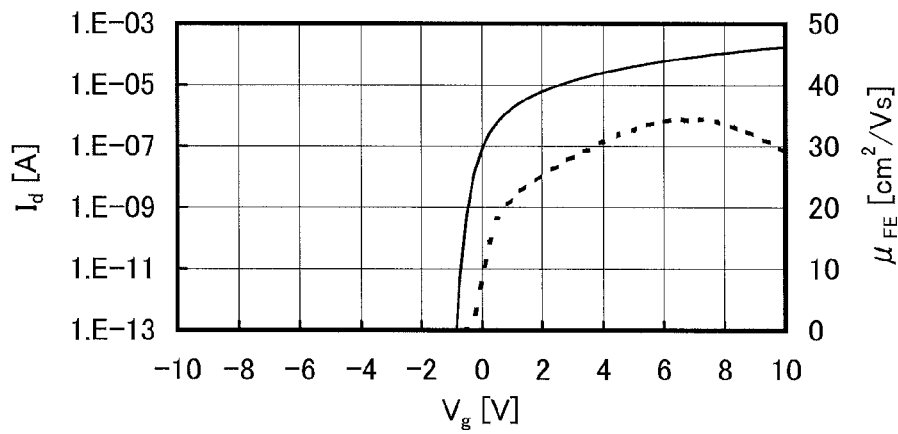

As an example, FIGS. 37A to 37C each show characteristics of a transistor in which an oxide semiconductor film including In, Sn, and Zn as main components and having a channel length L of 3 μm and a channel width W of 10 μm, and a gate insulating layer with a thickness of 100 nm are used. Note that $V_d$ was set to 10 V.

FIG. 37A shows characteristics of a transistor whose oxide semiconductor film including In, Sn, and Zn as main components was formed by a sputtering method without heating a substrate intentionally. A peak of the field-effect mobility of the transistor is 18.8 cm$^2$/Vsec. On the other hand, when the oxide semiconductor film including In, Sn, and Zn as main components is formed while heating the substrate intentionally, the field-effect mobility can be improved. FIG. 37B shows characteristics of a transistor whose oxide semiconductor film including In, Sn, and Zn as main components was formed while heating a substrate at 200° C. A peak of the field-effect mobility of the transistor is 32.2 cm$^2$/Vsec.

The field-effect mobility can be further improved by performing heat treatment after formation of the oxide semiconductor film including In, Sn, and Zn as main components. FIG. 37C shows characteristics of a transistor whose oxide semiconductor film including In, Sn, and Zn as main components was formed by sputtering at 200° C. and then subjected to heat treatment at 650° C. A peak of the field-effect mobility of the transistor is 34.5 cm$^2$/Vsec.

The intentional heating of the substrate is expected to have an effect of reducing moisture taken into the oxide semiconductor film during the formation by sputtering. Further, the heat treatment after film formation enables hydrogen, a hydroxyl group, or moisture to be released and removed from the oxide semiconductor film. In this manner, the field-effect mobility can be improved. Such an improvement in field-effect mobility is presumed to be achieved not only by removal of impurities by dehydration or dehydrogenation but also by a reduction in interatomic distance due to an increase in density. The oxide semiconductor can be crystallized by being highly purified by removal of impurities from the oxide semiconductor. In the case of using such a highly purified non-single-crystal oxide semiconductor, ideally, a peak of a field-effect mobility exceeding 100 cm$^2$/Vsec is expected to be realized.

The oxide semiconductor including In, Sn, and Zn as main components may be crystallized in the following manner: oxygen ions are implanted into the oxide semiconductor, hydrogen, a hydroxyl group, or moisture included in the oxide semiconductor is released by heat treatment, and the oxide semiconductor is crystallized through the heat treatment or by another heat treatment performed later. By such crystallization treatment or recrystallization treatment, a non-single-crystal oxide semiconductor having favorable crystallinity can be obtained.

The intentional heating of the substrate during film formation and/or the heat treatment after the film formation contributes not only to improving field-effect mobility but also to making the transistor normally off. In a transistor in which an oxide semiconductor film that includes In, Sn, and Zn as main components and is formed without heating a substrate intentionally is used as a channel formation region, the threshold voltage tends to be shifted negatively. However, when the oxide semiconductor film formed while heating the substrate intentionally is used, the problem of the negative shift of the threshold voltage can be solved. In other words, the threshold voltage is shifted so that the transistor becomes normally off; this tendency can be confirmed by comparison between FIGS. 37A and 37B.

Note that the threshold voltage can also be controlled by changing the ratio of In, Sn, and Zn; when the composition ratio of In, Sn, and Zn is 2:1:3, a normally-off transistor is expected to be formed. In addition, an oxide semiconductor film having high crystallinity can be obtained by setting the composition ratio of a target as follows: In:Sn:Zn=2:1:3.

The temperature of the intentional heating of the substrate or the temperature of the heat treatment is higher than or equal to 150° C., preferably higher than or equal to 200° C., further preferably higher than or equal to 400° C. When film formation or heat treatment is performed at a high temperature, the transistor can be normally off.

By intentionally heating the substrate during film formation and/or by performing heat treatment after the film formation, the stability against a gate-bias stress can be increased. For example, when a gate bias is applied with an intensity of 2 MV/cm at 150° C. for one hour, drift of the threshold voltage can be less than ±1.5 V, preferably less than ±1.0 V.

A BT test was performed on the following two transistors: Sample 1 on which heat treatment was not performed after formation of an oxide semiconductor film, and Sample 2 on which heat treatment at 650° C. was performed after formation of an oxide semiconductor film.

First, $V_g$-$I_d$ characteristics of the transistors were measured at a substrate temperature of 25° C. and $V_{ds}$ of 10 V. Note that $V_{ds}$ refers to a drain voltage (a potential difference between a drain and a source). Then, the substrate temperature was set to 150° C. and $V_{ds}$ was set to 0.1 V. After that, 20 V of $V_g$ was applied so that the intensity of an electric field applied to gate insulating layers was 2 MV/cm, and the condition was kept for one hour. Next, $V_g$ was set to 0 V. Then, $V_g$-$I_d$ characteristics of the transistors were measured at a substrate temperature of 25° C. and $V_{ds}$ of 10 V. This process is called a positive BT test.

In a similar manner, first, $V_g$-$I_d$ characteristics of the transistors were measured at a substrate temperature of 25° C. and $V_{ds}$ of 10 V. Then, the substrate temperature was set at 150° C. and $V_{ds}$ was set to 0.1 V. Then, −20 V of $V_g$ was applied so that the intensity of an electric field applied to the gate insulating layers was −2 MV/cm, and the condition was kept for one hour. Next, $V_g$ was set to 0 V. Then, $V_g$-$I_d$ characteristics of the transistors were measured at a substrate temperature of 25° C. and $V_{ds}$ of 10 V. This process is called a negative BT test.

Figure 38A:
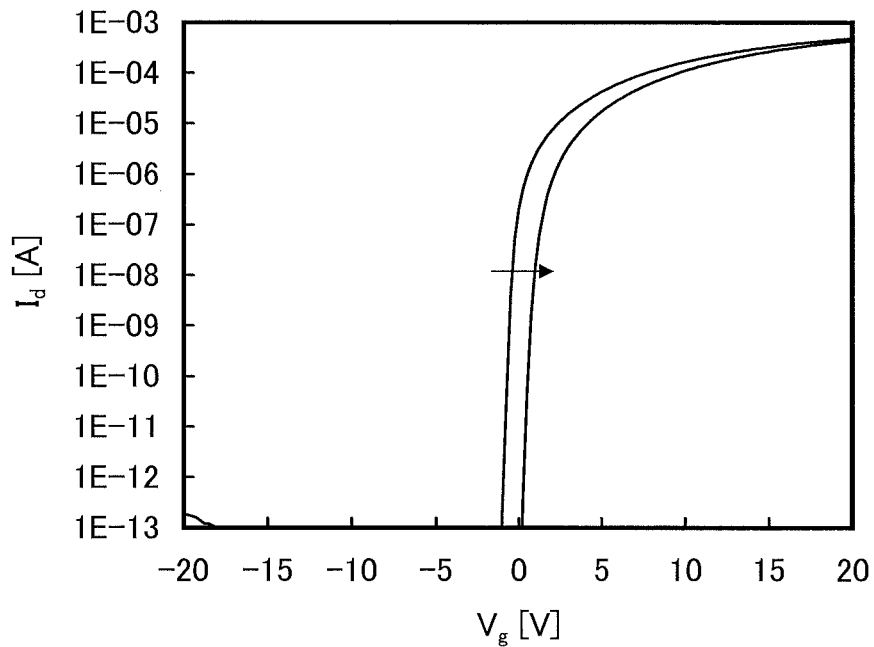
FIGS. 38A and 38B are graphs each showing the characteristics of a transistor.
Figure 38B:
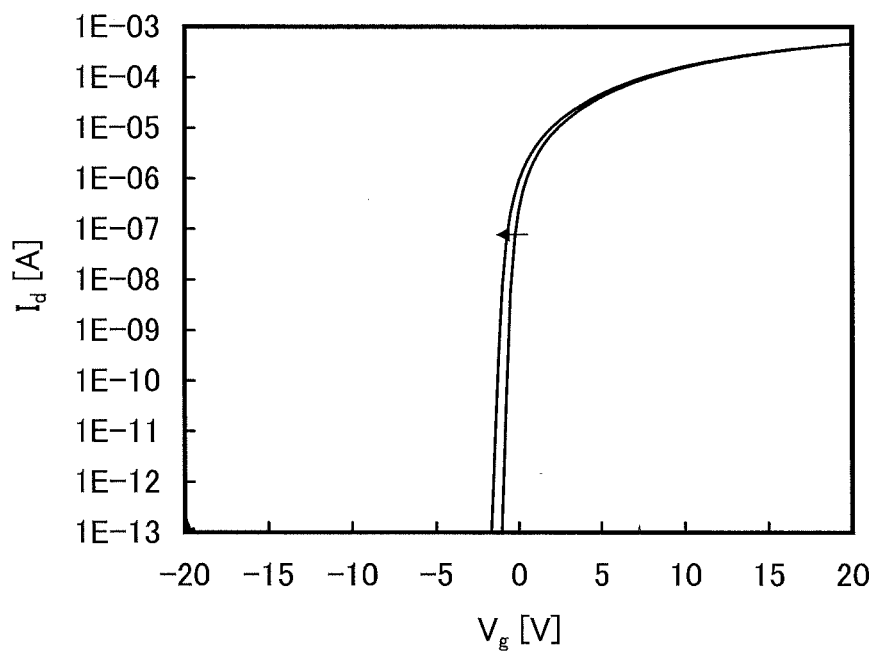
Figure 39A:
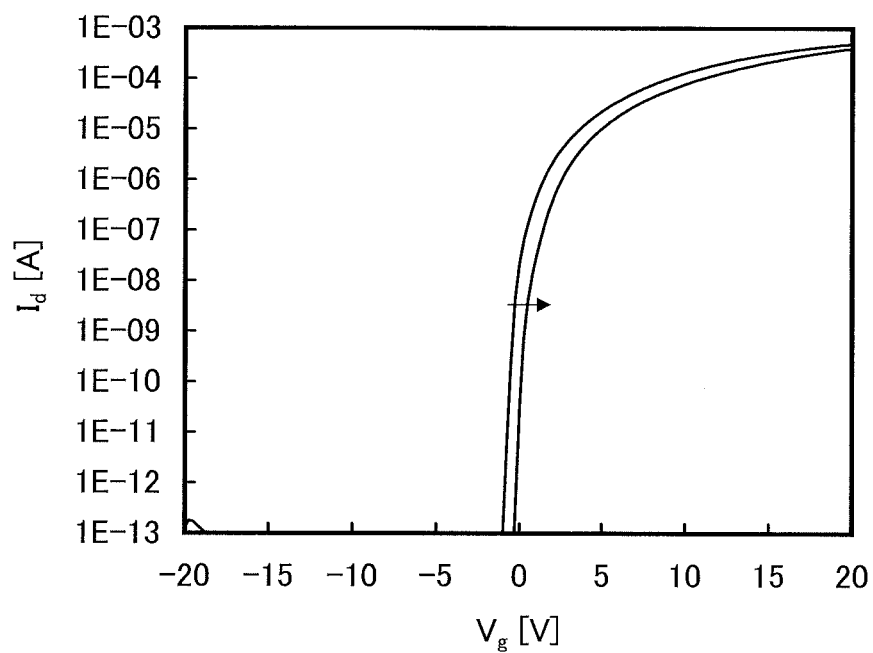
FIGS. 39A and 39B are graphs each showing the characteristics of a transistor.
Figure 39B:
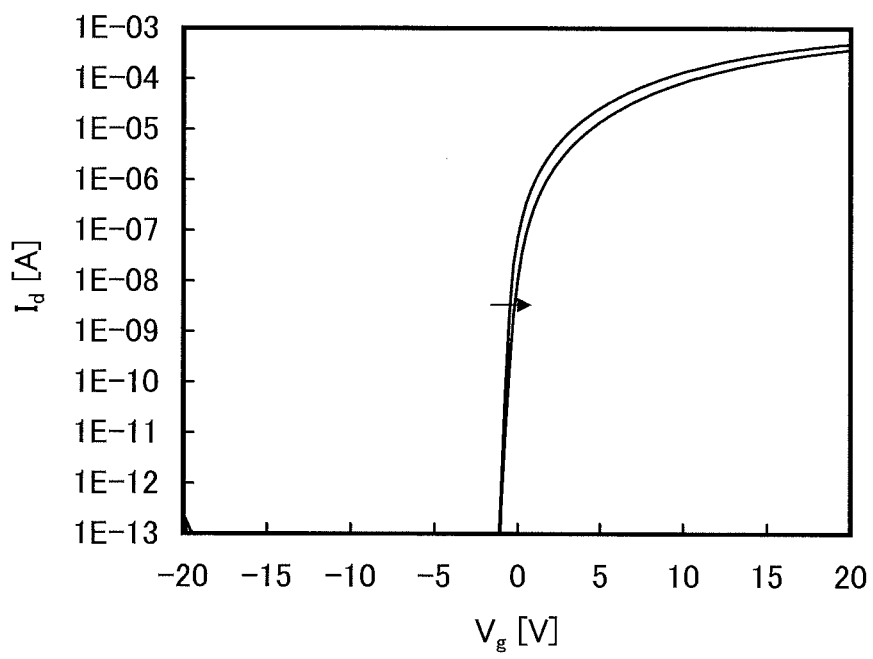

FIGS. 38A and 38B show a result of the positive BT test of Sample 1 and a result of the negative BT test of Sample 1, respectively. FIGS. 39A and 39B show a result of the positive BT test of Sample 2 and a result of the negative BT test of Sample 2, respectively.

The amount of shift in the threshold voltage of Sample 1 due to the positive BT test and that due to the negative BT test were 1.80 V and −0.42 V, respectively. The amount of shift in the threshold voltage of Sample 2 due to the positive BT test and that due to the negative BT test were 0.79 V and 0.76 V, respectively. It is found that, in each of Sample 1 and Sample 2, the amount of shift in the threshold voltage between before and after the BT tests is small and the reliability thereof is high.

The heat treatment can be performed in an oxygen atmosphere; alternatively, the heat treatment may be performed first in an atmosphere of nitrogen or an inert gas or under reduced pressure, and then in an atmosphere including oxygen. By performing the heat treatment under the condition, oxygen can be excessively supplied to the oxide semiconductor film. Oxygen is supplied to the oxide semiconductor film after dehydration or dehydrogenation, whereby an effect of the heat treatment can be further increased. As a method for supplying oxygen after dehydration or dehydrogenation, a method in which oxygen ions are accelerated by an electric field and implanted into the oxide semiconductor film may be employed. Thus, oxygen can be also excessively supplied to the oxide semiconductor film.

A defect due to oxygen deficiency is easily caused in the oxide semiconductor or at an interface between the oxide semiconductor and a film in contact with the oxide semiconductor; however, when excess oxygen is included in the oxide semiconductor by the heat treatment, oxygen deficiency caused later can be compensated for with excess oxygen. The excess oxygen is oxygen existing mainly between lattices. When the concentration of excess oxygen is set to higher than or equal to $1 \times 10^{16}/cm^3$ and lower than or equal to $2 \times 10^{20}/cm^3$, excess oxygen can be included in the oxide semiconductor without causing crystal distortion or the like.

When heat treatment is performed so that at least part of the oxide semiconductor includes crystal, a more stable oxide semiconductor film can be obtained. For example, when an oxide semiconductor film which is faulted by sputtering using a target having a composition ratio of In:Sn:Zn=1:1:1 without heating a substrate intentionally is analyzed by X-ray diffraction (XRD), a halo pattern is observed. The formed oxide semiconductor film can be crystallized by being subjected to heat treatment. The temperature of the heat treatment can be set as appropriate; when the heat treatment is performed at 650° C., for example, a clear diffraction peak can be observed in an X-ray diffraction analysis.

An XRD analysis of an In—Sn—Zn—O film was conducted. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. A method for manufacturing Sample A and Sample B will be described below.

An In—Sn—Zn—O film with a thickness of 100 nm was formed over a quartz substrate that had been subjected to dehydrogenation treatment.

The In—Sn—Zn—O film was formed with a sputtering apparatus with a power of 100 W (DC) in an oxygen atmosphere. An In—Sn—Zn—O target having an atomic ratio of In:Sn:Zn=1:1:1 was used as a target. Note that the substrate heating temperature in film formation was set at 200° C. A sample manufactured in this manner was used as Sample A.

Next, a sample manufactured by a method similar to that of Sample A was subjected to heat treatment at 650° C. As the heat treatment, heat treatment in a nitrogen atmosphere was first performed for one hour and heat treatment in an oxygen atmosphere was further performed for one hour without lowering the temperature. A sample manufactured in this manner was used as Sample B.

Figure 42:
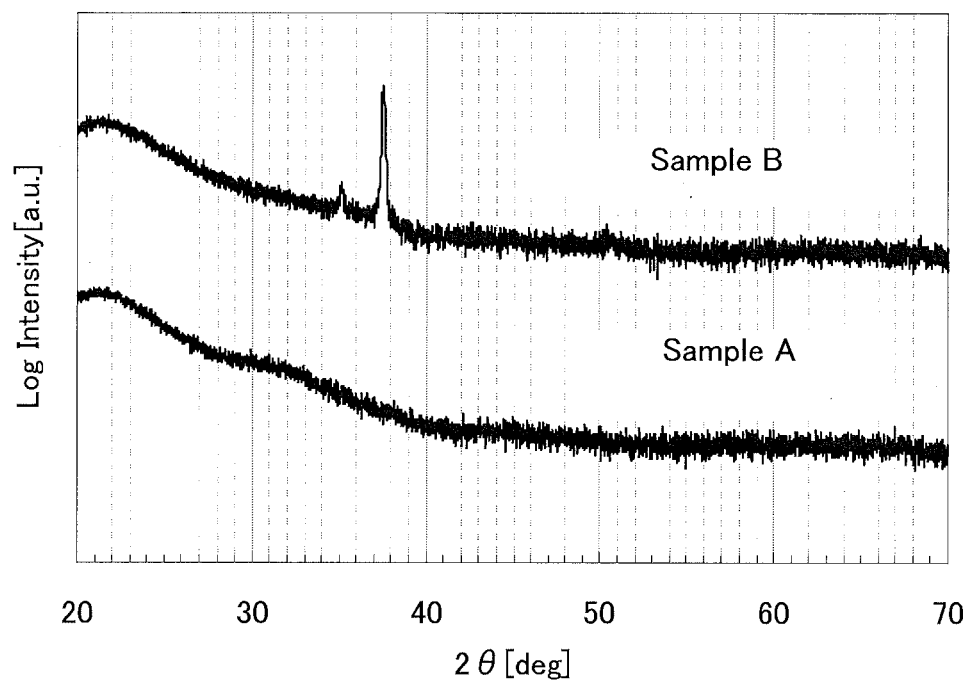
FIG. 42 is a graph showing XRD spectra of oxide materials.

FIG. 42 shows XRD spectra of Sample A and Sample B. No peak derived from crystal was observed in Sample A, whereas peaks derived from crystal were observed when 2θ was around 35 deg. and at 37 deg. to 38 deg. in Sample B.

As described above, by intentionally heating a substrate during film formation of an oxide semiconductor including In, Sn, and Zn as main components and/or by performing heat treatment after the film formation, characteristics of a transistor can be improved.

These substrate heating and heat treatment have an effect of preventing hydrogen and a hydroxyl group, which are unfavorable impurities for an oxide semiconductor, from being included in the film or an effect of removing hydrogen and a hydroxyl group from the film. In other words, an oxide semiconductor can be highly purified by removing hydrogen serving as a donor impurity from the oxide semiconductor, whereby a normally-off transistor can be obtained. The high purification of an oxide semiconductor enables the off-state current of the transistor to be lower than or equal to 1 aA/μm. Here, the unit of the off-state current is used to indicate current per micrometer of a channel width.

Figure 43:
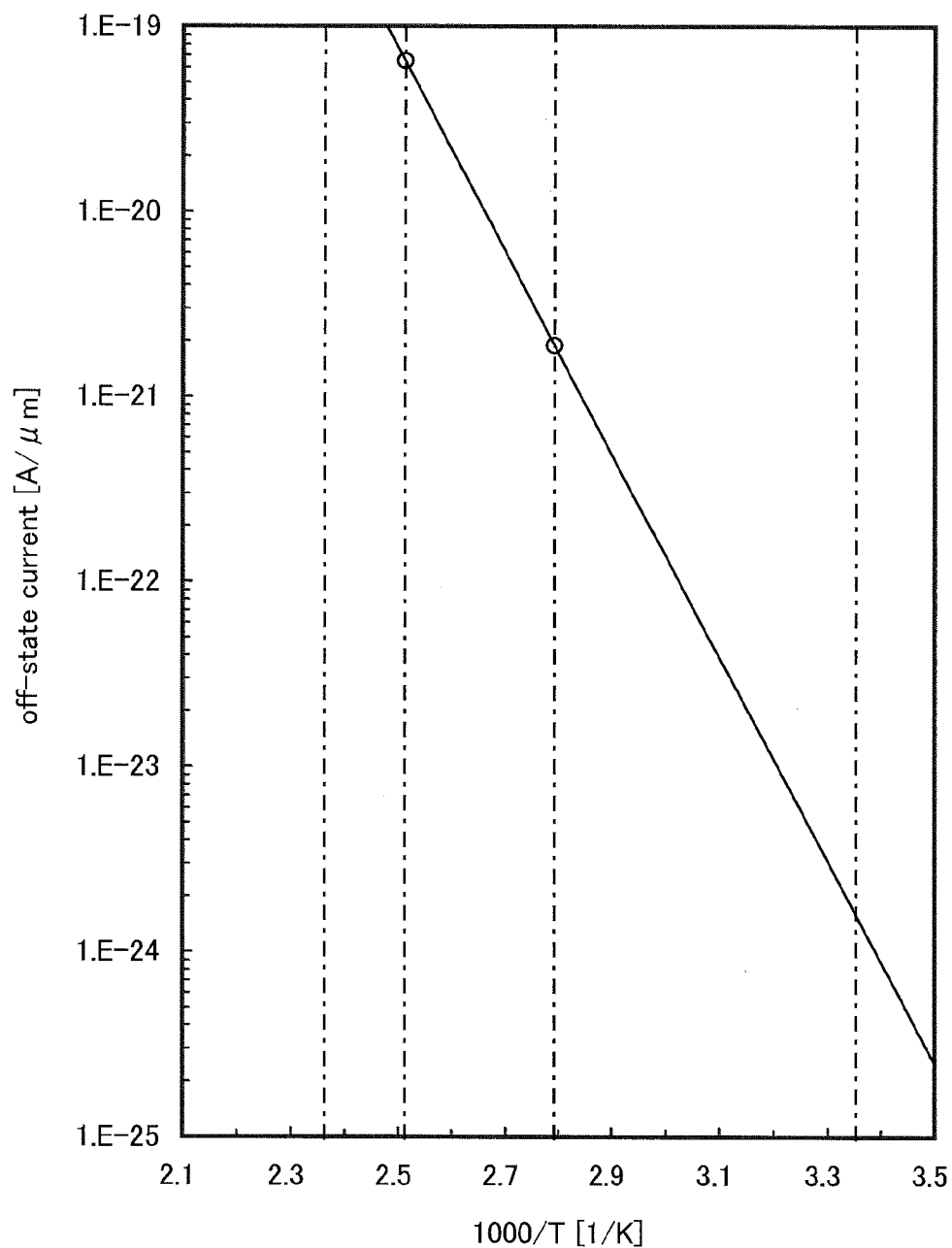
FIG. 43 is a graph showing the characteristics of a transistor.

FIG. 43 shows a relation between the off-state current of a transistor and the inverse of substrate temperature (absolute temperature) at measurement. Here, for simplicity, the horizontal axis represents a value (1000/T) obtained by multiplying an inverse of substrate temperature at measurement by 1000.

Specifically, as shown in FIG. 43, the off-state current can be lower than or equal to 1 aA/μm ($1 \times 10^{-18}$ A/μm), lower than or equal to 100 zA/μm ($1 \times 10^{-19}$ A/μm) or lower, and lower than or equal to 1 zA/μm ($1 \times 10^{-21}$ A/μm) when the substrate temperature is 125° C., 85° C., and room temperature (27° C.), respectively. Preferably, the off-state current can be lower than or equal to 0.1 aA/μm ($1 \times 10^{-19}$ A/μ), lower than or equal to 10 zA/μm ($1 \times 10^{-20}$ A/μm), and lower than or equal to 0.1 zA/μm ($1 \times 10^{-22}$ A/μm) at 125° C., 85° C., and room temperature, respectively.

Note that in order to prevent hydrogen and moisture from being included in the oxide semiconductor film during formation thereof, it is preferable to increase the purity of a sputtering gas by sufficiently suppressing leakage from the outside of a film formation chamber and degasification through an inner wall of the film formation chamber. For example, a gas with a dew point of lower than or equal to −70° C. is preferably used as the sputtering gas in order to prevent moisture from being included in the film. In addition, it is preferable to use a target which is highly purified so as not to include impurities such as hydrogen and moisture. Although it is possible to remove moisture from a film of an oxide semiconductor including In, Sn, and Zn as main components by heat treatment, a film which does not include moisture originally is preferably formed because moisture is released from the oxide semiconductor including In, Sn, and Zn as main components at a higher temperature than from an oxide semiconductor including In, Ga, and Zn as main components.

The relation between the substrate temperature and electric characteristics of a transistor formed using Sample B, on which heat treatment at 650° C. was performed after formation of the oxide semiconductor film, was evaluated.

The transistor used for the measurement has a channel length L of 3 μm, a channel width W of 10 μm, Lov of 0 μm, and dW of 0 μm. Note that $V_{ds}$ was set to 10 V. Note that the substrate temperature was −40° C., −25° C., 25° C., 75° C., 125° C., and 150° C. Here, in a transistor, the width of a portion where a gate electrode overlaps with one of a pair of electrodes is referred to as Lov, and the width of a portion of the pair of electrodes, which does not overlap with an oxide semiconductor film, is referred to as dW.

Figure 40:
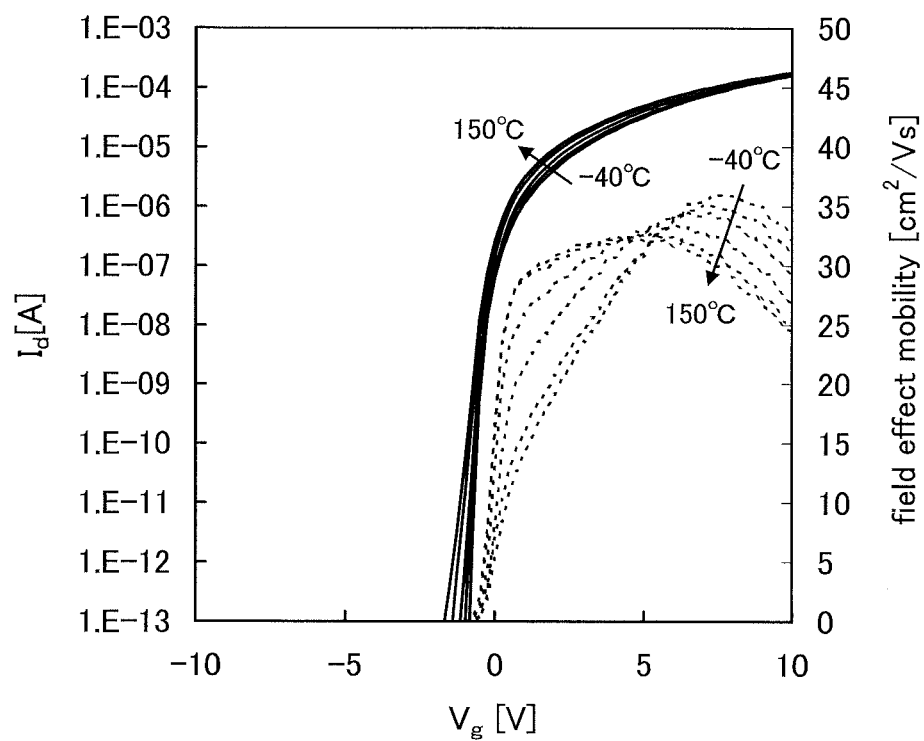
FIG. 40 is a graph showing the characteristics of a transistor.
Figure 41A:
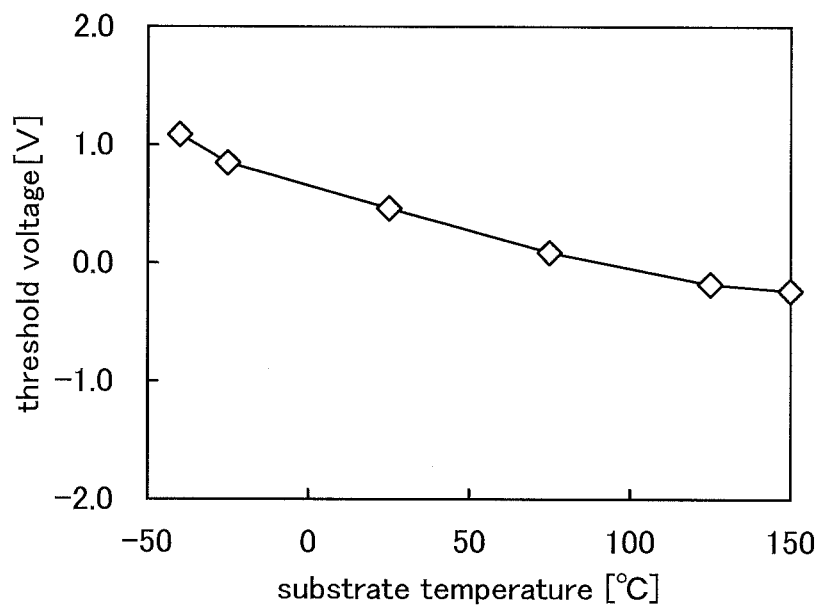
FIGS. 41A and 41B are graphs showing the characteristics of a transistor.

FIG. 40 shows the $V_g$ dependence of $I_d$ (a solid line) and field-effect mobility (a dotted line). FIG. 41A shows a relation between the substrate temperature and the threshold voltage, and FIG. 41B shows a relation between the substrate temperature and the field-effect mobility.

From FIG. 41A, it is found that the threshold voltage gets lower as the substrate temperature increases. Note that the threshold voltage is decreased from 1.09 V to −0.23 V in the range from −40° C. to 150° C.

Figure 41B:
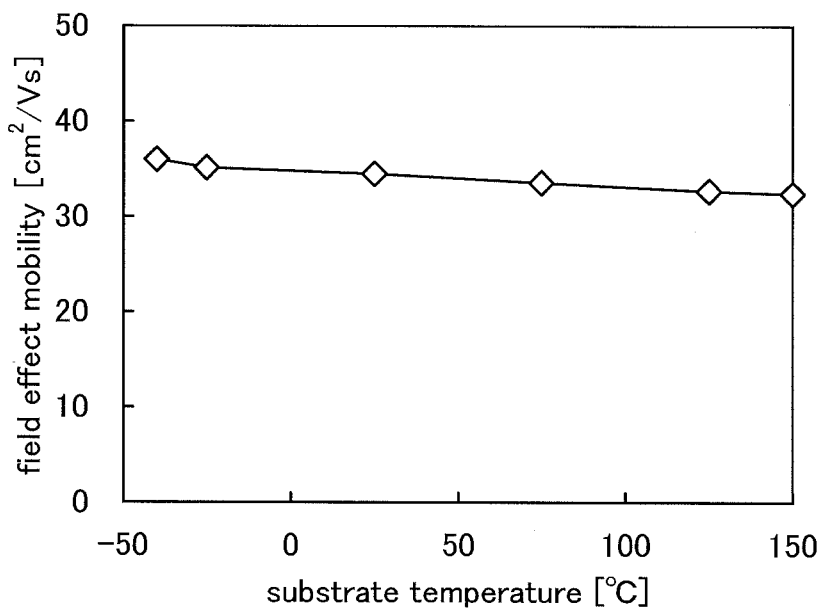

From FIG. 41B, it is found that the field-effect mobility gets lower as the substrate temperature increases. Note that the field-effect mobility is decreased from 36 cm$^2$/Vs to 32 cm$^2$/Vs in the range from −40° C. to 150° C. Thus, it is found that shift in electric characteristics is small in the above temperature range.

In a transistor in which such an oxide semiconductor including In, Sn, and Zn as main components is used as a channel formation region, a field-effect mobility of higher than or equal to 30 cm$^2$/Vsec, preferably higher than or equal to 40 cm$^2$/Vsec, further preferably higher than or equal to 60 cm$^2$/Vsec can be obtained with the off-state current maintained at lower than or equal to 1 aA/μm, which can achieve on-state current needed for an LSI. For example, in an FET where L/W is 33 nm/40 nm, an on-state current of higher than or equal to 12 μA can flow when the gate voltage is 2.7 V and the drain voltage is 1.0 V. In addition, sufficient electric characteristics can be ensured in a temperature range needed for operation of a transistor. With such characteristics, an integrated circuit having a novel function can be realized without decreasing the operation speed even when a transistor including an oxide semiconductor is also provided in an integrated circuit formed using a Si semiconductor.

An example of a transistor in which an In—Sn—Zn—O film is used as an oxide semiconductor film will be described below.

Figure 44A:
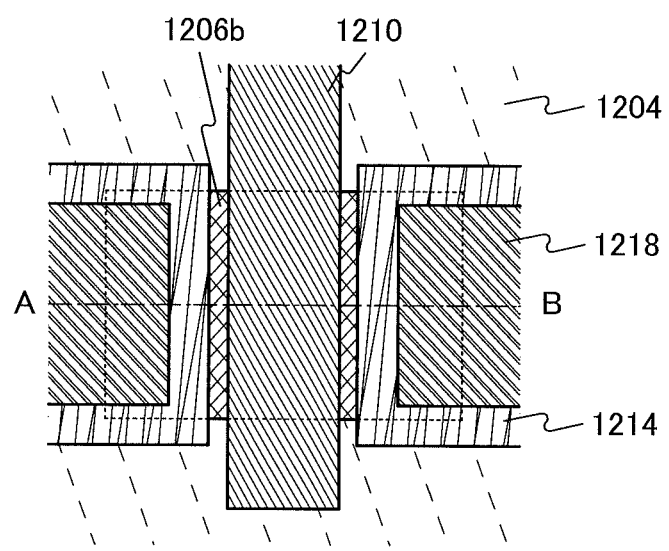
FIG. 44A is a plan view and FIG. 44B is a cross-sectional view of a semiconductor device.
Figure 44B:
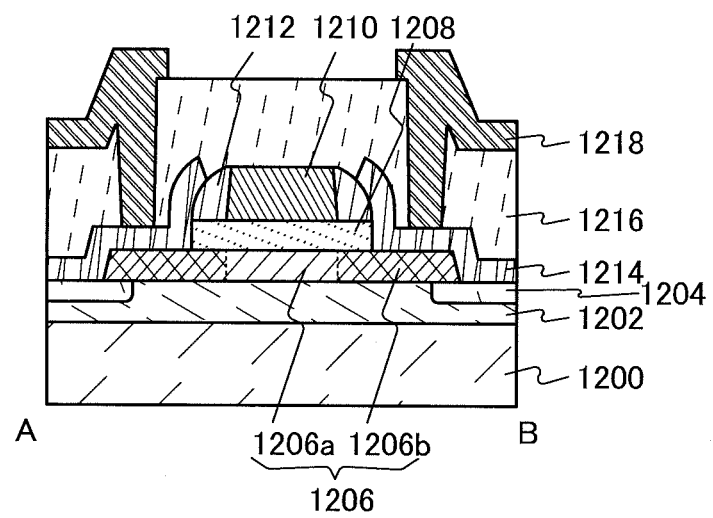

FIGS. 44A and 44B are a top view and a cross-sectional view of a coplanar transistor having a top-gate top-contact structure. FIG. 44A is the top view of the transistor. FIG. 44B illustrates cross section A-B along dashed-dotted line A-B in FIG. 44A.

The transistor illustrated in FIG. 44B includes a substrate 1200; a base insulating layer 1202 provided over the substrate 1200; a protective insulating film 1204 provided in the periphery of the base insulating layer 1202; an oxide semiconductor film 1206 provided over the base insulating layer 1202 and the protective insulating film 1204 and including a high-resistance region 1206a and low-resistance regions 1206b; a gate insulating layer 1208 provided over the oxide semiconductor film 1206; a gate electrode 1210 provided to overlap with the oxide semiconductor film 1206 with the gate insulating layer 1208 positioned therebetween; a sidewall insulating film 1212 provided in contact with a side surface of the gate electrode 1210; a pair of electrodes 1214 provided in contact with at least the low-resistance regions 1206b; an interlayer insulating film 1216 provided to cover at least the oxide semiconductor film 1206, the gate electrode 1210, and the pair of electrodes 1214; and a wiring 1218 provided to be connected to at least one of the pair of electrodes 1214 through an opening formed in the interlayer insulating film 1216.

Although not illustrated, a protective film may be provided to cover the interlayer insulating film 1216 and the wiring 1218. With the protective film, a minute amount of leakage current generated by surface conduction of the interlayer insulating film 1216 can be reduced and thus the off-state current of the transistor can be reduced.

Another example of a transistor in which an In—Sn—Zn—O film is used as an oxide semiconductor film will be described below.

Figure 45A:
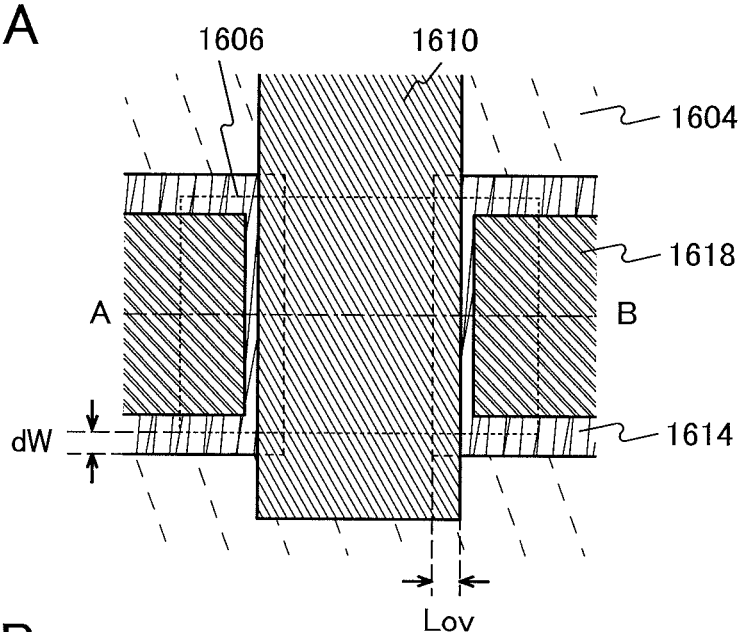
FIG. 45A is a plan view and FIG. 45B is a cross-sectional view of a semiconductor device.
Figure 45B:
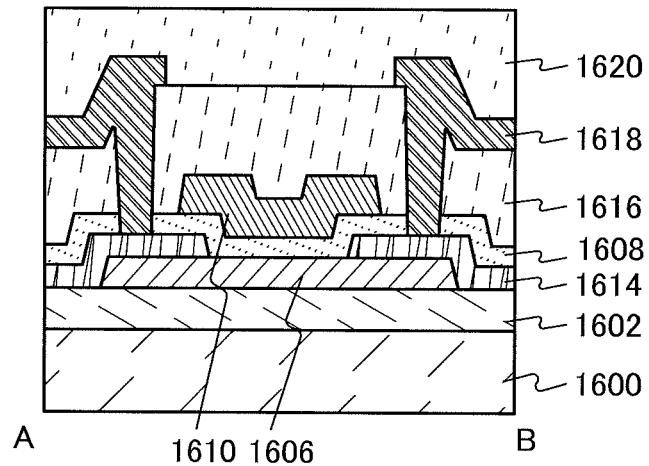

FIGS. 45A and 45B are a top view and a cross-sectional view which illustrate a structure of a transistor. FIG. 45A is the top view of the transistor. FIG. 45B is a cross-sectional view along dashed-dotted line A-B in FIG. 45A.

The transistor illustrated in FIG. 45B includes a substrate 1600; a base insulating layer 1602 provided over the substrate 1600; an oxide semiconductor film 1606 provided over the base insulating layer 1602; a pair of electrodes 1614 in contact with the oxide semiconductor film 1606; a gate insulating layer 1608 provided over the oxide semiconductor film 1606 and the pair of electrodes 1614; a gate electrode 1610 provided to overlap with the oxide semiconductor film 1606 with the gate insulating layer 1608 positioned therebetween; an interlayer insulating film 1616 provided to cover the gate insulating layer 1608 and the gate electrode 1610; wirings 1618 connected to the pair of electrodes 1614 through openings formed in the interlayer insulating film 1616; and a protective film 1620 provided to cover the interlayer insulating film 1616 and the wirings 1618.

As the substrate 1600, a glass substrate can be used. As the base insulating layer 1602, a silicon oxide film can be used. As the oxide semiconductor film 1606, an In—Sn—Zn—O film can be used. As the pair of electrodes 1614, a tungsten film can be used. As the gate insulating layer 1608, a silicon oxide film can be used. The gate electrode 1610 can have a layered structure of a tantalum nitride film and a tungsten film. The interlayer insulating film 1616 can have a layered structure of a silicon oxynitride film and a polyimide film. The wirings 1618 can each have a layered structure in which a titanium film, an aluminum film, and a titanium film are formed in this order. As the protective film 1620, a polyimide film can be used.

Note that in the transistor having the structure illustrated in FIG. 45A, the width of a portion where the gate electrode 1610 overlaps with one of the pair of electrodes 1614 is referred to as Lov. Similarly, the width of a portion of the pair of electrodes 1614, which does not overlap with the oxide semiconductor film 1606, is referred to as dW.

(Embodiment 7)

In this embodiment, the cases where the semiconductor device described in any of the above embodiments is applied to an electronic appliance will be described with reference to FIGS. 23A to 23F. In this embodiment, applications of the semiconductor device to electronic appliances such as a computer, a cellular phone handset (also referred to as a cellular phone or a cellular phone device), a personal digital assistant (including a portable game machine, an audio reproducing device, and the like), a digital camera, a digital video camera, electronic paper, and a television set (also referred to as a television or a television receiver) are described.

Figure 23A:
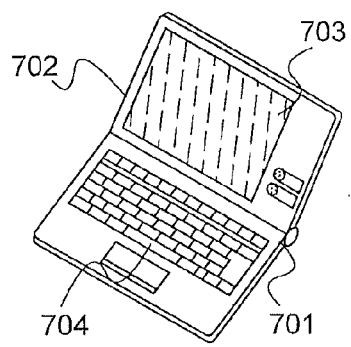
FIGS. 23A to 23F are diagrams of electronic appliances.

FIG. 23A is a laptop personal computer including a housing 701, a housing 702, a display portion 703, a keyboard 704, and the like. The semiconductor device described in any of the above embodiments is provided in at least one of the housing 701 and the housing 702. Therefore, a laptop personal computer in which writing and reading of data are performed at high speed, data is stored for a long time, and power consumption is sufficiently reduced can be realized.

Figure 23D:
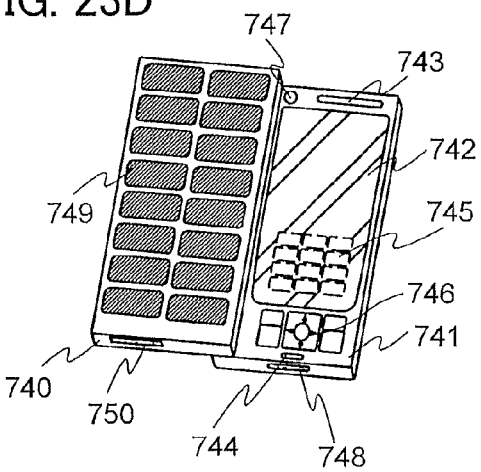
Figure 23B:
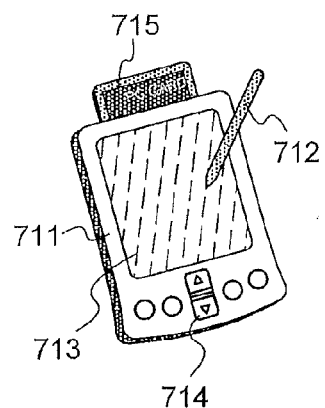

FIG. 23B is a personal digital assistant (PDA). A main body 711 is provided with a display portion 713, an external interface 715, operation buttons 714, and the like. Further, a stylus 712 and the like for operation of the personal digital assistant are provided. In the main body 711, the semiconductor device described in any of the above embodiments is provided. Therefore, a personal digital assistant in which writing and reading of data are performed at high speed, data is stored for a long time, and power consumption is sufficiently reduced can be realized.

Figure 23E:
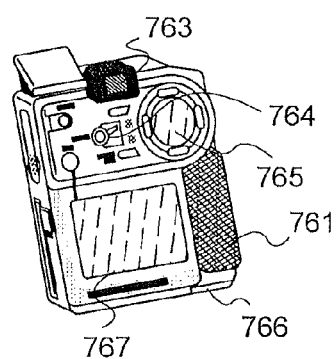
Figure 23C:
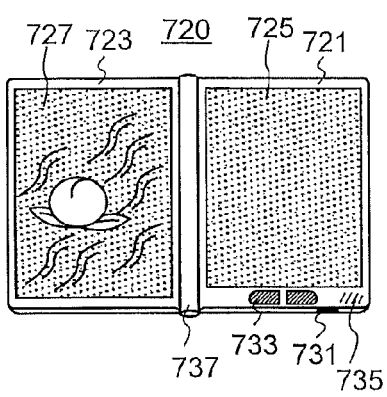

FIG. 23C is an e-book reader 720 mounted with electronic paper, which includes two housings, a housing 721 and a housing 723. The housing 721 and the housing 723 are provided with a display portion 725 and a display portion 727, respectively. The housings 721 and 723 are connected by a hinge portion 737 and can be opened or closed with the hinge portion 737. The housing 721 is provided with a power supply switch 731, an operation key 733, a speaker 735, and the like. At least one of the housings 721 and 723 is provided with the semiconductor device described in any of the above embodiments. Therefore, an e-book reader in which writing and reading of data are performed at high speed, data is stored for a long time, and power consumption is sufficiently reduced can be realized.

FIG. 23D is a cellular phone including two housings, a housing 740 and a housing 741. Moreover, the housings 740 and 741 which are shown unfolded in FIG. 23D can overlap with each other by sliding; thus, the size of the cellular phone can be reduced, which makes the cellular phone suitable for being carried. The housing 741 includes a display panel 742, a speaker 743, a microphone 744, an operation key 745, a pointing device 746, a camera lens 747, an external connection terminal 748, and the like. The housing 740 includes a solar cell 749 for charging the cellular phone, an external memory slot 750, and the like. In addition, an antenna is incorporated in the housing 741. At least one of the housings 740 and 741 is provided with the semiconductor device described in any of the above embodiments. Therefore, a cellular phone in which writing and reading of data are performed at high speed, data is stored for a long time, and power consumption is sufficiently reduced can be realized.

FIG. 23E is a digital camera including a main body 761, a display portion 767, an eyepiece 763, an operation switch 764, a display portion 765, a battery 766, and the like. In the main body 761, the semiconductor device described in any of the above embodiments is provided. Therefore, a digital camera in which writing and reading of data are performed at high speed, data is stored for a long time, and power consumption is sufficiently reduced can be realized.

Figure 23F:
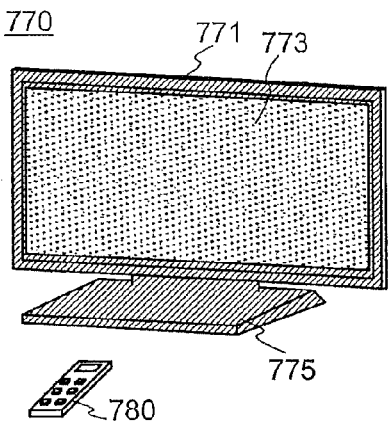

FIG. 23F is a television device 770 including a housing 771, a display portion 773, a stand 775, and the like. The television set 770 can be operated with an operation switch of the housing 771 or a remote controller 780. The semiconductor device described in any of the above embodiments is mounted on the housing 771 and the remote controller 780. Therefore, a television set in which writing and reading of data are performed at high speed, data is stored for a long time, and power consumption is sufficiently reduced can be realized.

As described above, the electronic appliances described in this embodiment each include the semiconductor device described in any of the above embodiments; thus, electronic devices with low power consumption can be realized.

Explanation of Reference

120: semiconductor layer, 122: insulating layer, 122a: gate insulating layer, 124: mask, 126: impurity region, 128a: gate electrode, 128b: conductive layer, 130: impurity region, 132: impurity region, 134: channel formation region, 136: insulating layer, 138: insulating layer, 140: insulating layer, 142a: source electrode, 142b: drain electrode, 144: oxide semiconductor layer, 146: gate insulating layer, 148a: gate electrode, 148b: conductive layer, 150: insulating layer, 154: wiring, 156: insulating layer, 160: transistor, 162: transistor, 164: capacitor, 170: memory cell, 201: memory cell array, 202: column driver circuit, 203: row driver circuit, 204: controller, 205: I/O control circuit, 206: counter, 207: potential generating circuit, 221: bit line and source line driver circuit, 222: column decoder, 223a: analog switch, 223b: analog switch, 224: circuit, 225: circuit, 226: latch group, 227: latch, 228: selector, 229: selector, 230: buffer, 231: gate line and capacitor line driver circuit, 232: row decoder, 321: NAND circuit, 322: level shifter, 323: load, 324: sense amplifier, 325: NAND circuit, 331: NAND circuit, 332: level shifter, 333: NAND circuit, 334: level shifter, 335: multiplexer, 336: multiplexer, 400: insulating layer, 401: gate electrode, 402: gate insulating layer, 403: oxide semiconductor layer, 404a: oxide conductive layer, 404b: oxide conductive layer, 405a: source electrode, 405b: drain electrode, 410: transistor, 420: transistor, 427: insulating layer, 430: transistor, 437: insulating layer, 440: transistor, 441: transistor, 442: transistor, 450a: crystalline oxide semiconductor layer, 450b: crystalline oxide semiconductor layer, 453: oxide semiconductor layer, 500: semiconductor substrate, 510: single crystal semiconductor substrate, 512: oxide film, 514: embrittled region, 516: single crystalline semiconductor layer, 518: single crystalline semiconductor layer, 701: housing, 702: housing, 703: display portion, 704: keyboard, 711: main body, 712: stylus, 713: display portion, 714: operation button, 715: external interface, 720: e-book reader, 721: housing, 723: housing, 725: display portion, 727: display portion, 731: power supply switch, 733: operation key, 735: speaker, 737: hinge portion, 740: housing, 741: housing, 742: display panel, 743: speaker, 744: microphone, 745: operation key, 746: pointing device, 747: camera lens, 748: external connection terminal, 749: solar cell, 750: external memory slot, 761: main body, 763: eyepiece, 764: operation switch, 765: display portion, 766: battery, 767: display portion, 770: television set, 771: housing, 773: display portion, 775: stand, 780: remote controller, 1101: base insulating layer, 1102: embedded insulator, 1103a: semiconductor region, 1103b: semiconductor region, 1103c: semiconductor region, 1104: gate insulating layer, 1105: gate, 1106a: side wall insulator, 1106b: side wall insulator, 1107: insulator, 1108a: source, 1108b: drain, 1200: substrate, 1202: base insulating layer, 1204: protective insulating film, 1206: oxide semiconductor film, 1206a: high-resistance region, 1206b: low-resistance region, 1208: gate insulating layer, 1210: gate electrode, 1212: side wall insulating film, 1214: electrode, 1216: interlayer insulating film, 1218: interlayer insulating film, 1600: substrate, 1602: base insulating layer, 1606: oxide semiconductor film, 1608: gate insulating layer, 1610: gate electrode, 1614: electrode, 1616: interlayer insulating film, 1618: wiring, and 1620: protective film.

This application is based on Japanese Patent Application serial no. 2010-178168 filed with Japan Patent Office on Aug. 6, 2010 and Japanese Patent Application serial no. 2011-108190 field with Japan Patent Office on May 13, 2011, the entire contents of which are hereby incorporated by reference.

The invention claimed is:

1. A semiconductor device comprising:
a memory cell array comprising m×n memory cells;
a driver circuit; and
a potential generating circuit,
wherein one of the memory cells comprises:
    a first transistor including a first gate electrode, a first source electrode, a first drain electrode, and a first channel formation region; and a second transistor including a second gate electrode, a second source electrode, a second drain electrode, and a second channel formation region, wherein the first channel formation region comprises a semiconductor material different from that of the second channel formation region, wherein the driver circuit comprises a K-bit latch portion and a writing circuit including a K-bit multiplexer in every column of the memory cells, and wherein the writing circuit is connected to the potential generating circuit and the K-bit latch portion.

2. The semiconductor device according to claim 1, wherein the first transistor is a p-channel transistor and the second transistor is an n-channel transistor.

3. The semiconductor device according to claim 1, wherein the second channel formation region of the second transistor comprises an oxide semiconductor.

4. A semiconductor device comprising:
a memory cell array comprising m×n memory cells;
a first driver circuit;
a second driver circuit;
a potential generating circuit;
a bit line;
a source line; and
a gate line,
wherein one of the memory cells comprises:
 a first transistor including a first gate electrode, a first source electrode, a first drain electrode, and a first channel formation region; and
 a second transistor including a second gate electrode, a second source electrode, a second drain electrode, and a second channel formation region,
wherein the first channel formation region comprises a semiconductor material different from that of the second channel formation region,
wherein the first driver circuit comprises a K-bit latch portion and a writing circuit including a K-bit multiplexer in every column of the memory cells, and
wherein the writing circuit is connected to the potential generating circuit and the K-bit latch portion.

5. The semiconductor device according to claim 4, wherein the source line is connected to the first source electrode,
wherein the bit line is connected to the first drain electrode and the second drain electrode,
wherein the gate line is connected to the second gate electrode, and
wherein the first gate electrode is connected to the second source electrode.

6. The semiconductor device according to claim 4, wherein the first transistor is a p-channel transistor and the second transistor is an n-channel transistor.

7. The semiconductor device according to claim 4, wherein the second channel formation region of the second transistor comprises an oxide semiconductor.

8. The semiconductor device according to claim 4, wherein a plurality of memory cells including the one of the memory cells is connected in parallel between the bit line and the source line.

9. The semiconductor device according to claim 4, wherein a plurality of memory cells including the one of the memory cells is connected in series between the bit line and the source line.

10. The semiconductor device according to claim 4, wherein the potential generating circuit is connected to the first driver circuit and the second driver circuit.

11. A semiconductor device comprising:
a memory cell array comprising m×n memory cells;
a first driver circuit;
a second driver circuit;
a K-bit counter (K is a natural number);
a potential generating circuit;
a bit line;
a source line; and
a gate line,
wherein one of the memory cells comprises:
 a first transistor including a first gate electrode, a first source electrode, a first drain electrode, and a first channel formation region; and
 a second transistor including a second gate electrode, a second source electrode, a second drain electrode, and a second channel formation region,
wherein the first channel formation region comprises a semiconductor material different from that of the second channel formation region,
wherein the first driver circuit comprises a K-bit latch portion and a reading circuit in every column of the memory cells,
wherein the K-bit counter is connected to the reading circuit, and
wherein the reading circuit is connected to the K-bit latch portion.

12. The semiconductor device according to claim 11, wherein the source line is connected to the first source electrode,
wherein the bit line is connected to the first drain electrode and the second drain electrode,
wherein the gate line is connected to the second gate electrode, and
wherein the first gate electrode is connected to the second source electrode.

13. The semiconductor device according to claim 11, wherein the first transistor is a p-channel transistor and the second transistor is an n-channel transistor.

14. The semiconductor device according to claim 11, wherein the second channel formation region of the second transistor comprises an oxide semiconductor.

15. The semiconductor device according to claim 11, wherein a plurality of memory cells including the one of the memory cells is connected in parallel between the bit line and the source line.

16. The semiconductor device according to claim 11, wherein a plurality of memory cells including the one of the memory cells is connected in series between the bit line and the source line.

17. The semiconductor device according to claim 11, wherein the reading circuit comprises a load, a sense amplifier, and a NAND circuit,
wherein the sense amplifier is connected to one of inputs of the NAND circuit,
wherein a memory reading line is connected to the other of the inputs of the NAND circuit, and
wherein the K-bit latch portion is connected to an output of the NAND circuit.

18. The semiconductor device according to claim 11, wherein the potential generating circuit is connected to the first driver circuit and the second driver circuit.

19. The semiconductor device according to claim 11, wherein the K-bit counter is electrically connected to an input of the K-bit latch portion.

20. A semiconductor device comprising:
a memory cell array comprising m×n memory cells;
a first driver circuit;

a second driver circuit;
a K-bit counter (K is a natural number);
a potential generating circuit;
a bit line;
a source line; and
a gate line,
wherein one of the memory cells comprises:
- a first transistor including a first gate electrode, a first source electrode, a first drain electrode, and a first channel formation region; and
- a second transistor including a second gate electrode, a second source electrode, a second drain electrode, and a second channel formation region, wherein the first channel formation region comprises a semiconductor material different from that of the second channel formation region, wherein the first driver circuit comprises a K-bit latch portion, a writing circuit including a K-bit multiplexer, and a reading circuit in every column of the memory cells, wherein the K-bit counter is connected to the reading circuit, and wherein the K-bit latch portion is connected to the writing circuit and the reading circuit.

21. The semiconductor device according to claim 20,
wherein the source line is connected to the first source electrode,
wherein the bit line is connected to the first drain electrode and the second drain electrode,
wherein the gate line is connected to the second gate electrode, and
wherein the first gate electrode is connected to the second source electrode.

22. The semiconductor device according to claim 20,
wherein the first transistor is a p-channel transistor and the second transistor is an n-channel transistor.

23. The semiconductor device according to claim 20,
wherein the second channel formation region of the second transistor comprises an oxide semiconductor.

24. The semiconductor device according to claim 20,
wherein a plurality of memory cells including the one of the memory cells is connected in parallel between the bit line and the source line.

25. The semiconductor device according to claim 20,
wherein a plurality of memory cells including the one of the memory cells is connected in series between the bit line and the source line.

26. The semiconductor device according to claim 20,
wherein the reading circuit comprises a load, a sense amplifier, and a NAND circuit,
wherein the sense amplifier is connected to one of inputs of the NAND circuit,
wherein a memory reading line is connected to the other of the inputs of the NAND circuit, and
wherein the K-bit latch portion is connected to an output of the NAND circuit.

27. The semiconductor device according to claim 20,
wherein the potential generating circuit is connected to the first driver circuit and the second driver circuit.

28. The semiconductor device according to claim 20,
wherein the K-bit counter is electrically connected to an input of the K-bit latch portion.

* * * * *